(12) United States Patent
Nakamura et al.

(10) Patent No.: US 6,951,774 B2
(45) Date of Patent: Oct. 4, 2005

(54) SEMICONDUCTOR DEVICE AND METHOD OF MANUFACTURING THE SAME

(75) Inventors: Shigeru Nakamura, Ayase (JP); Masakatsu Gotou, Atsugi (JP)

(73) Assignees: Renesas Technology Corp., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 10/086,717

(22) Filed: Mar. 4, 2002

(65) Prior Publication Data

US 2002/0151103 A1 Oct. 17, 2002

(30) Foreign Application Priority Data

Apr. 6, 2001 (JP) ........................................ 2001-108603
Jan. 22, 2002 (JP) ........................................ 2002-012775

(51) Int. Cl.[7] .................... H01L 21/44; H01L 21/48; H01L 21/50
(52) U.S. Cl. ........................ 438/109; 438/126
(58) Field of Search .................. 438/107–110, 112, 438/118, 119, 125–127; 425/120, 573, 129.1

(56) References Cited

U.S. PATENT DOCUMENTS

| | | | | |
|---|---|---|---|---|
| 5,422,435 A | * | 6/1995 | Takiar et al. | 174/52.4 |
| 5,696,031 A | * | 12/1997 | Wark | 438/109 |
| 5,753,538 A | * | 5/1998 | Kuno et al. | 438/127 |
| 5,817,545 A | * | 10/1998 | Wang et al. | 438/127 |
| 5,920,768 A | * | 7/1999 | Shintai | 438/112 |
| 6,168,970 B1 | * | 1/2001 | Burns | 438/106 |
| 6,269,999 B1 | * | 8/2001 | Okazaki et al. | 228/110.1 |
| 6,309,916 B1 | * | 10/2001 | Crowley et al. | 438/127 |
| 6,413,801 B1 | * | 7/2002 | Lin | 438/127 |
| 6,632,704 B2 | * | 10/2003 | Kumamoto et al. | 438/106 |
| 2002/0045290 A1 | * | 4/2002 | Ball | |

FOREIGN PATENT DOCUMENTS

| | | | |
|---|---|---|---|
| JP | 63-104343 | * | 5/1988 |
| JP | 63-179537 | * | 7/1988 |
| JP | 03-106622 | * | 7/1991 |
| JP | 405013665 | * | 1/1993 |
| JP | 11-219984 | | 8/1999 |
| JP | 2000188369 | * | 4/2000 |
| JP | 2000-188369 | | 7/2000 |
| JP | 2000-299431 | | 10/2000 |
| TW | 337036 | | 7/1998 |

OTHER PUBLICATIONS

Lau, Flip Chip Technologies, 1996, McGraw–Hill, p. 302–303.*

* cited by examiner

*Primary Examiner*—David A. Zarneke
(74) *Attorney, Agent, or Firm*—Mattingly, Stanger, Malur & Brundidge, P.C.

(57) ABSTRACT

A semiconductor device having a stack structure comprises: a single-piece substrate having a chip support surface serving as a main surface, a back surface, a plurality of connection terminals provided on the chip support surface and a plurality of solder balls provided on the back surface; a first semiconductor chip having a main surface, aback surface, a plurality of semiconductor devices on the main surface of the first semiconductor chip and a plurality of pads provided on the main surface of the first semiconductor chip; a second semiconductor chip having a main surface, a back surface, a plurality of semiconductor devices provided on the main surface of the second semiconductor chip and a plurality of pads provided on the main surface of the second semiconductor chip; and a resin sealing body formed on the chip support surface of the single-piece substrate and used for sealing the first semiconductor chip and the second semiconductor chip; and a plurality of wires for connecting the pads of the second semiconductor chip to the respective connection terminals provided on the single-piece substrate.

In the stack structure, the second semiconductor chip is made thinner than the first semiconductor chip. As a result, the structure package of the semiconductor device can be made thin.

3 Claims, 39 Drawing Sheets

FIRST CHIP MOUNT PROCESS

FIRST CHIP THERMAL CRIMP PROCESS

FIG. 12

| PROCESS FLOW | PROCESS NO. | PROCESS NAME |
|---|---|---|
| | 1 | FIRST CHIP |
| | 2 | BACK GRIND |
| | 3 | DICING, FITTINGS PACKING |
| | 4 | BUMP Au WIRE |
| | 5 | BUMP BONDING |
| | 6 | EXTERNAL INSPECTION |
| | 7 | BUMP BONDING |
| | 8 | SUBSTRATE BAKE |
| | 9 | CHIP MOUNT RESIN FILM |
| | 10 | CHIP MOUNT RESIN FILM STICKING |
| | 11 | CHIP MOUNT, CRIMP |
| | 12 | SECOND CHIP |
| | 13 | BACK GRIND |
| | 14 | CHIP MOUNT RESIN FILM |
| | 15 | CHIP MOUNT RESIN FILM STICKING |
| | 16 | DICING |
| | 17 | DIE BOND |
| | 18 | Au WIRE |
| | 19 | WIRE BOND |
| | 20 | EXTERNAL INSPECTION |
| | 21 | SEAL RESIN |
| | 22 | MOLD |
| | 23 | SOLDER BALL |
| | 24 | BALL MOUNTING |
| | 25 | CLEANING |
| | 26 | EXTERNAL INSPECTION |
| | 27 | SUBSTRATE DICING |
| | 28 | MARK |
| | 29 | ELECTRICAL TEST |
| | 30 | EXTERNAL INSPECTION |
| | 31 | PACKING |

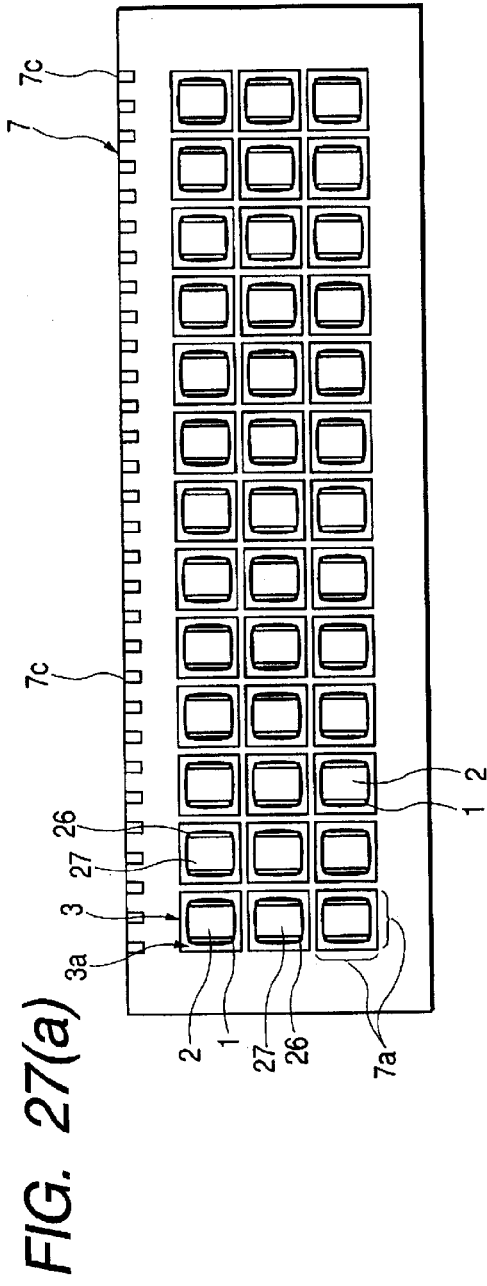
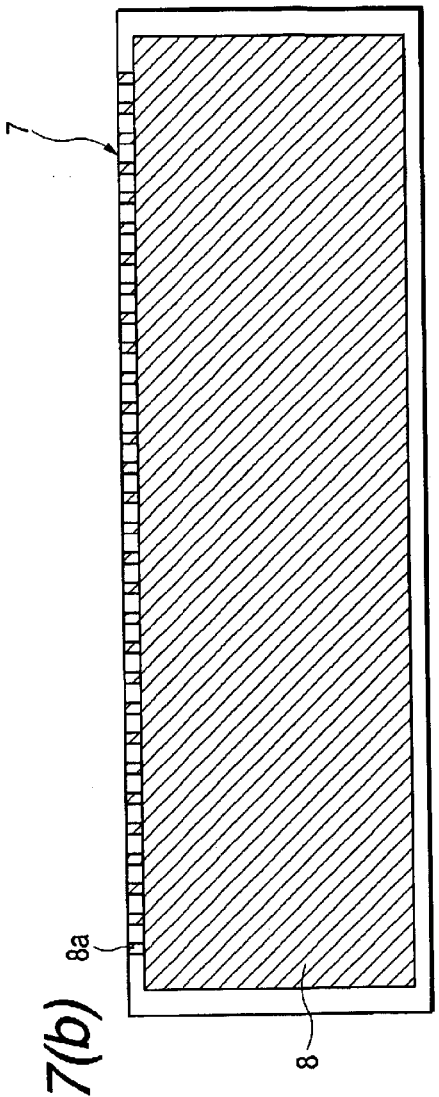
FIG. 27(a)
FIG. 27(b)

SEMICONDUCTOR DEVICE AND METHOD OF MANUFACTURING THE SAME

BACKGROUND OF THE INVENTION

The present invention relates to a semiconductor manufacturing technology and, more particularly, an effective technology applied to miniaturization of semiconductor devices.

In a semiconductor device accommodating semiconductor chips each including a semiconductor device, a stack structure is known as a typical structure for accommodating the semiconductor chips in one package.

In a semiconductor device having a stack structure, semiconductor chips are stacked into a 2-layer structure formed in a resin mold to create a package.

A semiconductor device and a method for fabricating the package are described in documents such as Japanese Unexamined Patent Publication No. 2000-188369, Japanese Unexamined Patent Publication No. 2000-299431 and Japanese Unexamined Patent Publication No. Hei11(1999)-219984. As disclosed in Japanese Unexamined Patent Publication No. 2000-188369, in a structure wherein another chip is mounted by stacking the chip on a chip mounted in a phase-up-mounting process and connected in a wire-bonding process, it is necessary to stack the upper chip on the lower chip in such a way that electrodes provided on the lower chip are not covered by the upper chip. Thus, there are many constraints imposed on the chip size.

As opposed to Japanese Unexamined Patent Publication No. 2000-299369, in Japanese Unexamined Patent Publication No. 2000-299431 and Japanese Unexamined Patent Publication No. Hei 11(1999)-219984, there is disclosed a structure wherein a lower-layer semiconductor chip is connected as a flip chip in a phase-down mounting process whereas an upper-layer semiconductor chip is mounted in a phase-up-mounting process and connected in a wire-bonding process, so that there are no constraints imposed on the chip size as described above and the structure has a high degree of freedom.

That is, Japanese Unexamined Patent Publication No. 2000-299431 discloses a technology for improving a wire-bonding characteristic of an upper-layer chip in a semiconductor device having a structure in which a portion of the upper-layer chip is protruding.

In addition, Japanese Unexamined Patent Publication No. Hei11(1999)-219984 discloses a semiconductor-device package having a chip stacked-layer structure and allowing an SMT (Surface Mount Technology) to be used for mounting a semiconductor chip on a thick-film wiring substrate as well as discloses a method for fabricating the semiconductor-device package.

SUMMARY OF THE INVENTION

In implementation of a semiconductor device having a stack structure in a portable apparatus such as a cellular phone, however, the semiconductor device is required to have a small size and a thin shape. In further pursuit of a thinner shape of the semiconductor device, on the other hand, there is raised a new problem of deteriorating chip strength.

In addition, in order to improve productivity, it is desirable to adopt a transfer mold technique as a means for carrying out a resin-sealing process on a semiconductor chip mounted on a wiring substrate. In the adoption of the transfer mold technique for the chip stacked-layer structure, however, there is raised another new problem of void generation.

It is thus an object of the present invention to provide a semiconductor device having a thin stack structure and to provide a method for fabricating the semiconductor device.

In addition, it is another object of the present invention to provide a semiconductor device having a reduced number of constraints imposed on the chip size and to provide a method for fabricating the semiconductor device.

Moreover, it is a further object of the present invention to provide a semiconductor device capable of preventing voids from being generated and a semiconductor chip from being cracked in a resin-sealing process and to provide a method for fabricating the semiconductor device.

The present invention's above and other objects, above and other problems as well as new characteristics will become apparent from a study of descriptions in this specification with reference to accompanying diagrams.

An outline of a representative of the present invention disclosed in this specification is explained briefly as follows.

The present invention is a semiconductor device comprising a first semiconductor chip provided on a wiring substrate and a second semiconductor chip stacked on the first semiconductor chip wherein the second semiconductor chip is thinner than the first semiconductor chip. The first semiconductor chip is provided on the wiring substrate in such a way that the main surface of the first semiconductor chip interfaces with the main surface of the wiring substrate to make main-surface electrodes provided on the first semiconductor chip interface with their respective electrodes provided on the wiring substrate. The second semiconductor chip is provided above the main surface of the wiring substrate, sandwiching the first semiconductor chip in conjunction with the wiring substrate.

Outlines of other inventions disclosed in this specification are explained briefly as methods as follows.

1. In accordance with an aspect of the present invention, there is provided a semiconductor device manufacturing method comprising the steps of:

preparing a mold provided with a cavity having first and second side surfaces facing each other and third and fourth surfaces facing each other and coming in contact with the first and second side surfaces and provided with a resin injection entrance created on the first side surface;

preparing a wiring substrate having a main surface, preparing a first semiconductor chip fixed on the main surface of the wiring substrate and preparing a second semiconductor chip fixed on the first semiconductor chip;

placing the wiring substrate, the first semiconductor chip and the second semiconductor chip inside the cavity; and injecting resin through the resin injection entrance after placing the first and second semiconductor chips in order to seal and hold the first and second semiconductor chips, wherein in the step of placing the first and second semiconductor chips, the wiring substrate, the first semiconductor chip and the second semiconductor chip are arranged in such a way that, on a cross section parallel to the third side surface of the cavity, the length of the first semiconductor chip exceeds the length of the second semiconductor chip.

2. In accordance with another aspect of the present invention, there is provided a semiconductor device manufacturing method comprising the steps of:

preparing a mold provided with a cavity having first and second side surfaces facing each other and third and fourth surfaces facing each other and coming in contact with the first and second side surfaces and provided with a plurality of resin injection entrances created on the first side surface;

preparing a wiring substrate having a main surface and a plurality of device areas created thereon, preparing a first semiconductor chip fixed on each of the device areas of the wiring substrate and preparing a second semiconductor chip fixed on each of the first semiconductor chips;

placing the wiring substrate, the first semiconductor chips and the second semiconductor chips inside the cavity;

collectively covering the device areas by using the cavity; and injecting resin through the resin injection entrances associated with the device areas in order to collectively seal and hold the first and second semiconductor chips, wherein in the step of collectively covering the device areas by using the cavity, the wiring substrate, the first semiconductor chip and the second semiconductor chip are arranged in such a way that, on a cross section parallel to the third side surface of the cavity, the length of each of the first semiconductor chips exceeds the length of the second semiconductor chip stacked on the first semiconductor chip.

BRIEF DESCRIPTION OF THE DRAWINGS

FIGS. 5A and 5B are diagrams showing a typical assembly process of the CSP shown in FIG. 1; in which FIG. 5A is a diagram showing a process of mounting a first semiconductor chip; and FIG. 5B is a diagram showing a thermal crimp process of the first semiconductor chip;

FIGS. 6A and 6B are diagrams showing a partial cross section of a typical state of an assembly process of the CSP shown in FIG. 1; in which FIG. 6A is a diagram showing a process of mounting a second semiconductor chip; and FIG. 6B is a diagram showing a wire-bonding process of the second semiconductor chip;

FIGS. 9A and 9B are diagrams each showing a typical process to assemble the CSP shown in FIG. 7; in which FIG. 9A is a diagram showing a process to mount a first semiconductor chip; and FIG. 9B is a diagram showing a process to thermally crimp the first semiconductor chip;

FIGS. 10A and 10B are diagrams each showing a partial cross section of a typical process to assemble the CSP shown in FIG. 7; in which FIG. 10A is a diagram showing a process to mount a second semiconductor chip; and FIG. 10B is a diagram showing a wire-bonding process of the second semiconductor chip;

FIG. 12 is a fabrication process flow diagram showing detailed processes of a procedure to assemble a semiconductor device implemented by the second embodiment of the present invention;

FIGS. 14A and 14B are enlarged diagrams each showing a portion of the multi-piece substrate shown in FIG. 13; in which FIG. 14A is a diagram showing a top view of details of portion A on the multi-piece substrate shown in FIG. 13; and FIG. 14B is a diagram showing a bottom view of a back surface of portion A shown in FIG. 14A;

FIGS. 15A and 15B are diagrams showing top views of first and second semiconductor chips used in a process to assemble the semiconductor device implemented by the second embodiment of the present invention; in which FIG. 15A is a diagram showing the first semiconductor chip; and FIG. 15B is a diagram showing the second semiconductor chip;

FIGS. 16A and 16B are diagrams showing a typical structure of the first semiconductor chip shown in FIG. 15; in which FIG. 16A is a diagram showing an enlarged side view of a portion of the structure; and FIG. 16B is a diagram showing an enlarged top view of the portion of the structure;

FIGS. 18A and 18B are diagrams showing details of the process to stick the first NCF as shown in FIG. 17; in which FIG. 18A is a diagram showing a state prior to placement of the NCF; and FIG. 18B is a diagram showing a state after the placement of the NCF;

FIGS. 19A and 19B are diagrams showing a first semiconductor chip placed on the first NCF stuck as shown in FIG. 17; in which FIG. 19A is a diagram showing the placed first semiconductor chip; and FIG. 19B is a diagram showing the first semiconductor chip pressed by a collet;

FIGS. 20A and 20B are diagrams showing a typical die-bond method adopted for the first semiconductor chip; in which FIG. 20A is a diagram showing a mounted first semiconductor chip; and FIG. 20B is a diagram showing the thermally crimped first semiconductor chip;

FIGS. 23A and 23B are diagrams is diagrams showing a structure of completely mounted first and third semiconductor chips for the stuck second NCF shown in FIG. 22; in which FIG. 23A is a diagram showing a top view of the structure; and FIG. 23B is a diagram showing an enlarged top view of details of portion B shown in FIG. 23A;

FIGS. 25A and 25B are diagrams showing a structure of second and fourth semiconductor chips after a wire-bonding process; in which FIG. 25A is a diagram a top view of the structure; and FIG. 25B is a diagram showing an enlarged partial top view showing details of portion C shown in FIG. 25A;

FIGS. 26A and 26B are diagrams showing typical wire-bonding states of a second semiconductor chip; in which FIG. 26A is a diagram showing a state prior to a wire-bonding process; and FIG. 26B is a diagram showing a state after the wire-bonding process.

FIGS. 27A and 27B are diagrams showing a typical structure of a multi-piece substrate subjected to a collective-mold process; in which FIG. 27A is a diagram showing a state prior to the collective-mold process; and FIG. 27B is a diagram showing a state after the collective-mold process;

FIGS. 29A and 29B are diagrams showing an example of the collective-mold method shown in FIG. 28; in which FIG. 29A is a diagram showing a partial cross section in a collective-mold process along a D—D line shown in FIG. 28; and FIG. 29B is a diagram showing a partial cross section in the collective-mold process along an E—E line shown in FIG. 28;

FIGS. 31A and 31B are diagrams showing an example of the other collective-mold method shown in FIG. 30; in which FIG. 31A is a diagram showing a partial cross section in a collective-mold process along an F—F line shown in FIG. 30; and FIG. 31B is a diagram showing a partial cross section in the collective-mold process along an G—G line shown in FIG. 30;

DETAILED DESCRIPTION OF THE PREFERRED EMBODIMENTS

Figure 1:
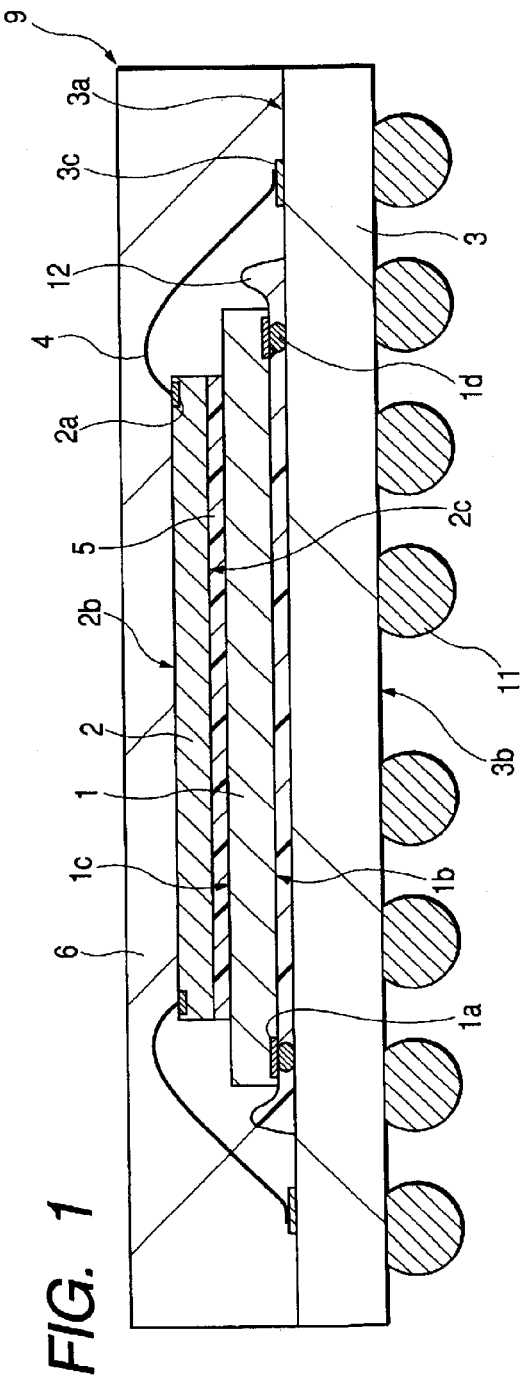
FIG. 1 is a diagram showing a typical structure of the present invention's first embodiment implementing a semiconductor device, that is, a CSP having a stack structure.

In the description of preferred embodiments, as a rule, explanation of a specific portion is given only once and not repeated for portions identical with or similar to the specific portion unless otherwise required specially.

In addition, in the following description of the embodiments, each embodiment is divided into a plurality of sections or sub-embodiments when necessary. Unless otherwise specified in particular, the sections are related to each other. Instead, a section is a modified version of another section or a modified version of all other versions. A section can also be a detail explanation of another section or an explanation supplementary to another section.

Moreover, in the following description of the embodiments, a specified number of elements, a count, a mount, a range or another quantity does not specifically imply a particular number unless the quantity is specified explicitly in particular or the quantity is a number, which is obvious in accordance with a principle. That is, the quantity can be greater or smaller than a specific number.

The preferred embodiments are explained below in detail by referring to accompanying diagrams. In all the diagrams referred to in the explanation of the embodiments, members having functions identical with each other are denoted by the same reference numeral and their explanation is given only once and not repeated for each of the members.

First Embodiment

Figure 2:
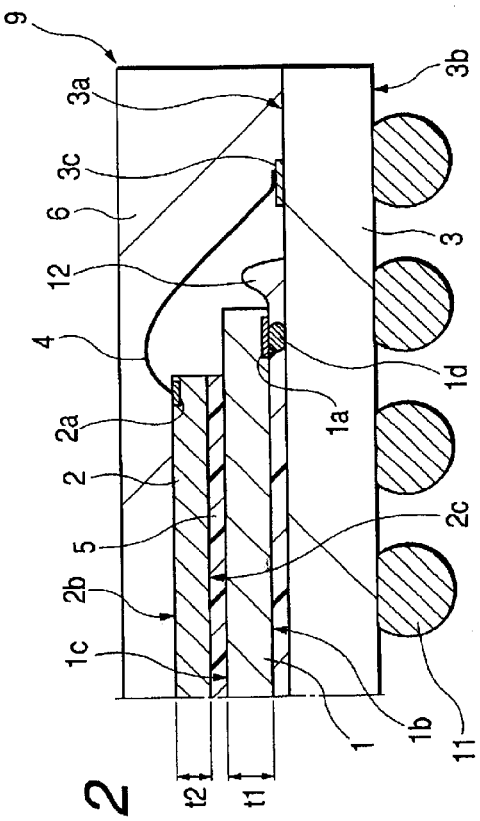
FIG. 2 is a diagram showing a partial cross section of the structure of the CSP shown in FIG. 1.
Figure 3:
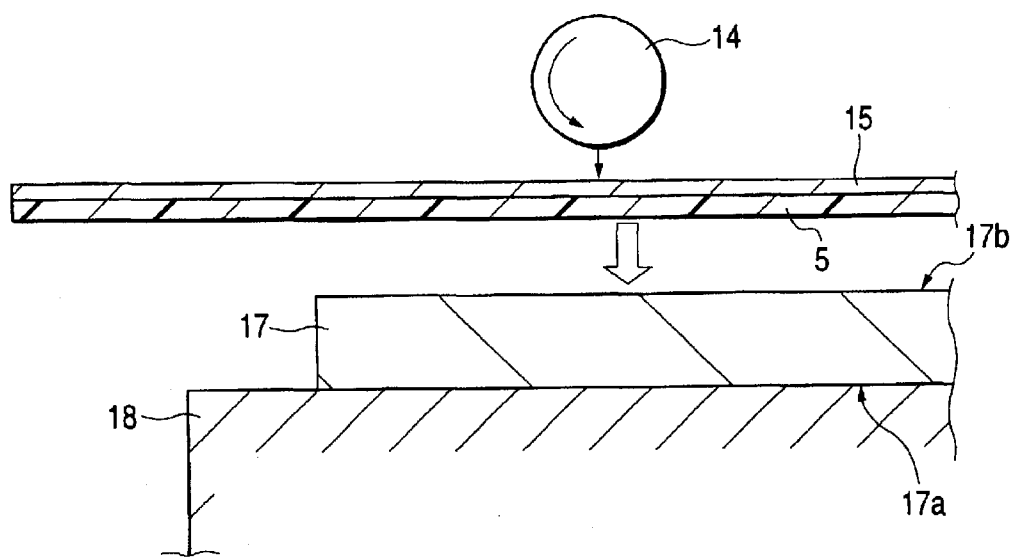
FIG. 3 is a diagram showing a partial cross section of a typical state of a process to stick a die-bond film to a wafer in an assembly process of the CSP shown in FIG. 1.
Figure 4:
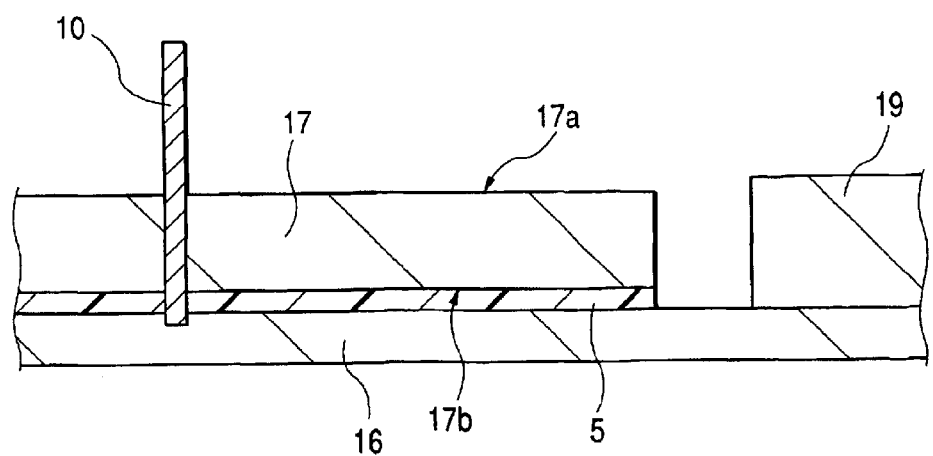
FIG. 4 is a diagram showing a partial cross section of a typical state of wafer dicing in an assembly process of the CSP shown in FIG. 1.
Figure 5A:
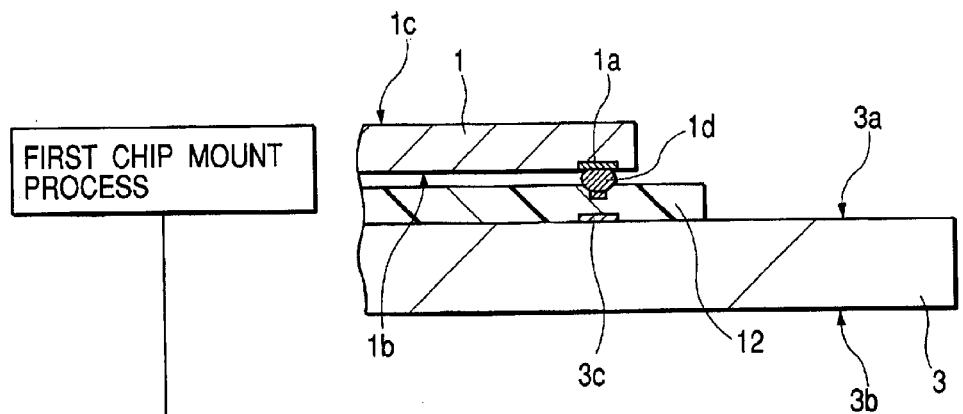
Figure 5B:
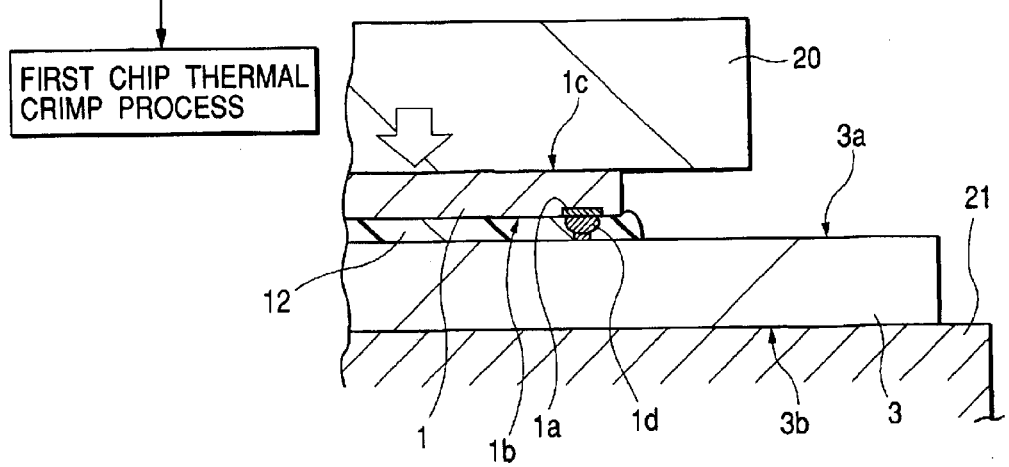
Figure 6A:
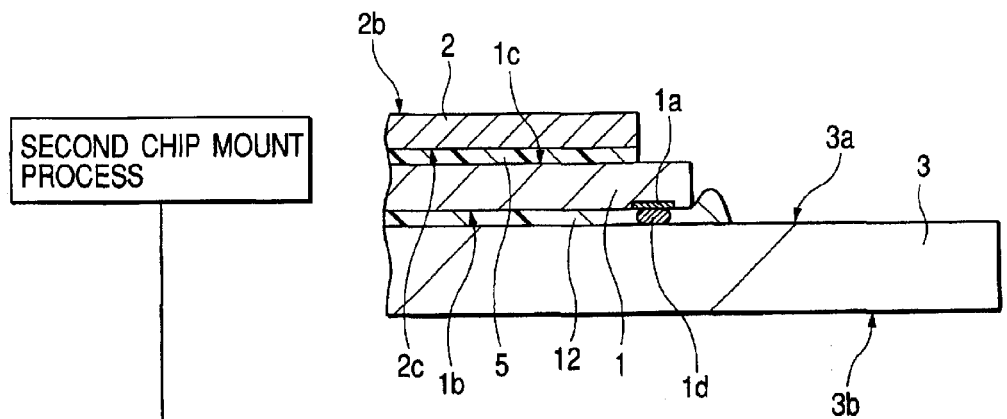
Figure 6B:
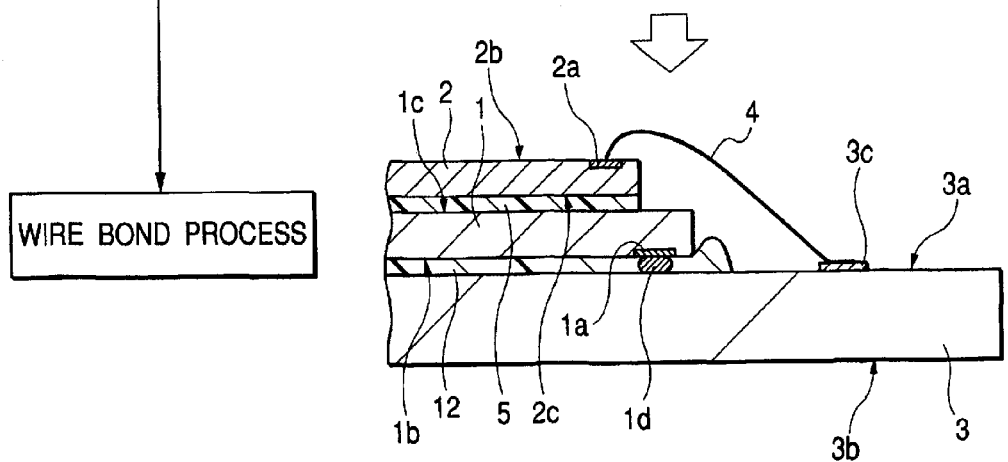

FIG. 1 is a diagram showing a typical structure of the present invention's first embodiment implementing a semiconductor device, that is, a CSP having a stack structure. FIG. 2 is a diagram showing a partial cross section of the structure of the CSP shown in FIG. 1. FIG. 3 is a diagram showing a partial cross section of a typical state of a process to stick a die-bond film to a wafer in an assembly process of the CSP shown in FIG. 1. FIG. 4 is a diagram showing a partial cross section of a typical state of wafer dicing in an assembly process of the CSP shown in FIG. 1. FIG. 5 is a diagram showing a typical assembly process of the CSP shown in FIG. 1. FIG. 5A is a diagram showing a process of mounting a first semiconductor chip. FIG. 5B is a diagram showing the thermal crimp process of the first semiconductor chip. FIG. 6 is a diagram showing a partial cross section of a typical state of an assembly process of the CSP shown in FIG. 1. FIG. 6A is a diagram showing a process of mounting a second semiconductor chip. FIG. 6B is a diagram showing a wire-bonding process of the second semiconductor chip.

The semiconductor device implemented by the first embodiment shown in FIGS. 1 and 2 has a stack structure comprising 2 semiconductor chips stacked on a single-piece substrate (wiring substrate) 3. The first semiconductor chip 1 and the second semiconductor chip 2 stacked on the first semiconductor chip 1 are sealed and held by resin on a chip support surface (main surface) 3a of the single-piece substrate 3 by using a resin mold.

In addition, the semiconductor device has a size about the same as or slightly larger than the chip size. That is, the semiconductor device is a CSP 9 having a stack structure.

Furthermore, on a surface on the opposite side to the chip support surface 3a of the single-piece substrate 3, a plurality of solder balls 11 are provided to form a matrix layout. Each of the solder balls 11 is a protruding electrode serving as an external pin. The surface on the opposite side is referred to hereafter as a back surface 3b.

Figure 13:
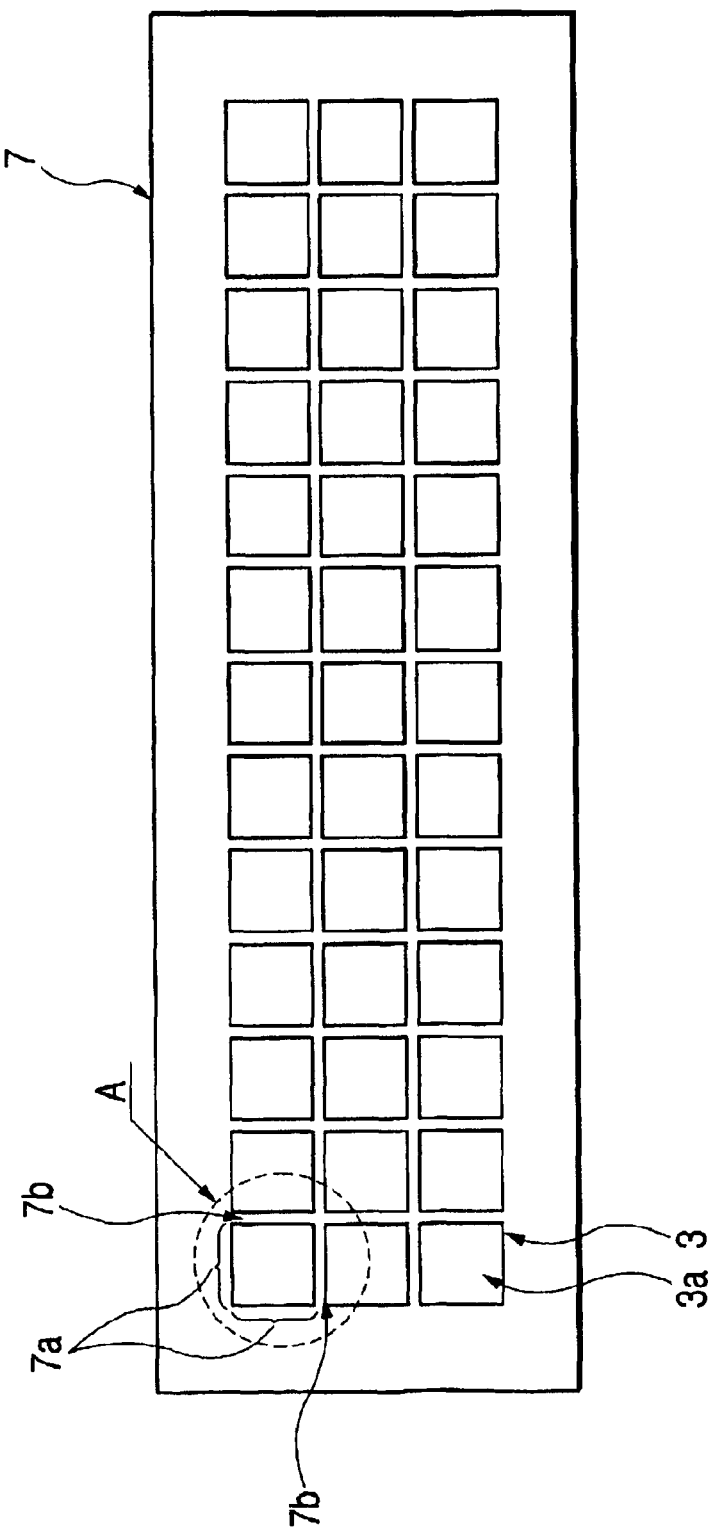
FIG. 13 is a diagram showing a top view of a typical structure of a multi-piece substrate in a procedure to assemble a semiconductor device implemented by the second embodiment of the present invention.

The CSP 9 implemented by the first embodiment can have a multi-piece substrate 7. The multi-piece substrate 7 is a wiring substrate on which a plurality of device areas 7a are formed. The multi-piece substrate 7 is a matrix comprising typically 3×13 device areas 7a separated from each other by dicing lines 7b as shown in FIG. 13. The device areas 7a are collectively molded by resin by using the multi-piece substrate 7 in a process referred to hereafter as a collective mold process. A mold portion 8 created in the collective mold process as shown in FIG. 27B is subjected to a dicing process after the mold process to produce semiconductor chips.

The detailed structure of the CSP 9 is explained as follows. The CSP 9 comprises:

a single-piece substrate 3 having a chip support surface 3a serving as a main surface, a back surface 3b, a plurality of connection terminals (electrodes) 3c provided on the chip support surface 3a and a plurality of solder balls 11 provided on the back surface 3b;

a first semiconductor chip 1 having a main surface 1b, a back surface 1c, a plurality of semiconductor devices created on the main surface 1b and a plurality of pads (electrodes) 1a created on the main surface 1b;

a second semiconductor chip 2 having a main surface 2b, a back surface 2c, a plurality of semiconductor devices created on the main surface 2b and a plurality of pads (electrodes) 2a created on the main surface 2b; and a resin sealing body 6 formed on the chip support surface 3a of the single-piece substrate 3 and used for sealing the first semiconductor chip 1 and the second semiconductor chip 2; and a plurality of wires 4 for connecting the pads 2a provided on the second semiconductor chip 2 to the respective connection terminals 3c provided on the single-piece substrate 3.

In addition, the first semiconductor chip 1 is provided on the single-piece substrate 3 in such a way that the main surface 1b of the first semiconductor chip 1 interfaces with the chip support surface 3a of the single-piece substrate 3 to make the pads 1a provided on the first semiconductor chip 1 interface with their respective connection terminals 3c provided on the single-piece substrate 3.

At that time, the first semiconductor chip 1 is fixed on the single-piece substrate 3 by using an adhesive such as a thin-film NCF (Non-Conductive Film) 12 provided between the main surface 1b of the first semiconductor chip 1 and the chip support surface 3a of the single-piece substrate 3.

However, an ACF (Anisotropic Conductive Film) other than the NCF 12 can also be used as a typical adhesive. In addition, another kind of adhesive can also be used as well.

The NCF 12 or the ACF is an adhesive used for connecting a chip as flip chip. The NCF 12 or the ACF is a tape film made of resin, which has the thermal-hardening property and has epoxy resin as a main component.

In addition, the pads 1a provided on the first semiconductor chip 1 are joined to the respective connection terminals 3c provided on the single-piece substrate 3 in a pressure welding process. At that time, metallic bumps 1d each serving as a protruding electrode provided on each of the pads 1a provided on the first semiconductor chip 1 are joined to the respective connection terminals 3c provided on the single-piece substrate 3 in a pressure welding process.

The metallic bumps 1d are each a protruding electrode provided on an electrode of a semiconductor chip by adoption of a wire-bonding technology using a metallic wire. In a process to assemble the CSP 9, the metallic bumps 1d are each provided on a pad 1a provided on the first semiconductor chip 1.

On the other hand, the second semiconductor chip 2 is provided above the chip support surface 3a of the single-piece substrate 3, sandwiching the first semiconductor chip 1 in conjunction with the single-piece substrate 3. The first semiconductor chip 1 and the second semiconductor chip 2, which are provided above the chip support surface 3a of the single-piece substrate 3, are separated from each other by the die-bond film material 5 serving as an adhesive with the back surfaces 1c and 2c provided on the first semiconductor chip 1 and the second semiconductor chip 2 respectively facing the chip support surface 3a of the single-piece substrate 3.

That is, in the stack structure of the CSP 9, the first semiconductor chip 1 on the lower-layer side is connected as a flip chip to the single-piece substrate 3 in a phase-down mounting process. On the other hand, the second semiconductor chip 2 on the upper-layer side is wire-bonding connected to the back surface 1c provided on the first semiconductor chip 1 in a phase-up mounting process. In this case, the thickness t2 of the second semiconductor chip 2 on the upper-layer side is made smaller than the thickness t1 of the first semiconductor chip 1 on the lower-layer side or t1≧t2 as shown in FIG. 2.

As an example, t1=240 micrometers and t2=180 micrometers. However, t1 and t2 are not limited to these typical numbers.

The following description explains a characteristic of the CSP 9 implemented by the first embodiment. The CSP 9 is characterized in that the thickness of the second semiconductor chip 2 is made smaller than the thickness of the first semiconductor chip 1.

A semiconductor device used in a portable apparatus such as a cellular phone is required to have a small actual thickness. It is thus necessary to use a semiconductor chip fabricated to have a thin shape. A semiconductor chip used as a thin semiconductor apparatus in recent years is fabricated to have a thickness not exceeding 200 micrometers in many cases.

In general, the smaller the thickness of a semiconductor chip, the much more easily the semiconductor is cracked due to the weight thereof. Thus, in the CSP 9 implemented by the first embodiment, the first semiconductor chip 1 to which a load is applied is made thick but the second semiconductor chip 2 can be made thinner than the first semiconductor chip 1.

Typically, a load applied to the first semiconductor chip 1 in the thermal crimp process is in the range 10 to 20 kgf and a load applied to the second semiconductor chip 2 in the thermal crimp process is 1 kgf.

The following description explains a reason why a load applied to the first semiconductor chip 1 in the thermal crimp process is greater than a load applied to the second semiconductor chip 2 in the thermal crimp process.

In a process to mount the first semiconductor chip 1, as shown in FIG. 5B, with a metallic bump 1d joined to a connection terminal 3c provided on the wiring substrate (single-piece substrate) 3 by a pressure applied by the thermal crimp head 20 in a pressure welding process, heat is added to harden resin having the thermally-hardening property to secure connection between the metallic bump 1d and the connection terminal 3c. In this case, even if there are variations in height from one metallic bump 1d to another, in order to assure the connection between the metallic bump 1d and the connection terminal 3c with a high degree of reliability, a pressure applied from the thermal crimp head 20 is effective as a means for elastically or plastically deforming the metallic bump 1d, the connection terminal 3c or a portion of the wiring substrate 3 below the connection terminal 3c.

In this way, in order to assure the reliability of the connection between the connection terminal 3c provided on the wiring substrate 3 and a connected portion on the first semiconductor chip 1 through the metallic bump 1d, a large crimping force is required. Thus, the first semiconductor chip 1 is required to have strength for withstanding such a crimping force or to have a sufficient chip thickness.

On the other hand, a pressure applied to place the second semiconductor chip 2 connected to the respective connection terminals 3c by wires 4 on the first semiconductor chip 1 in a phase-up mounting process, is made small. Thus, even if the second semiconductor chip 2 is made thin, a defect of a chip crack can be avoided.

Thus, a desired mount height can be implemented by preparing the CSP 9 thin without causing mounting loads to crack both the first semiconductor chip 1 and the second semiconductor chip 2 and without lowering reliability of connection to the connection terminals 3c.

In addition, by connecting the first semiconductor chip 1 as a flip chip on the lower-layer side in a phase-down mounting process, the planar-surface size of the second semiconductor chip 2 stacked on the back surface 1c of the first semiconductor chip 1 can be made smaller or greater than the first semiconductor chip 1. As a result, the number of constraints imposed on the chip size can be reduced substantially.

Thus, in the stack structure, the degree of freedom with which chip sizes are combined can be increased so that a small-size multi-chip module can be implemented.

In addition, in the CSP 9, the bus frequency of the first semiconductor chip 1 is higher than higher than the bus frequency of the second semiconductor chip 2. Thus, normally, the first semiconductor chip 1 is used as a logic chip while the second semiconductor chip 2 serves as a memory chip.

This is because, by mounting the first semiconductor chip 1 serving as a logic chip on the lower-layer side in a phase-down process and connecting the first semiconductor chip 1 to the respective connection terminals 3c provided on the single-piece substrate 3 through the metallic bumps 1d, the impedance of an input/output unit can be suppressed.

As a result, while suppressing noises included in an output signal, it is possible to increase the bus frequency and to display the performance of the logic chip to a sufficiently high level required by the system.

In comparison with a logic chip, a memory chip implemented by the second semiconductor chip 2 is capable of displaying sufficiently good performance required by the system even in a range in which variations in current with the lapse of time are limited in order to prevent generation of noises. In addition, by stacking the second semiconductor chip 2 serving as a memory chip on the first semiconductor chip 1 serving as a logic chip, the CSP 9 can be made compact.

As shown in FIG. 15, the first semiconductor chip 1 and the second semiconductor chip 2 are each made of typically silicon. In addition, on the main surface 1b of the first semiconductor chip 1 and the main surface 2b of the second semiconductor chip 2, a semiconductor integrated circuit is created whereas, at the edges of the main surfaces 1b and 2b, a plurality of pads 1a and 2a respectively each serving as a connection electrode are created.

In addition, resin for a mold used in creation of the resin sealing body 6 is typically epoxy resin having the thermally hardening characteristic. Furthermore, the single-piece substrate 3 is typically a glass-including epoxy substrate.

Figure 14A:
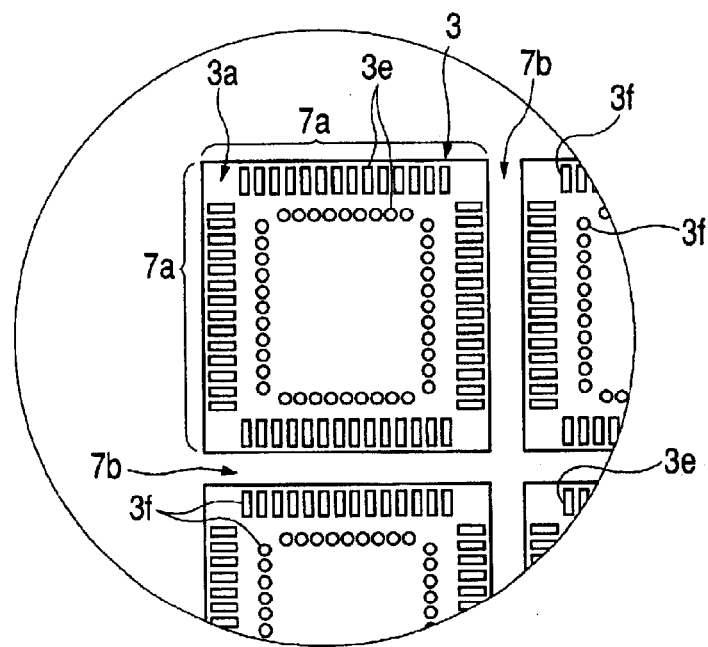
Figure 14B:
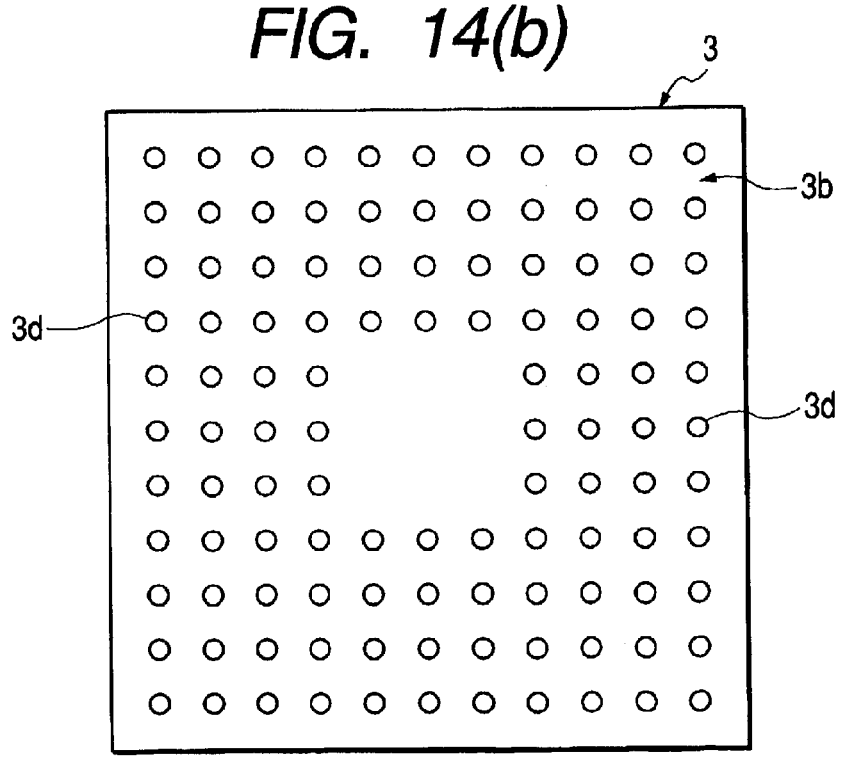

On the chip support surface 3a of the single-piece substrate 3, a plurality of connection terminals 3c for connection to wires 4 and metallic bumps 1d are created. On the back surface 3b, on the other hand, a plurality of bump lands 3d are exposed and laid out as shown in FIG. 14B. On each of the bump lands 3d, a solder ball 11 is mounted.

In addition, the wire 4 connected by adoption of a wire-bonding technique is typically a metallic wire.

Furthermore, a plurality of solder balls 3 are laid out on the back surface 3b of the single-piece substrate 3 to form a matrix. The solder balls 3 are each an external terminal electrically connected to a connection terminal 3c provided on the single-piece substrate 3.

The following description explains an outline of a method for fabricating the CSP 9 implemented by the first embodiment.

Steps for fabricating the CSP 9 explained below are:
forming a semiconductor chip as shown in FIGS. 3 and 4;
mounting the first semiconductor chip 1 as shown in FIG. 5A;
thermally crimping the first semiconductor chip 1 as shown in FIG. 5b;
mounting the second semiconductor chip 2 as shown in FIG. 6A; and
wire-bonding shown in FIG. 6B.

First, the substrate 3 having a plurality of junction terminals 3c provided on the chip support surface 3a thereof is prepared. Then, the first semiconductor chip 1 and the second semiconductor chip 2 are prepared.

To put it in detail, the first semiconductor chip 1 having the main surface 1b and the back surface 1c and including a plurality of semiconductor devices created on the main surface 1b and a plurality of pads 1a created on the main surface 1b is prepared. By the same token, the second semiconductor chip 2 having the main surface 2b and the back surface 2c and including a plurality of semiconductor devices created on the main surface 2b and a plurality of pads 2a created on the main surface 2b is prepared. The second semiconductor chip 2 is thinner than the first semiconductor chip 1.

In this case, the second semiconductor chip 2 to be stacked on the first semiconductor chip 1 is prepared as follows. As shown in FIG. 3, the die-bond film material 5 is stuck to a back surface 17b of a semiconductor wafer 17 in advance and then the wafer 17 is diced into pieces, which are each used as the second semiconductor chip 2.

First, the back surface 17b on the side opposite to a main surface (circuit surface) 17a of the semiconductor wafer 17 used for creation of the second semiconductor chip 2 is ground in a back-grinding process to a desired thickness. Then, the die-bond film material 5 made of typically epoxy resin is stuck to the entire back surface 17b of the semiconductor wafer 17.

To put it in detail, the semiconductor wafer 17 is mounted on a stage 18 heated to 120 degrees Celsius with the main surface 17 thereof facing downward. At 120 degrees Celsius, the die-bond film material 5 does not harden and can thus be stuck fast to the semiconductor wafer 17 with ease.

Then, the die-bond film material 5 is put on the back surface 17b of the semiconductor wafer 17 and a roller 14 is rolled over the die-bond film material 5 on the wafer 17 to stick the die-bond film material 5 to the wafer 17 while pushing out air bubbles.

Subsequently, portions of the die-bond film material 5 jutting out off the semiconductor wafer 17 are cut out and a protection sheet 15 attached to the die-bond film material 5 is peeled out.

After that, the semiconductor wafer 17 with the die-bond film material 5 stuck thereto is stuck to a dicing tape 16, which is an UV tape supported by a fixed ring 19 and used for dicing, as shown in FIG. 4.

Afterwards, a dicing blade 10 is used for dicing the semiconductor wafer 17 in order to cut the semiconductor wafer 17 into pieces, which are each used as the second semiconductor chip 2.

In the dicing process, the cutting operation using the dicing blade 10 is carried out to in such a way that the dicing blade 10 completely cuts the semiconductor wafer 17 to a depth including the die-bond film material 5. This is because, if the die-bond film material 5 is not cut, in a die-bond process following this dicing process, only a semiconductor chip thrusts up, causing the die-bond film material 5 to be peeled from the semiconductor chip when the semiconductor chip is peeled from the dicing tape 16. Thus, by completely cutting the semiconductor wafer 17 to a depth including the die-bond film material 5, the die-bond film material 5 can be prevented from being peeled from the semiconductor chip.

As described above, after the whole the die-bond film material 5 is stuck to the entire back surface 17b of the semiconductor wafer 17, the wafer 17 is diced to produce individual second semiconductor chips 2 so that the workability can be improved and the cost van be reduced in comparison with a process in which die-bond films 5 are stuck on the individual second semiconductor chips 2 later on.

Then, the first semiconductor chip 1 is mounted as shown in FIG. 5A.

A plurality of pads 1a are created on the main surface 1b of the first semiconductor chip 1 and, on each of the pads 1a created on the main surface 1b, a metallic bump 1d serving as a protruding electrode is formed.

First, the first semiconductor chip 1 is mounted on the single-piece substrate 3 in such a way that the main surface 1b of the first semiconductor chip 1 interfaces with the chip support surface 3a of the single-piece substrate 3. To put it in detail, the first semiconductor chip 1 is put on the chip support surface 3a of the single-piece substrate 3 in such a way that the pads 1a created on the first semiconductor chip 1 interface with the same plurality of respective connection terminals 3c provided on the single-piece substrate 3.

Afterwards, a pressure is applied to the back surface 1c of the first semiconductor chip 1 in order to electrically connect the pads 1a created on the first semiconductor chip 1 to the respective connection terminals 3c created on the single-piece substrate 3.

At that time, first, an NCF 12 serving as an adhesive is placed in a mounting area on the chip support surface 3a of the single-piece substrate 3 as shown in FIG. 5a. The mounting area is an area on the chip support surface 3a in which the first semiconductor chip 1 is mounted. The NCF 12 has been cut to a size slightly larger than the first semiconductor chip 1. Then, the first semiconductor chip 1 is placed on the chip support surface 3a of the single-piece substrate 3 in such a way that the pads 1a created on the first semiconductor chip 1 interface with the same plurality of respective connection terminals 3c provided on the single-piece substrate 3 or, to put it in detail, each of the pads 1a is positioned at the location of the corresponding connection terminal 3a. Afterwards, a pressure in the range 1 to 5 Kgf is applied to the back surface 1c of the first semiconductor chip 1 as a very small load.

Thus, the metallic bump 1d thrusts into the NCF 12 to tentatively fix the first semiconductor chip 1 on the single-piece substrate 3.

After that, as shown in FIG. 5B, the thermal crimp head 20 applies a pressure to the back surface 1c of the first semiconductor chip 1. In addition, the thermal crimp head 20 also radiates heat at the same time as the pressure.

Thus, the thermally-hardening resin of the NCF 12 between the main surface 1b of the first semiconductor chip 1 and the chip support surface 3a of the single-piece substrate 3 is thermally hardened by the heat generated by the thermal crimp head 20 and the first semiconductor chip 1 is fixed on the chip support surface 3a of the single-piece substrate 3 by the thermally hardened resin.

The thermal crimp head 20 has a pressure-applying surface with about the same size as the single-piece substrate 3.

In the thermal crimping process, the single-piece substrate 3 is mounted on a die-bond stage 21, which has been heated to a temperature of about 70 degrees Celsius and the thermal crimp head 20 heated to a temperature of about 300 degrees Celsius applies a pressure to the back surface 1c of the first semiconductor chip 1. A load generated by the applied pressure is in the range 50 to 100 gf per bump on the first semiconductor chip 1. In the case of a CSP 9 having 200 bumps, for example, the thermal crimp head 20 applies a load in the range 10 to 20 kgf to the first semiconductor chip 1.

As a result, the NCF 12 reaches a temperature of about 200 degree Celsius and, due to fusion as well as hardening, the metallic bump 1d formed on the pad 1a created on the first semiconductor chip 1 is coming in contact with the connection terminal 3c created on the single-piece substrate 3, forming an electrically conductive path from the metallic bump 1d to the connection terminal 3c.

At that time, since the thermally hardening resin is hardened by the heat generated by the thermal crimp head 20 in a state in which the metallic bump 1d and the connection terminal 3c or an area on the wiring substrate 3 beneath the connection terminal 3c are elastically or plastically deformed, the load applied by the thermal crimp head 20 is capable of sufficiently assuring the reliability of the connection between the metallic bump 1d and the connection terminal 3c even if there are variations in height among the metallic bumps 1d or even if the thermally hardening resin has been thermally expanded by heat generated in an operation of the first semiconductor chip 1 or the second semiconductor chip 2. Details of this reliability assurance are not shown particularly in the figure.

The connection of the first semiconductor chip 1 as a flip chip is not made by using a film adhesive such as the NCF 12 or an ACF as is typically the case with a metal-to-metal connection, which is formed by applying a metallic coat on the surface of the connection terminal 3c created on the single-piece substrate 3. Instead, a pressure as well as a supersonic wave can be applied to the first semiconductor chip 1 to connect the first semiconductor chip 1 to the single-piece substrate 3 through the so-called ultrasonic metal-to-metal connection.

In this case, in order to protect the main surface 1b of the first semiconductor chip 1, to assure the connection reliability and to avoid chip cracks during a mold process, insulating resin is injected into a space between the single-piece substrate 3 and the first semiconductor chip 1 after the chip connection process in order to accomplish an under-fill sealing process.

Next, the second semiconductor chip 2 is mounted as shown in FIG. 6A.

In this mounting process, the second semiconductor chip 2 having a thickness smaller than the first semiconductor chip 1 is mounted on the back surface 1c of the first semiconductor chip 1 at such a position that the back surface 1c of the first semiconductor chip 1 interfaces with the back surface 2c of the second semiconductor chip 2 through the die-bond film material 5, and the second semiconductor chip 2 is placed at the position while a pressure smaller than the pressure applied during the die-bonding process is being applied by a crimping head set at a normal temperature. In the case of a CSP 9 having 200 bumps, the pressure applied to the second semiconductor chip 2 is in the range 10 to 20 kgf.

That is, since the die-bond film material 5 is stuck to the back surface 2c of the second semiconductor chip 2 in advance, on the back surface 1c of the first semiconductor chip 1 connected as a flip chip, the second semiconductor chip 2 is fixed by heat and a small load with the die-bond film material 5 serving as an adhesive. In addition, in this process to fix the second semiconductor chip 2, the die-bond film material 5 is heated to harden the die-bond film material 5 by the die-bond stage 21 and the temperature of the crimping head is set at a value lower than the temperature the die-bond stage 21. Typically, the crimping head is set at a normal temperature.

The load or the pressure applied in this process is typically about 1 kgf and the temperature is set at about 160 degrees Celsius for an CSP 9 including a second semiconductor chip 2 with a main surface 2b having a typical size of about 50 mm².

Then, a plurality of pads 2a provided on the second semiconductor chip 2 are electrically connected to the same plurality of corresponding connection terminals 3c respectively created on the single-piece substrate 3 by the same plurality of metallic wires 4 in a wire-bonding process as shown in FIG. 6B.

Subsequently, the first semiconductor chip 1, the second semiconductor chip 2 and the wires 4 are sealed and held by using resin.

That is, on the chip support surface 3a of the single-piece substrate 3, the resin sealing body 6 is formed in a transfer-mold process to seal and hold the first semiconductor chip 1, the second semiconductor chip 2 and the wires 4.

After that, on the back surface 3b of the single-piece substrate 3, a plurality of solder balls 11 are mounted to be electrically connected to the same plurality of respective connection terminals 3c provided on the single-piece substrate 3. The solder balls 11 are each a protruding electrode to be electrically connected to a connection terminal 3c.

That is, on each bump land 3d exposed to the back surface 3b of the single-piece substrate 3, a solder ball 11 is mounted in typically a reflow process to serve as an external electrode of the CSP 9. The back surface 3c is on a side opposite to the side provided on which the resin sealing body 6 is formed.

Second Embodiment

Figure 7:
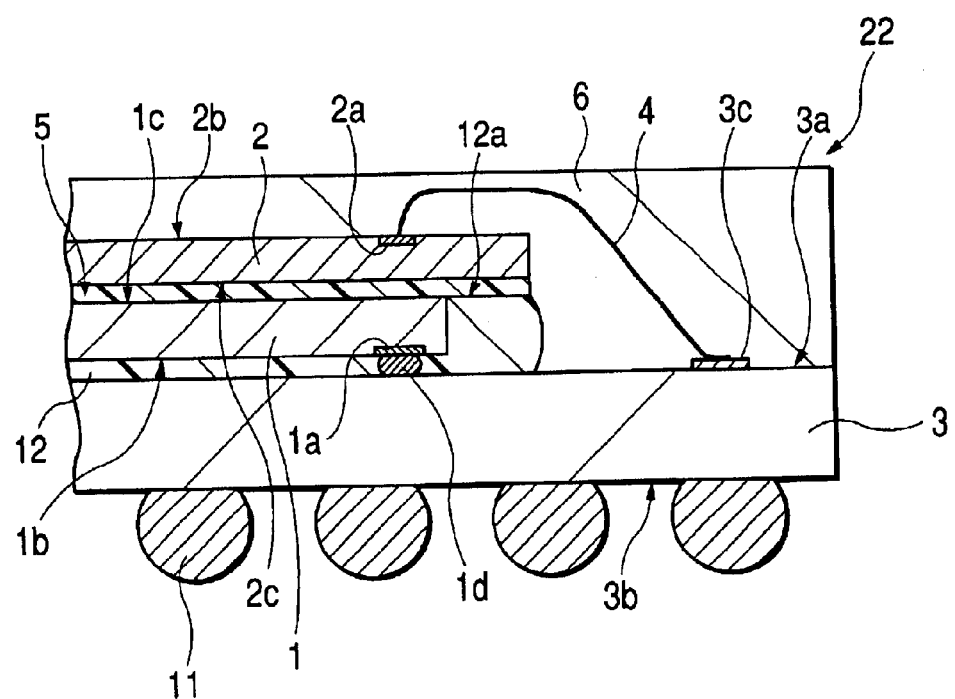
FIG. 7 is a diagram showing a partial cross section of a typical structure of a semiconductor device or a stack-structured CSP implemented by a second embodiment of the present invention.
Figure 8:
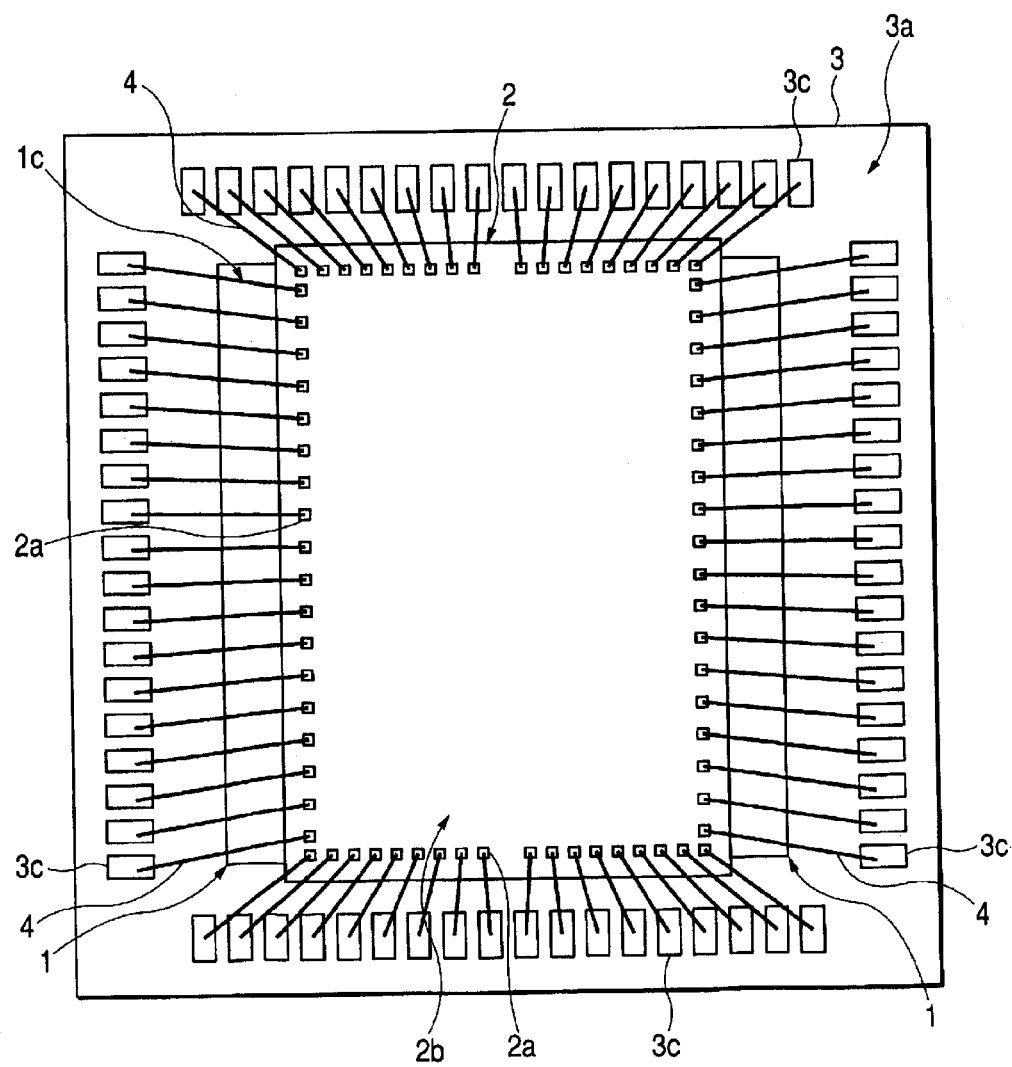
FIG. 8 is a diagram showing an enlarged top view of a typical wiring state in a process to assemble the CSP shown in FIG. 7.
Figure 9A:
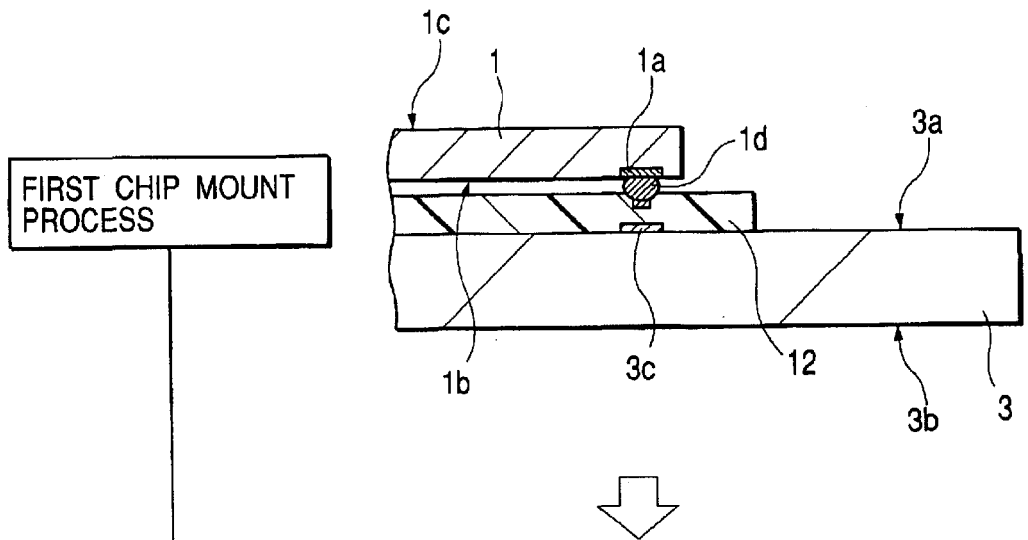
Figure 9B:
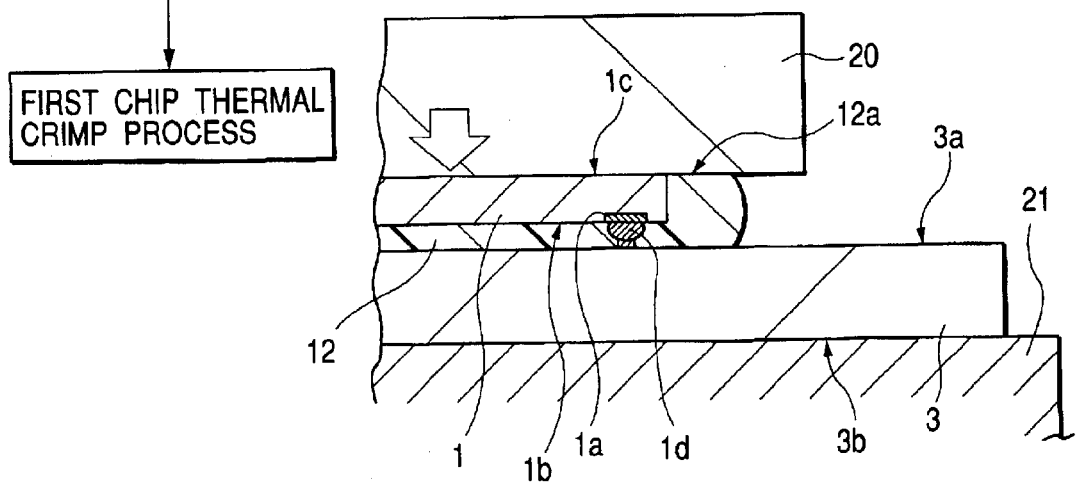
Figure 10A:
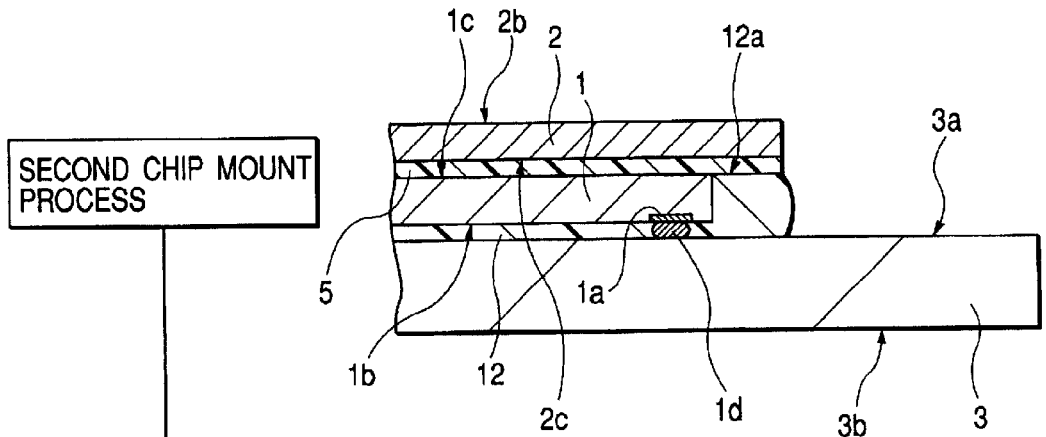
Figure 10B:
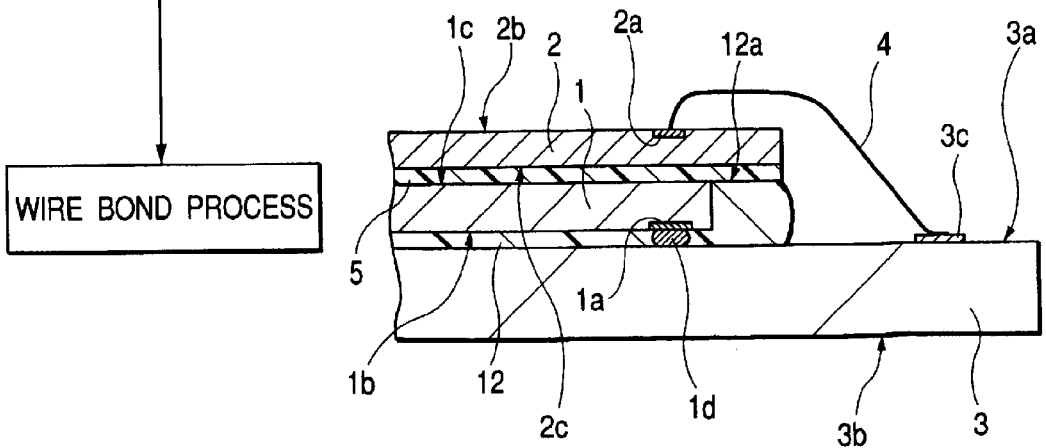

FIG. 7 is a diagram showing a partial cross section of a typical structure of a semiconductor device or a stack-structured CSP implemented by a second embodiment of the present invention. FIG. 8 is a diagram showing an enlarged top view of a typical wiring state in a process to assemble the CSP shown in FIG. 7. FIG. 9 is diagrams each showing a typical process to assemble the CSP shown in FIG. 7. FIG. 9A is a diagram showing a process to mount the first semiconductor chip 1. FIG. 9B is a diagram showing a process to thermally crimp the first semiconductor chip 1. FIG. 10 is diagrams each showing a partial cross section of a typical process to assemble the CSP shown in FIG. 7. FIG. 10A is a diagram showing a process to mount the second semiconductor chip 2. FIG. 10B is a diagram showing a wire-bonding process of the second semiconductor chip 2.

Figure 11:
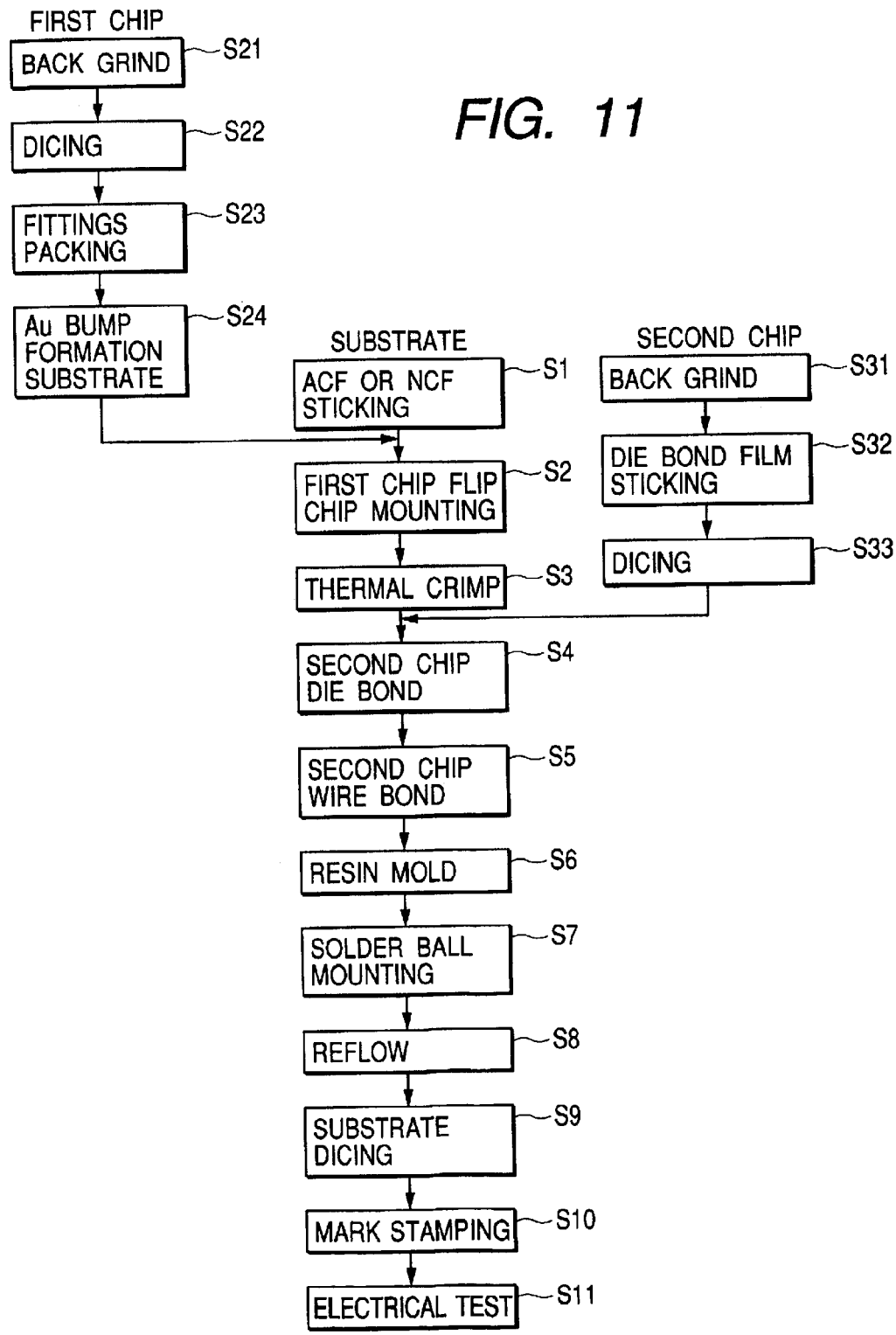
FIG. 11 is a fabrication process flow diagram showing all typical processes of a procedure to assemble a semiconductor device implemented by the second embodiment of the present invention.
Figure 15A:
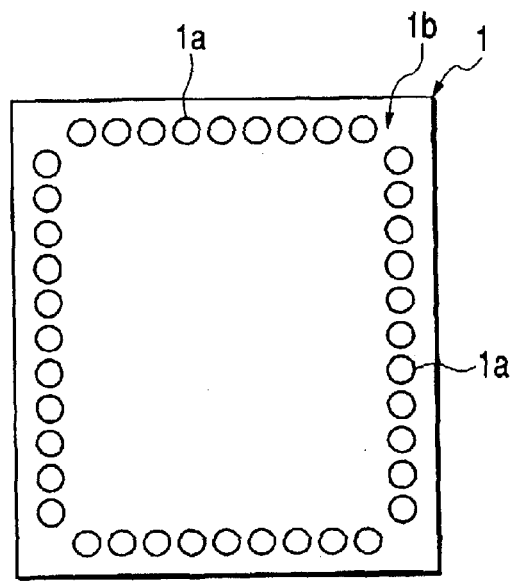
Figure 15B:
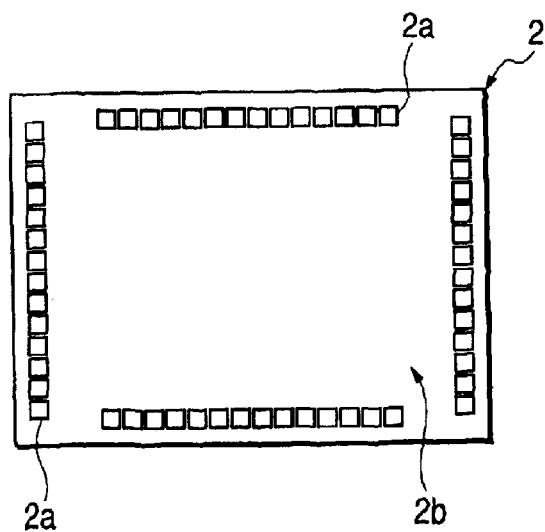
Figure 16A:
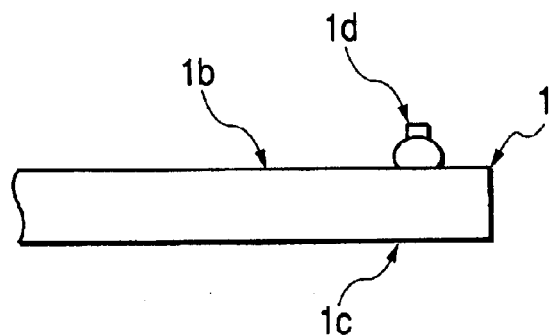
Figure 16B:
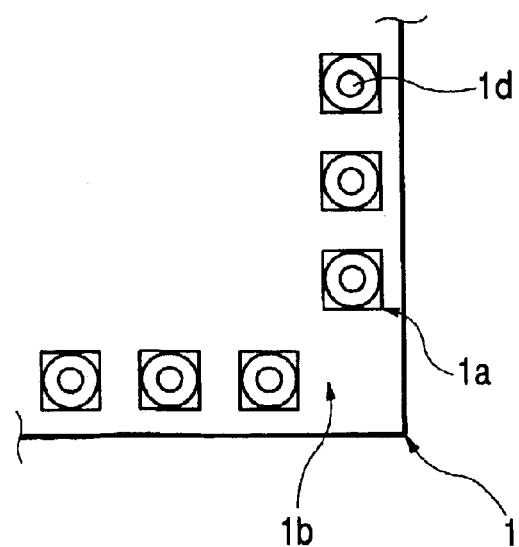
Figure 17:
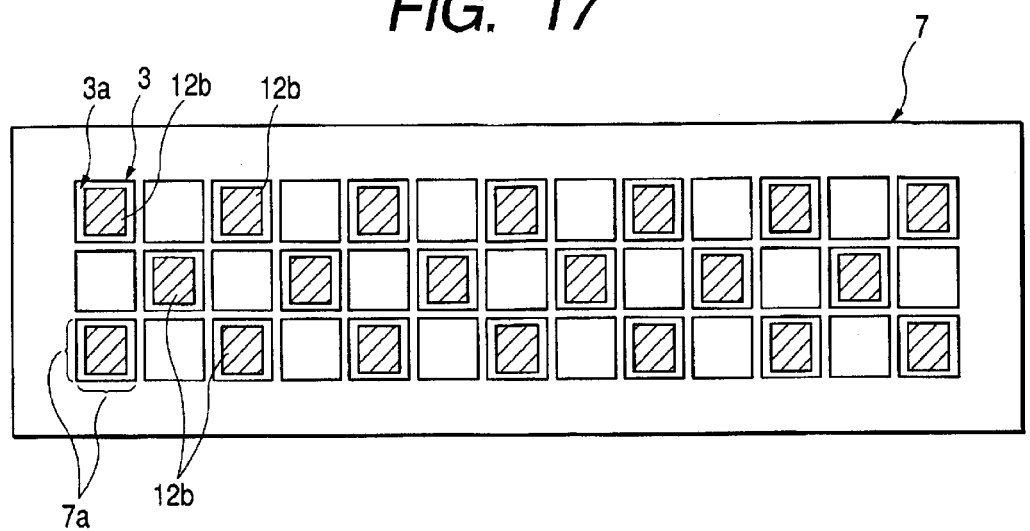
FIG. 17 is a diagram showing a top view of a typical process to stick a first NCF in a process to assemble the semiconductor device implemented by the second embodiment of the present invention.
Figure 18A:
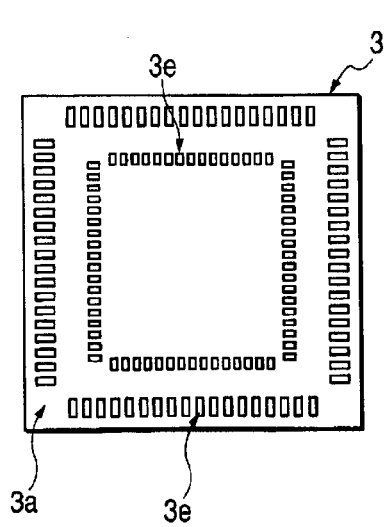
Figure 18B:
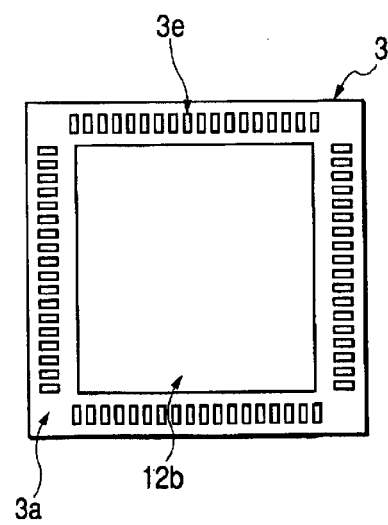
Figure 19A:
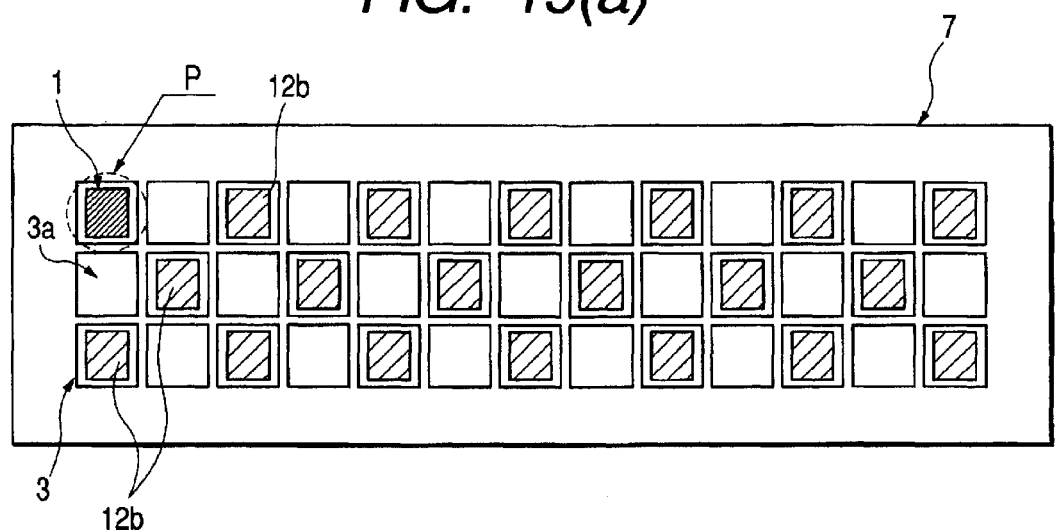
Figure 19B:
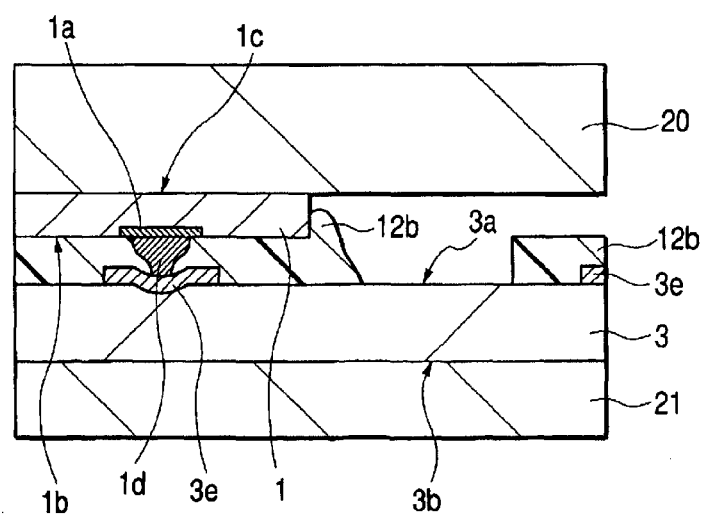
Figure 20A:
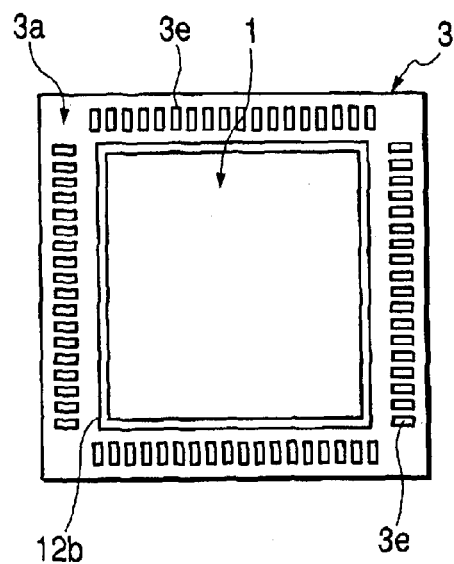
Figure 21:
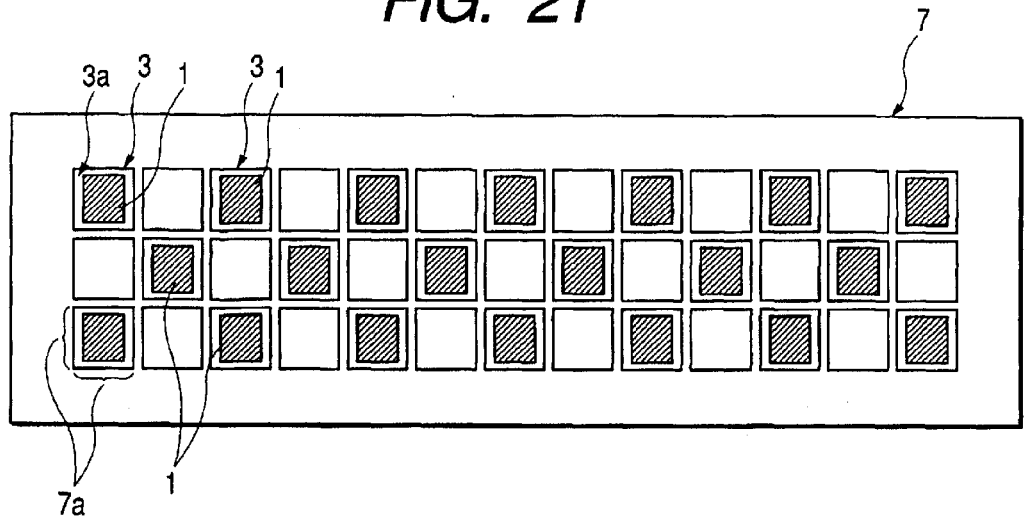
FIG. 21 is a diagram showing a top view of a typical structure formed after a die-bond process of the first semiconductor chip for the stuck first NCF shown in FIG. 17.
Figure 22:
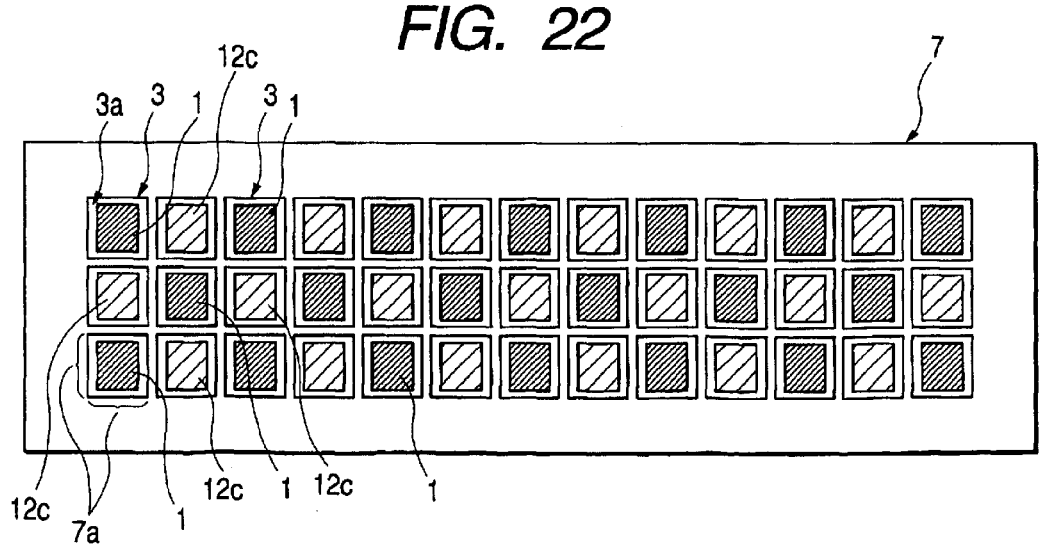
FIG. 22 is a diagram showing a top view of a typical structure formed after a process to stick a second NCF for the stuck first NCF shown in FIG. 17.
Figure 23:
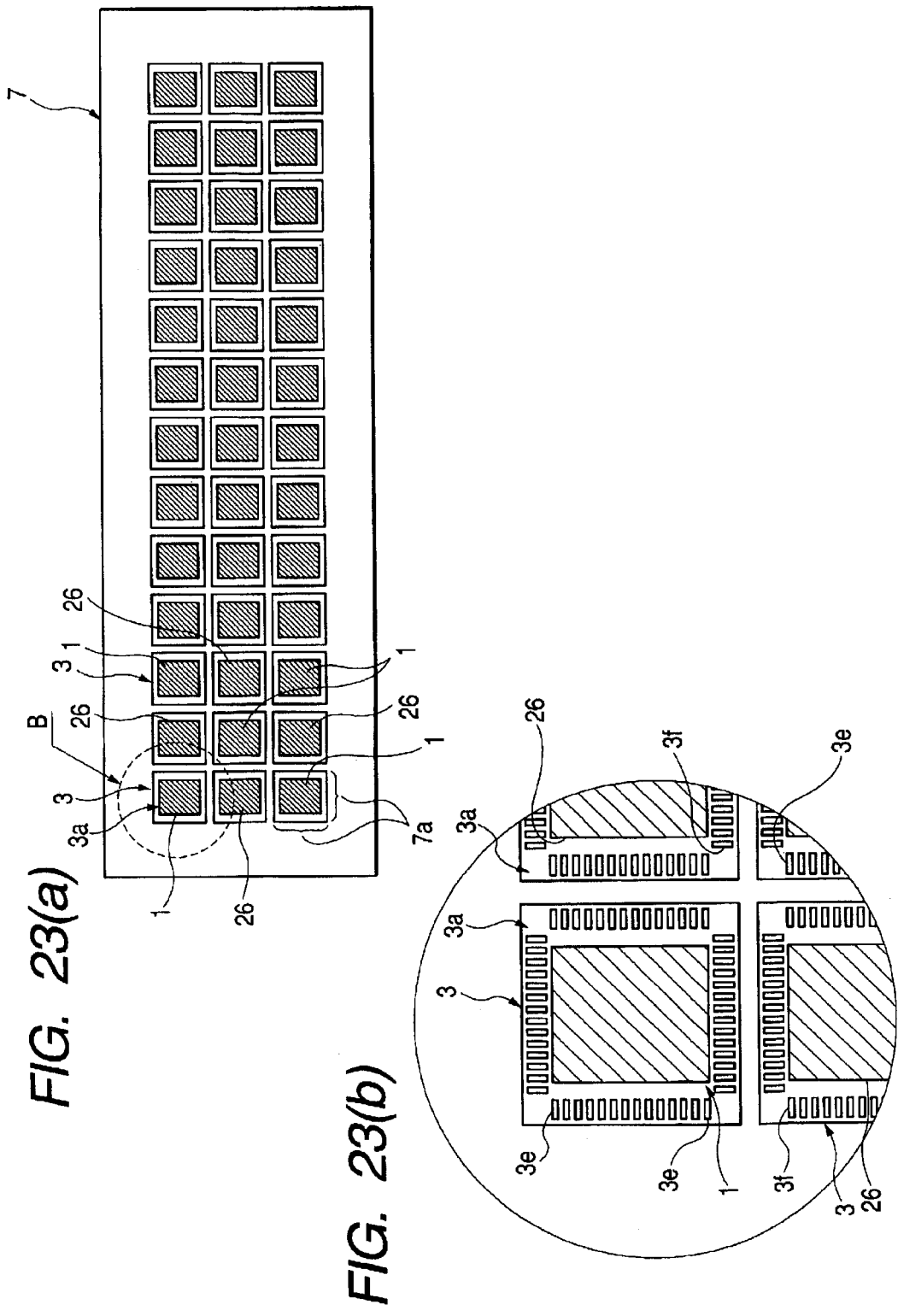
Figure 24:
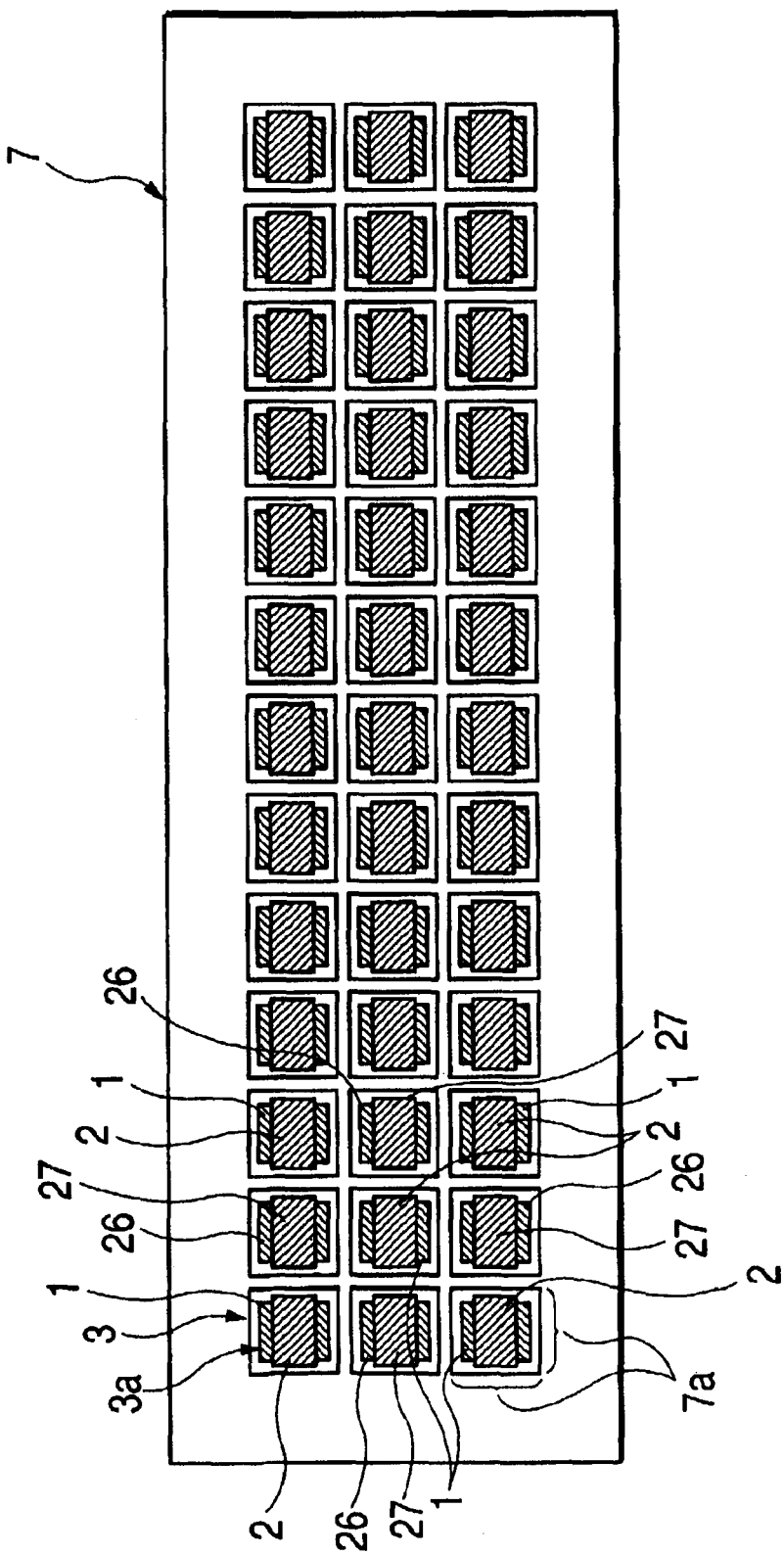
FIG. 24 is a diagram showing a structure of second and fourth semiconductor chips after a die-bond process for the stuck second NCF shown in FIG. 22.
Figure 25A:
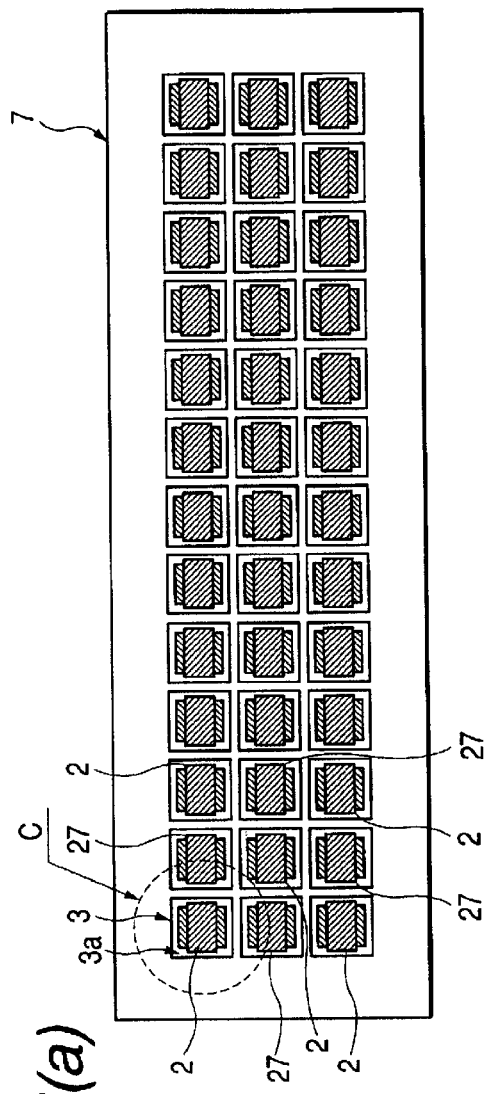
Figure 25B:
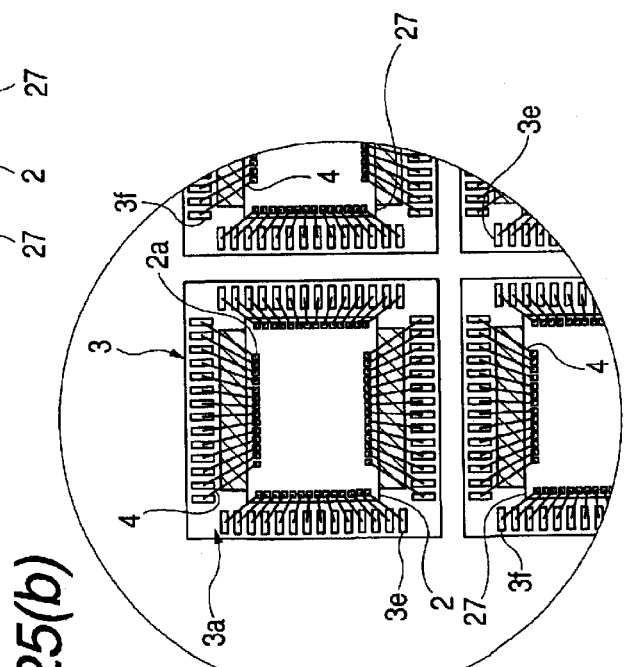
Figure 26A:
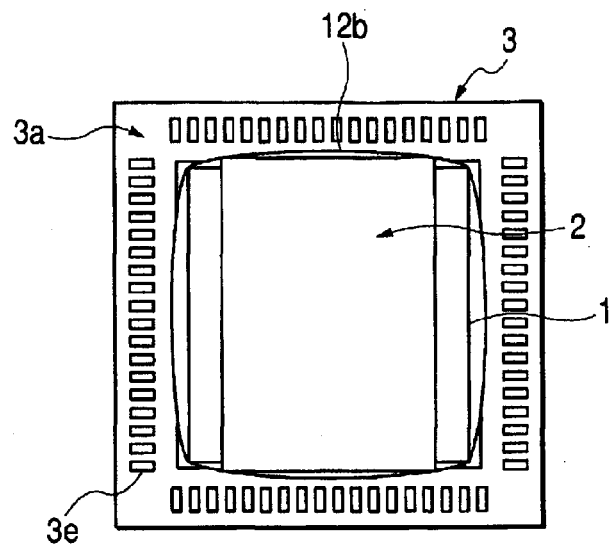
Figure 26B:
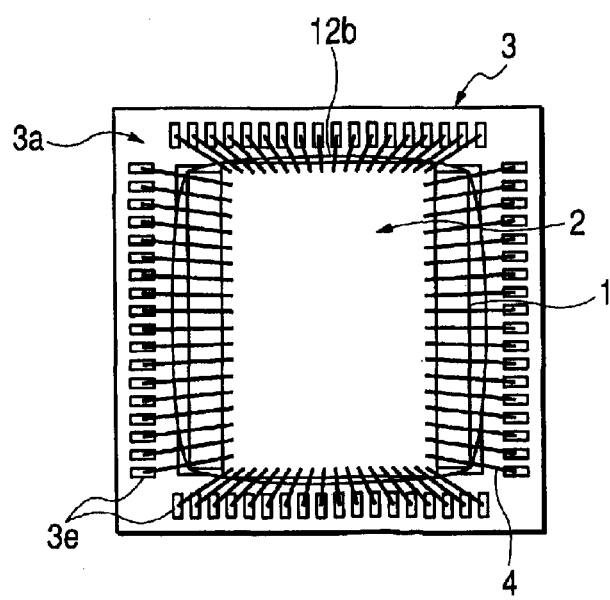
Figure 28:
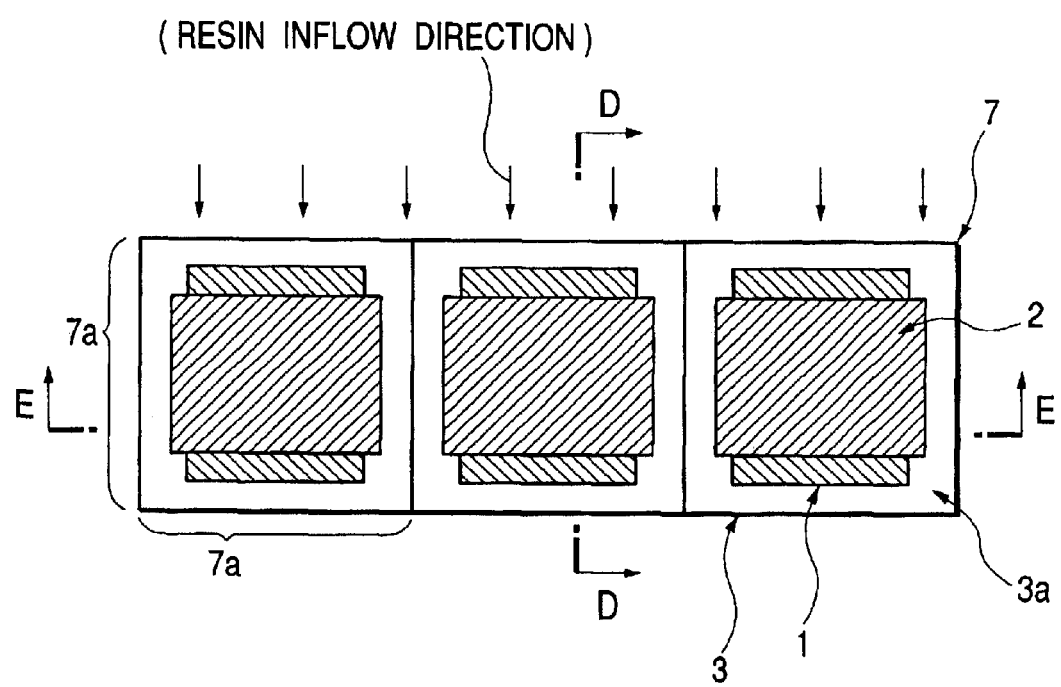
FIG. 28 is a diagram showing a top view of a typical direction in which resin is injected in a collective-mold method adopted in a process to assemble a semiconductor device implemented by the second embodiment of the present invention.
Figure 29A:
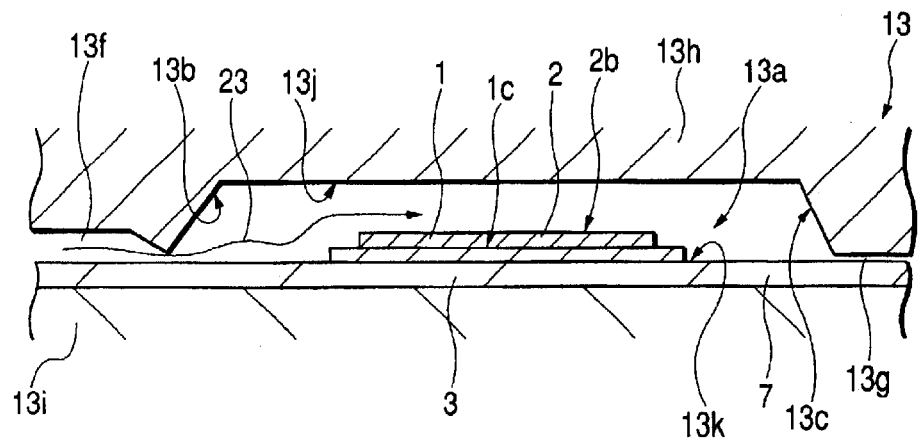
Figure 29B:
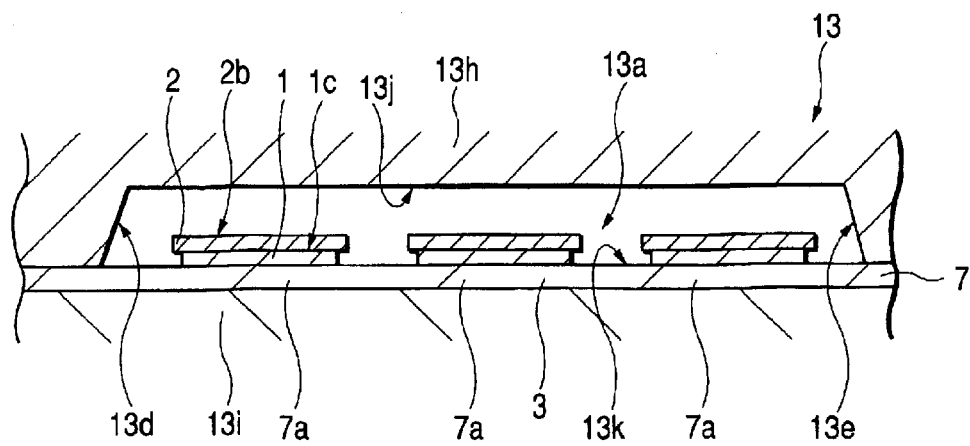
Figure 30:
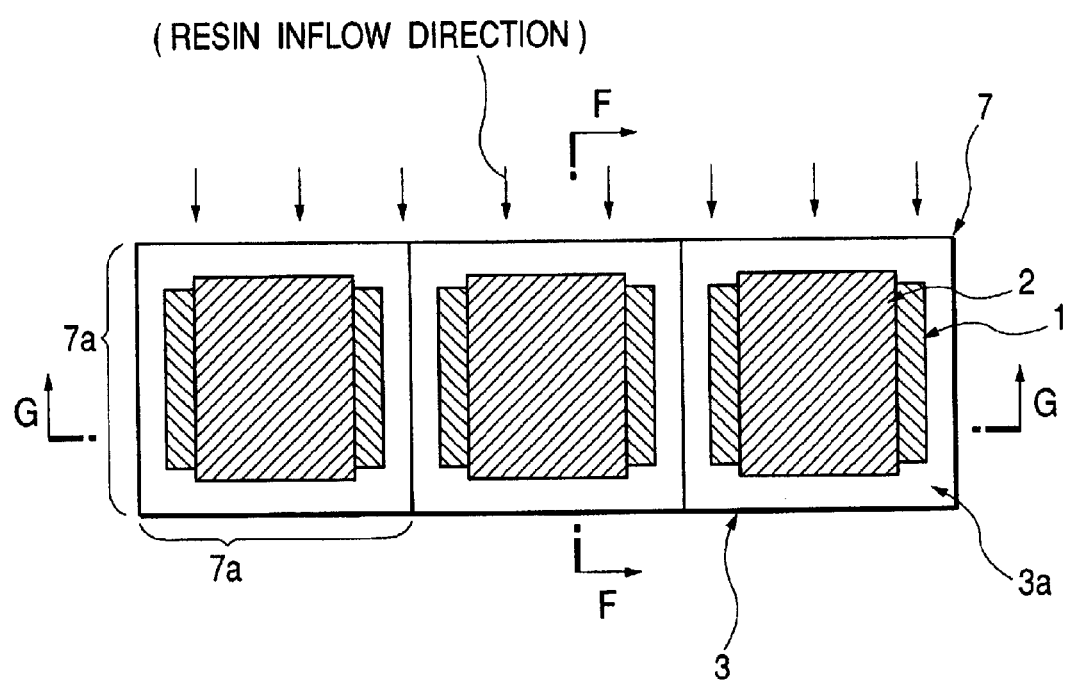
FIG. 30 is a diagram showing a top view of a typical direction in which resin is injected in a collective-mold method, which is a modified version of the collective-mold method shown in FIG. 28.
Figure 31A:
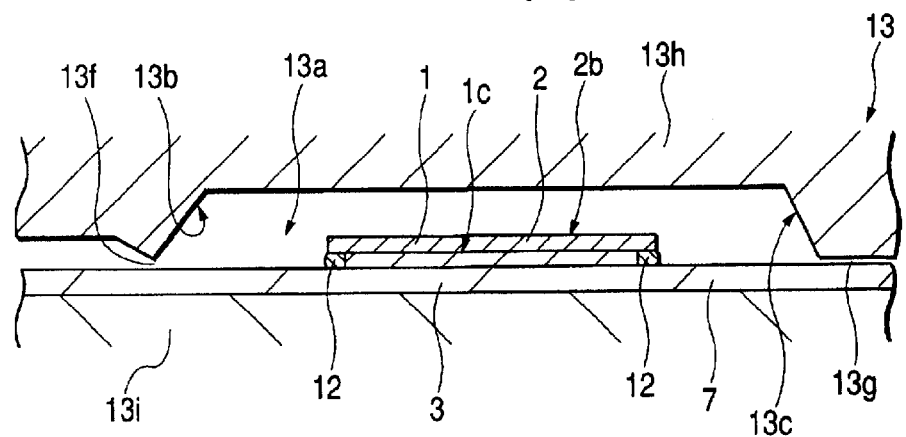
Figure 31B:
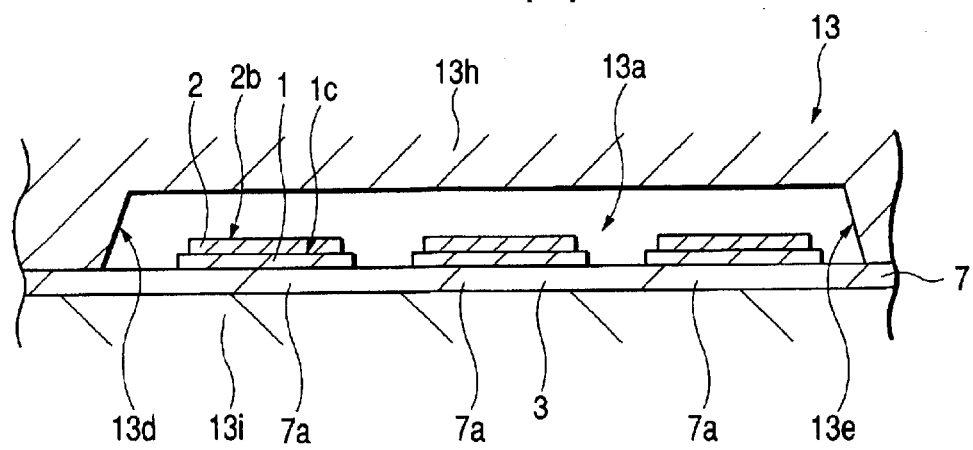
Figure 32:
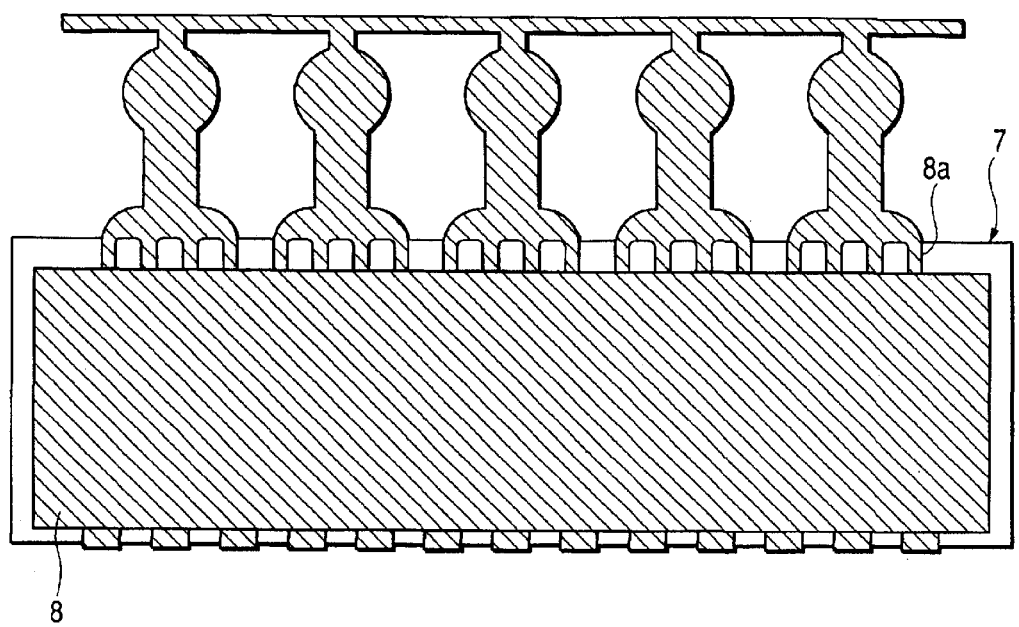
FIG. 32 is a diagram showing a top view of a typical structure of a multi-piece substrate after collective molding in a process to assemble a semiconductor device implemented by the second embodiment of the present invention.
Figure 33:
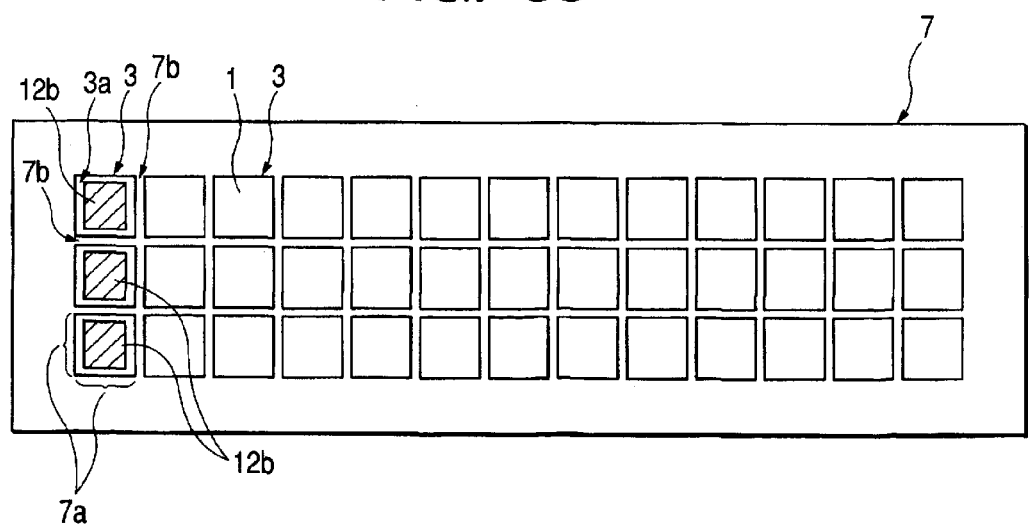
FIG. 33 is a diagram showing a top view of a process to stick a first NCF of a modified version for the process to stick the first NCF in a process to assemble a semiconductor device implemented by the second embodiment of the present invention.
Figure 34:
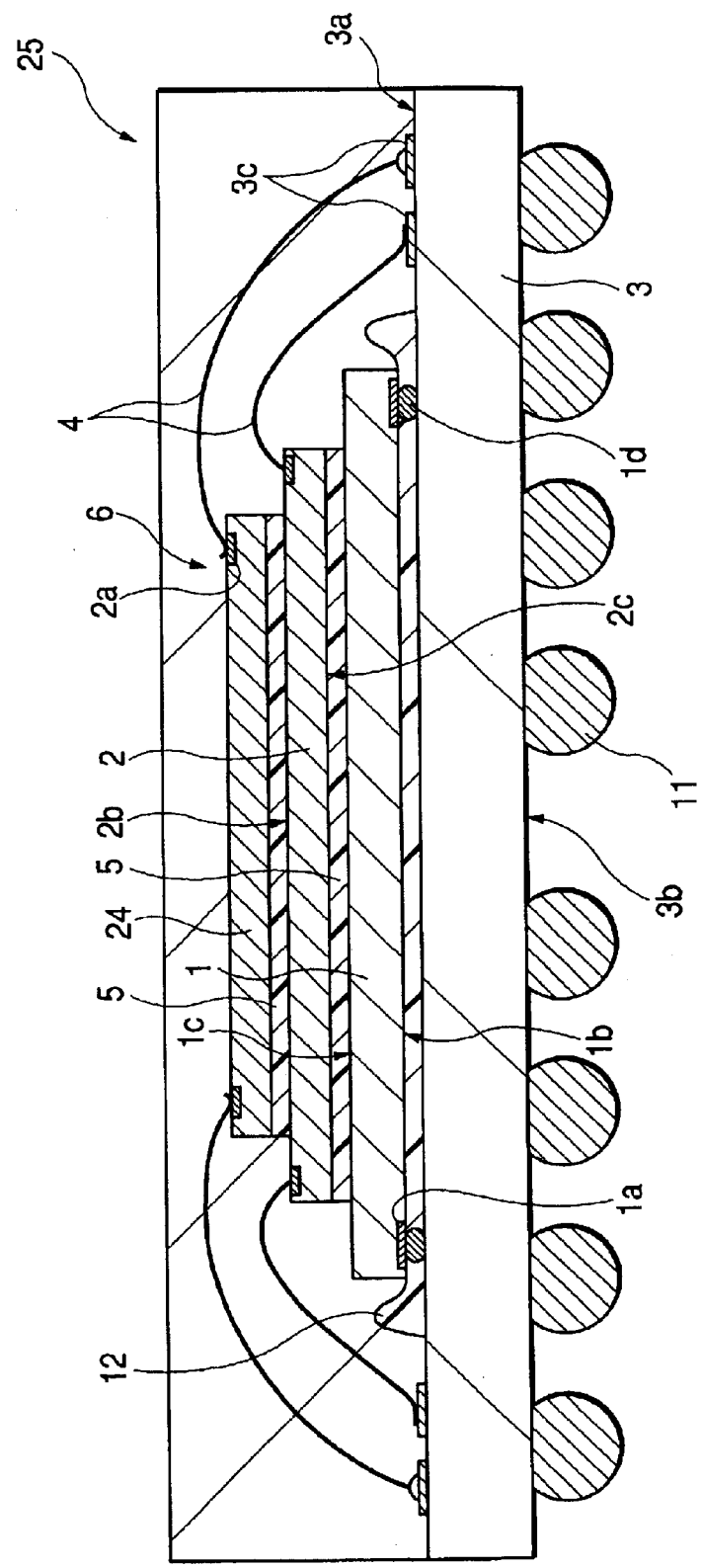
FIG. 34 is a cross-sectional diagram showing the structure of a CSP, which is a modified version of the stack-structured CSP shown in FIG. 1.

In addition, FIG. 11 is a fabrication process flow diagram showing all typical processes of a procedure to assemble a semiconductor device implemented by the second embodiment of the present invention. FIG. 12 is a fabrication process flow diagram showing detailed processes of a procedure to assemble a semiconductor device implemented by the second embodiment of the present invention. FIG. 13 is a diagram showing a top view of a typical structure of a multi-piece substrate in a procedure to assemble a semiconductor device implemented by the second embodiment of the present invention. FIG. 14 is enlarged diagrams each showing a portion of the multi-piece substrate shown in FIG. 13. FIG. 14A is a diagram showing a top view of details of portion A on the multi-piece substrate shown in FIG. 13. FIG. 14B is a diagram showing a bottom view of a back surface of portion A shown in FIG. 14A. FIG. 15 is a diagram showing top views of first and second semiconductor chips used in a process to assemble the semiconductor device implemented by the second embodiment of the present invention. FIG. 15A is a diagram showing the first semiconductor chip. FIG. 15B is a diagram showing the second semiconductor chip. FIG. 16 is a diagram showing a typical structure of the first semiconductor chip shown in FIG. 15. FIG. 16A is a diagram showing an enlarged side view of a portion of the structure. FIG. 16B is a diagram showing an enlarged top view of the portion of the structure. FIG. 17 is a diagram showing a top view of a typical process to stick a first NCF in the process to assemble the semiconductor device implemented by the second embodiment of the present invention. FIG. 18 is a diagram showing details of the process to stick the first NCF as shown in FIG. 17. FIG. 18A is a diagram showing a state prior to placement of the NCF. FIG. 18B is a diagram showing a state after placement of the NCF. FIG. 19 is a diagram showing a first semiconductor chip placed on the first NCF stuck as shown in FIG. 17. FIG. 19A is a diagram showing the placed first semiconductor chip. FIG. 19B is a diagram showing the first semiconductor chip pressed by a collet. FIG. 20 is a diagram showing a typical die-bond method for the first semiconductor chip. FIG. 20A is a diagram showing a mounted first semiconductor chip. FIG. 20 Bis a diagram showing the thermally crimped first semiconductor chip. FIG. 21 is a diagram showing a top view of a typical structure formed after a die-bond process of the first semiconductor chip for the stuck first NCF shown in FIG. 17. FIG. 22 is a diagram showing a top view of a typical structure formed after a process to stick a second NCF for the stuck first NCF shown in FIG. 17. FIG. 23 is a diagram showing a structure of completely mounted first and third semiconductor chips for the stuck second NCF shown in FIG. 22. FIG. 23A is a diagram showing a top view of the structure. FIG. 23B is a diagram showing an enlarged top view of details of portion B shown in FIG. 23A. FIG. 24 is a diagram showing a structure of second and fourth semiconductor chips after a die-bond process for the stuck second NCF shown in FIG. 22. FIG. 25 is a diagram showing a structure of second and fourth semiconductor chips after a wire-bonding process. FIG. 25A is a diagram a top view of the structure. FIG. 25B is a diagram showing an enlarged partial top view showing details of portion C shown in FIG. 25A. FIG. 26 is a diagram showing typical wire-bonding states of a second semiconductor chip. FIG. 26A is a diagram showing a state prior to a wire-bonding process. FIG. 26B is a diagram showing a state after the wire-bonding process. FIG. 27 is a diagram showing a typical structure of a multi-piece substrate subjected to a collective-mold process. FIG. 27A is a diagram showing a state prior to the collective-mold process. FIG. 27B is a diagram showing a state after the collective-mold process. FIG. 28 is a diagram showing a top view of a typical direction in which resin is injected in a collective-mold method adopted in a process to assemble a semiconductor device implemented by the second embodiment of the present invention. FIG. 29 is a diagram showing an example of the collective-mold method shown in FIG. 28. FIG. 29A is a diagram showing a partial cross section in a collective-mold process along a D—D line shown in FIG. 28. FIG. 29B is a diagram showing a partial cross section in the collective-mold process along an E—E line shown in FIG. 28. FIG. 30 is a diagram showing a top view of a typical direction in which resin is injected in a collective-mold method, which is a modified version of the collective-mold method shown in FIG. 28. FIG. 31 is a diagram showing an example of the other collective-mold method shown in FIG. 30. FIG. 31A is a diagram showing a partial cross section in a collective-mold process along an F—F line shown in FIG. 30. FIG. 31B is a diagram showing a partial cross section in the collective-mold process along an G—G line shown in FIG. 30. FIG. 32 is a diagram showing a top view of a typical structure of a multi-piece substrate after collective molding in a process to assemble a semiconductor device implemented by the second embodiment of the present invention. FIG. 33 is a diagram showing a top view of a process to stick a first NCF of a modified version for the process to stick a first NCF in a process to assemble a semiconductor device implemented by the second embodiment of the present invention. FIG. 34 is a cross-sectional diagram showing the structure of a CSP, which is a modified version of the stack-structured CSP shown in FIG. 1.

The second embodiment is used for explaining characteristic portions in a process to assemble the CSP 9 implemented by the first embodiment or a CSP 22 implemented by the second embodiment.

The CSP 22 implemented by the second embodiment has a stack structure. Much like the CSP 9 implemented by the first embodiment, the first semiconductor chip 1 is mounted in a phase-down process and connected as a flip chip. On the other hand, the second semiconductor chip 2 stacked on the first semiconductor chip 1 is mounted in a phase-up process and connected in a wire-bonding process. The second semiconductor chip 2 is thinner than the first semiconductor chip 1. The second embodiment is different from the first embodiment in that, in the case of the second embodiment, at least 2 sides facing each other in the second semiconductor chip 2 protrude (overhang) in planar directions out off the circumference of the first semiconductor chip 1 as shown in FIG. 7.

That is, the NCF 12 shown in FIG. 9A (and also the ACF) once fuses, becoming a liquid during the thermal crimping process.

Then, as shown in FIG. 9B, as the thermal crimp head 20 applies a load in the range 10 to 20 kgf to the back surface 1c of the first semiconductor chip 1, the NCF 12 beneath the first semiconductor chip 1 is pushed out, protruding from the edge of the first semiconductor chip 1.

After that, the NCF 12 hardens to a desired thickness. At that time, the amount of protrusion from the edge of the first semiconductor chip 1 is equal to a difference obtained as a result of subtracting the thickness of a post-crimping thickness from the initial thickness of the NCF 12. The protruding NCF 12 is trailed up over a side surface of the first semiconductor chip 1, arriving at the back surface 1c of the first semiconductor chip 1.

In this case, by making the thermal crimp head 20 larger than the size of the first semiconductor chip 1, it is possible to form a flat portion 12a at the protruding portion of the NCF 12 at the same height as the back surface 1c of the first semiconductor chip 1 as shown in FIG. 9B.

The length of the flat portion 12a can be adjusted by changing the initial thickness of the NCF 12.

Later on, the second semiconductor chip 2 is stacked on the back surface 1c of the first semiconductor chip 1 to mount the second semiconductor chip 2 as shown in FIG. 10A.

In addition, after the second semiconductor chip 2 has been mounted, a wire-bonding process is carried out to electrically connect pads 2a created on the second semiconductor chip 2 to corresponding junction terminals 3c created on the single-piece substrate 3 by wires 4 as shown in FIG. 10B.

Mounting and wire-bonding methods of the second semiconductor chip 2 are the same as respectively the mounting and wire-bonding methods adopted for the first embodiment explained earlier.

Next, a process to assemble the CSP 22 is explained by referring to a manufacturing process flow diagram shown in FIG. 11.

A fabrication process flow diagram shown in FIG. 12 shows details of the fabrication process flow diagram shown in FIG. 11.

First, a multi-piece substrate 7 is prepared. The multi-piece substrate 7 is a wiring substrate shown in FIG. 13. As shown in FIG. 14A, the multi-piece substrate 7 has a chip support surface 3a, a plurality of first connection terminals 3e (first electrodes) formed on the chip support surface 3a and a plurality of second connection terminals 3f (second electrodes) formed on the chip support surface 3a.

In this case, a first connection terminal 3e is used as an electrode for connecting a device area 7a of the multi-piece substrate 7 to the first semiconductor chip 1 in a device area 7a of the same staggered array while a second connection terminal 3f is used as an electrode for connecting a device area 7a of the multi-piece substrate 7 to a first semiconductor chip 1 in a device area 7a of another staggered array.

The second embodiment's third semiconductor chip 26 shown in FIG. 23 has the same structure as the first semiconductor chip 1 and is provided on the lower-layer side.

In addition, a device area 7a of the multi-piece substrate 7 shown in FIG. 14A serves as a single-piece substrate 3. On a back surface 3b of the device area 7a, bump lands 3d are exposed and laid out in a matrix form as shown in FIG. 14B.

Subsequently, a plurality of first semiconductor chips 1 shown in FIG. 15A are prepared. As shown in the figure, the first semiconductor chip 1 has a main surface 1b, a plurality of metallic bumps 1d formed on the same plurality of pads 1a created on the main surface 1b and a plurality of semiconductor devices created on the main surface 1b. Similarly, a plurality of second semiconductor chips 2 shown in FIG. 15B are prepared. As shown in the figure, the second semiconductor chip 2 has a main surface 2b, a plurality of pads 2a created on the main surface 2b and a plurality of semiconductor devices created on the main surface 2b.

The first semiconductor chip 1 and the second semiconductor chip 2 are prepared as follows. As shown in the fabrication process flow diagram of FIG. 11, the first semiconductor chip 1 is prepared by carrying out a back-grind process at a step S21, a dicing process at a step S22, a fittings-packing process at a step S23 and a process to form metal (Au) bumps at a step S24 by adoption of the methods used in the first embodiment to produce a result shown in FIGS. 16A and 16B. On the other hand, the second semiconductor chip 2 is prepared by carrying out a back-grind process at a step S31, a process to stick a die-bond film at a step S32 and a dicing process at a step S33 by adoption of the methods used in the first embodiment.

In addition, as for the multi-piece substrate 7, first, a process to bake the multi-piece substrate 7 as indicated by process No. 8 in the fabrication process flow diagram of FIG. 12 is carried out after the multi-piece substrate 7 has been prepared.

That is, the multi-piece substrate 7 is subjected to a heat-treatment process at a temperature of at least 100 degrees Celsius. Typically, the heat-treatment process is carried out for a bake time of about 4 hours and at a temperature of 125 degrees Celsius.

A resin substrate made of epoxy absorbs moistures with ease. For this reason, this heat-treatment process is carried out to eliminate the moistures from the multi-piece substrate 7. As a result, air bubbles can be prevented from being generated in the multi-piece substrate 7 in the process to thermally crimp the first semiconductor chip 1. In addition, the close adherence can also be prevented from deteriorating due to moistures contained in the multi-piece substrate 7.

Thus, after the bake processing, the procedure is continued by placing the first semiconductor chip 1 on the chip support surface 3a of the multi-piece substrate 7 through an NCF 12, which serves as an adhesive between the first semiconductor chip 1 and the chip support surface 3a. Later on, the adhesive is subjected to a heat-treatment process to harden the adhesive so that the first semiconductor chip 1 is fixed on the multi-piece substrate 7.

Then, at a step S1 of the fabrication process flow diagram of FIG. 11, an NCF is stuck. In this case, a first NCF 12b is used as a first adhesive. As shown in FIG. 18B, the first NCF 12b is put on a plurality of first connection terminals 3e provided in each device area 7a of the staggered array of multi-piece substrates 7 as shown in FIG. 18A.

The first NCF 12b comprises first and second portions, which are separated from each other and laid out in a device area 7a of the multi-piece substrate 7.

As an example, a plurality of first NCFs 12b each divided into the first and second portions are laid out to form a staggered array as shown in FIG. 17.

Furthermore, as shown in FIGS. 19A and 20A, a first semiconductor chip 1 is placed on one of the first NCFs 12b laid out to form a staggered array as described above. For example, the first semiconductor chip 1 is placed on the first NCF 12b located at the corner. The first semiconductor chip 1 is fixed on the first NCF 12b by carrying out a thermal crimping process. To put it in detail, at a step S2 of the fabrication process flow diagram shown in FIG. 11, the first semiconductor chip 1 is mounted as flip chip. Then, at the next step S3, the first semiconductor chip 1 is fixed on the first NCF 12b by carrying out a thermal crimping process.

In the thermal crimping process, as shown in FIG. 19B, the thermal crimp head 20 heated to a temperature of about 315 degrees Celsius applies a load to the back surface 1c of the first semiconductor chip 1 above the die-bond stage 21 heated to a temperature of about 70 degrees Celsius in order to thermally crimp the first semiconductor chip 1 against the first NCF 12b.

Figure 20B:
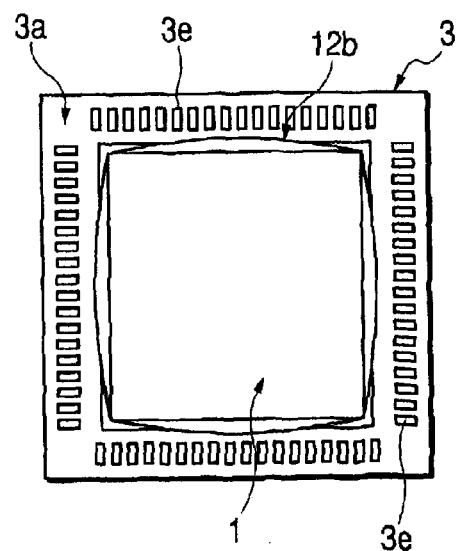

As a result, as shown in FIGS. 19B and 20B, the first semiconductor chip 1 is fixed on the device area 7a of the multi-piece substrate 7 through the first NCF 12b in such a way that a plurality of metallic bumps 1d provided on the first semiconductor chip 1 are electrically connected to a plurality of respective connection terminals 3e provided in the device area 7a and the first NCF 12b protrudes to the circumference of the first semiconductor chip 1.

A range P enclosed by a dotted line in FIG. 19A is a range heated to a substrate temperature, at which the thermally-hardening resin of the first NCF 12b is hardened, due to an effect of heat generated by the thermal crimp head 20. When distributing a plurality of first NCFs 12b to form typically a staggered array, adjacent first NCFs 12b are prevented from being placed in the same range P.

That is, the first NCFs 12b are laid out in the array in such a way that the first NCFs 12b are placed at locations separated from each other by gaps capable of avoiding an effect of heat generated by the thermal crimp head 20.

As a result, an adjacent first NCF 12b can be prevented from hardening prior to a thermal crimping process due to an effect of heat generated by the thermal crimp head 20. In addition, the process to mount a plurality of first semiconductor chips 1 can be carried out with a high degree of efficiency. This is because a plurality of clustered first NCFs 12b are laid out in such a way that no 2 or more first NCFs 12b are placed in the same range P, and then a first semiconductor chip 1 is placed on each of the first NCFs 12b before the first semiconductor chips 1 are thermally crimped continuously.

In this way, the process to thermally crimp first semiconductor chips 1 in the staggered array as shown in FIG. 21 is completed.

After that, a second NCF 12c (a second adhesive) is placed on a plurality of second connection terminals 3f provided in a next device area 7a of the staggered array on the multi-piece substrate 7. The next device area 7a is a device area, which is adjacent to the device area 7a with the first semiconductor chip 1 already mounted thereon but has no first semiconductor chip 1 mounted yet.

That is, as shown in FIG. 22, at a position adjacent to each of the first semiconductor chips 1 laid out in the staggered array, a second NCF 12c is placed. Thus, a plurality of second NCFs 12c separated from each other are laid out to form a similar staggered array.

Then, a plurality of third semiconductor chips 26 shown in FIG. 23 are mounted on the second NCFs 12c laid out to form the staggered array and thermally crimped by thermal crimp head 20 by adoption of the same method described earlier.

As a result, a plurality of third semiconductor chips 26 are fixed on the chip support surfaces 3a of the same plurality of device areas 7a on the multi-piece substrate 7 through the second NCFs 12c, and a plurality of metallic bumps 1d provided on of each of the third semiconductor chips 26 are electrically connected to the same plurality of connection terminals 3f in the corresponding device 7a of the multi-piece substrate 7, which are shown in FIG. 14A. The metallic bumps id are shown in FIG. 16.

In this way, the process to mount the first semiconductor chips 1 and the third semiconductor chips 26 on the lower-layer side over the multi-piece substrate 7 as shown in FIGS. 23A and 23B is completed.

The first NCF 12b and the second NCF 12c are each a film made of the thermally hardening resin. Thus, the thermal crimping process is carried out by hardening the thermally hardening resin materials of the first NCF 12b and the second NCF 12c due to a load and heat, which are generated by the thermal crimp head 20 and the die-bond stage 21.

In addition, in the case of the second embodiment, first, a plurality of first NCFs 12b are laid out as shown in FIG. 17. While the first NCFs 12b are laid out to form a staggered array in accordance with the above description, they can also be laid out into an arrangement other than a staggered array. Then, a group of semiconductor chips, that is, a plurality of first semiconductor chips 1, are mounted on the first NCFs 12b as shown in FIG. 21. After the mounting process has been completed, remaining second NCFs 12c are laid out as shown in FIG. 22 and a group of semiconductor chips, that is, a plurality of third semiconductor chips 26, are mounted as shown in FIG. 23. In this way, the process to mount lower-layer semiconductor chips, that is, the first semiconductor chips 1 and the third semiconductor chips 26, is completed as described above.

If the thermal effect of the thermal crimp head 20 on an adjacent device area 7a is negligible, however, the process to lay out all NCFs 12 can also be completed first. Then, a plurality of first semiconductor chips 1 and a plurality of third semiconductor chips 26 are subjected a die-bond (mounting) process to thermally crimp the first and third semiconductor chips 1 and 26 on the NCFs 12. In this case, it is not necessary to classify the NCFs 12 into first NCFs 12b and second NCFs 12c. In addition, the process to mount the first semiconductor chips 1 can be carried out as a single process. Thus, the process to mount the NCFs 12 and the process to mount the semiconductor chips on the lower-layer side can each be carried out with a high degree of efficiency.

If the thermal effect of the thermal crimp head 20 on an adjacent device area 7a is extremely big, on the other hand, that is, even if the mutual thermal effects between device areas 7a placed at adjacent positions in a diagonal-line direction cannot be neglected for example, one-fourth of all the NCFs 12 can be laid out at one time instead of laying out all the NCFs 12 on all adjacent device areas 7a at the same time. Thus, the first semiconductor chips 1 are mounted by dividing them into 4 groups each to be mounted at one time.

Next, the second semiconductor chip 2 is mounted at a step S4 of the fabrication process flow diagram shown in FIG. 11.

In the case of the second embodiment, after all the first semiconductor chips 1 have been mounted, second semiconductor chips 2 are mounted as shown in FIG. 24.

However, the individual second semiconductor chips 2 can be mounted by adoption of the same method adopted by the first embodiment to mount second semiconductor chips 2.

That is, the second semiconductor chip 2 thinner than the first semiconductor chip 1 is mounted on the back surface 1c of the first semiconductor chip 1 in such a way that the back surface 1c of the first semiconductor chip 1 interfaces with the back surface 2c of the second semiconductor chip 2 through the die-bond film material 5 as shown in FIG. 6A. The second semiconductor chip 2 is mounted on the first semiconductor chip 1 by applying a pressure smaller than a pressure generated by the thermal crimp head 20 in a die-bond process of the first semiconductor chip 1 as shown in FIG. 5B. The pressure applied in the die-bond process is in the range 10 to 20 kgf in the case o f a CSP 22 having 200 bumps.

Thus, with the die-bond film material 5 serving as an adhesive, a load and heat fix the second semiconductor chip 2 on the back surface 1c of the first semiconductor chip 1, which has been connected as a flip chip. Refer to FIG. 26A.

The load (the pressure) applied to fix the second semiconductor chip 2 is about 1 kgf for the main surface 2b of the second semiconductor chip 2 of the CSP 9 having a size of about 50 mm$^2$. The temperature is about 160 degrees Celsius.

By adopting this method, a plurality of second semiconductor chips 2 and a plurality of fourth semiconductor chips 27 are thermally crimped sequentially to completion of all shown in FIG. 24.

The fourth semiconductor chips 27 each have the same structure as the second semiconductor chip 2 and are each placed on a third semiconductor chip 26.

Afterwards, at a step S5 of the fabrication process flow diagram shown in FIG. 11, a plurality of pads 2a provided on the second semiconductor chip 2 and the fourth semiconductor chip 27 are electrically connected to a plurality of first connection terminals 3e or second connection terminals 3f provided on a device area 7a for the second semiconductor chip 2 and the fourth semiconductor chip 27 by using metallic wires 4 in a wire-bonding process. Refer to FIGS. 25B and 26B. The device area 7a serves as a single-piece substrate 3.

This wire-bonding process is carried out on the second semiconductor chips 2 each paired with a fourth semiconductor chip 27 sequentially one pair after another as shown in FIG. 25A till all pairs each comprising a second semiconductor chip 2 and a fourth semiconductor chip 27 are completed.

Then, at the next step S6 of the fabrication process flow diagram shown in FIG. 11, the first semiconductor chip 1 paired with the third semiconductor chip 26, the second semiconductor chip 2 paired with the fourth semiconductor chip 27 and a plurality of wires 4 are subjected to a resin-molding process carried out as a resin sealing process.

In this process, a plurality of device areas 7a on the multi-piece substrate 7 are covered in one cavity 13a and collectively molded and, afterwards, the multi-piece substrate 7 is subjected to a dicing process to divide the multi-piece substrate 7 into a plurality of pieces in a collective mold process adopting a MAP (Mold Array Package) method explained below.

First, in the mold process, a metal pattern to be used as a mold 13 is prepared. As show in FIGS. 29A and 29B, the mold 13 comprises a cavity 13a and a plurality of resin injection entrances 13f. The cavity 13a comprises:

a first side surface 13b and a second side surface 13c which face each other;

a third side surface 13d and a fourth side surface 13e which face each other and come in contact with the first side surface 13b and the second side surface 13c; and a top surface 13j and a bottom surface 13k, which come in contact with the first side surface 13b, the second side surface 13c, the third side surface 13d and the fourth side surface 13e.

The resin injection entrances 13f are formed on the first side surface 13b.

To describe the mold 13 in a different way, the mold 13 comprises an upper mold portion 13h and lower mold portion 13i. The cavity 13a having the first side surface 13b, the second side surface 13c, the third side surface 13d, the fourth side surface 13e and the top surface 13j is formed in the upper mold portion 13h.

In addition, an air hole 13g serving as a ventilation hole is created on the second side surface 13c in the upper mold portion 13h of the mold 13.

In the mean time, the multi-piece substrate 7, the first semiconductor chip 1 and the second semiconductor chip 2 are prepared. The multi-piece substrate 7 is a wiring substrate on which a plurality of device areas 7a are formed. The first semiconductor chip 1 is prepared in each of the device areas 7a on the multi-piece substrate 7. The second semiconductor chip 2 is fixed on the first semiconductor chip 1. That is, the multi-piece substrate 7 after a wire-bonding process is prepared as shown in FIG. 27A.

A plurality of metal-plated units 7c are created at one longitudinal-direction end of the multi-piece substrate 7. The end is an end on a side corresponding to the resin injection holes 13f of the mold 13. The metal-plated units 7c are created in order to make a resin gate 8a easy to peel off from the multi-piece substrate 7. The resin gate 8a shown in FIG. 27B is formed by molding.

Then, the multi-piece substrate 7, a plurality of first semiconductor chips 1 and a plurality of second semiconductor chips 2 are located in the lower mold portion 13i of the cavity 13a as shown in FIG. 29A. On the other hand, a plurality of device areas 7a are collectively covered by the cavity 13a in the upper mold portion 13h as shown in FIG. 29B.

A plurality of first semiconductor chips 1 and a plurality of second semiconductor chips 2 are located in such a way that, on a cross section parallel to the third side surface 13d of the cavity 13a, the length of each of the first semiconductor chips 1 is greater than the length of each of the first semiconductor chips 2 each stacked on a first semiconductor chip 1. The cross section parallel to the third side surface 13d is the cross section shown in FIG. 29a.

On the other hand, the first semiconductor chips 1 and the second semiconductor chips 2 are located in such a way that, on a cross section parallel to the first side surface 13b of the cavity 13a, the length of each of the first semiconductor chips 1 is smaller than the length of each of the first semiconductor chips 2 each stacked on a first semiconductor chip 1. The cross section parallel to the first side surface 13b is a cross section forming an angle of 90 degrees in conjunction with the third side surface 13d or the cross section shown in FIG. 29b.

That is, the first semiconductor chip 1 and the second semiconductor chip 2 are put in a relation that, in a resin injection direction shown in FIG. 28, the length of the first semiconductor chip 1 is greater than the length of the first semiconductor chip 2.

At this time, the first semiconductor chip 1 and the second semiconductor chip 2 are put in a relation that, in a direction perpendicular to the resin injection direction shown in FIG. 28, the length of the first semiconductor chip 1 is smaller than the length of the first semiconductor chip 2.

After the upper mold portion 13h and the lower mold portion 13i are tightened by molding in this state, resin is injected to each device area 7a through a plurality of resin injection holes 13f in order to collectively seal and hold a plurality of first semiconductor chips 1 and a plurality of semiconductor chips 2 by using the resin.

In this case, in the resin injection direction shown in FIG. 28, a staircase step is generated between the back surface 1c of the first semiconductor chip 1 and the second semiconductor chip 2. Since the second semiconductor chip 2 on the upper-layer side is relatively protruding, the flow of resin is directed into a flow 23 shown in FIG. 29A, making the resin redirected with ease to a space above the main surface 2b of the second semiconductor chip 2 so that air in the cavity 13a is expelled from the air hole 13g.

Thus, generation of voids on the main surface 2b of the second semiconductor chip 2 can be suppressed so that molding characteristics are improved.

As a modified version of the implementation shown in FIG. 29, in the cavity 13a, for a direction parallel to the resin injection direction, both the first semiconductor chip 1 and the second semiconductor chip 2 are placed in such a way that the second semiconductor chip 2 has portions protruding in planar-surface directions from sides provided on the first semiconductor chip 1 as shown in FIGS. 30 and 31A. In this case, gaps between the protruding portions of the second semiconductor chip 2 and the chip support surface 3a of the multi-piece substrate 7 are filled up with NCFs 12 each serving as an adhesive.

After the upper mold portion 13h and the lower mold portion 13i are tightened by molding in this state, resin is injected to each device area 7a through a plurality of resin injection holes 13f in order to collectively seal and hold a plurality of first semiconductor chips 1 and a plurality of semiconductor chips 2 by using the resin.

Assume that the gaps between the protruding portions of the second semiconductor chip 2 and the chip support surface 3a of the multi-piece substrate 7 are not filled up with NCFs 12. In this case, it is more likely quite within the bonds of possibility that a void, that is, a portion unfilled with resin, is generated under the protruding portion of the second semiconductor chip 2 on the side far from the first side surface 13b of the cavity 13a. In accordance with a transfer-mold technique, a high pressure is applied to the resin at the final stage of the mold process in order to eliminate or compress a void in the resin so that the volume of the void is reduced. In a state where a large void exists beneath the chip as described above, however, applying a pressure to resin will incur a risk of cracking the chip.

In the case of the second embodiment, nevertheless, the gaps between the protruding portions of the second semiconductor chip 2 and the chip support surface 3a of the multi-piece substrate 7 are filled up with NCFs 12 in advance prior to the mold process. Thus, it is possible to solve the problem of chip cracking even if a pressure is applied during a transfer-mold process.

As the mold process is finished, on the multi-piece substrate 7, a lumped mold unit 8 and a plurality of resin gates 8a like those shown in FIGS. 27B and 32 are created.

Afterwards, at a step S7 of the fabrication process flow diagram of FIG. 11, a ball mounting process is carried out to tentatively hold solder balls provided on bump lands 3d on device areas 7a of the multi-piece substrate 7.

Then, at the next step S8, the solder balls are subjected to a reflow process to fix the solder balls provided on the bump lands 3d.

Later on, at the next step S9, the multi-piece substrate 7 is subjected to a dicing process to produce the individual packages.

Subsequently, at the next step S10, marks are stamped and, at the following step S11, an electrical test is carried out to complete the assembly process of the CSP 22.

Third Embodiment

Figure 35:
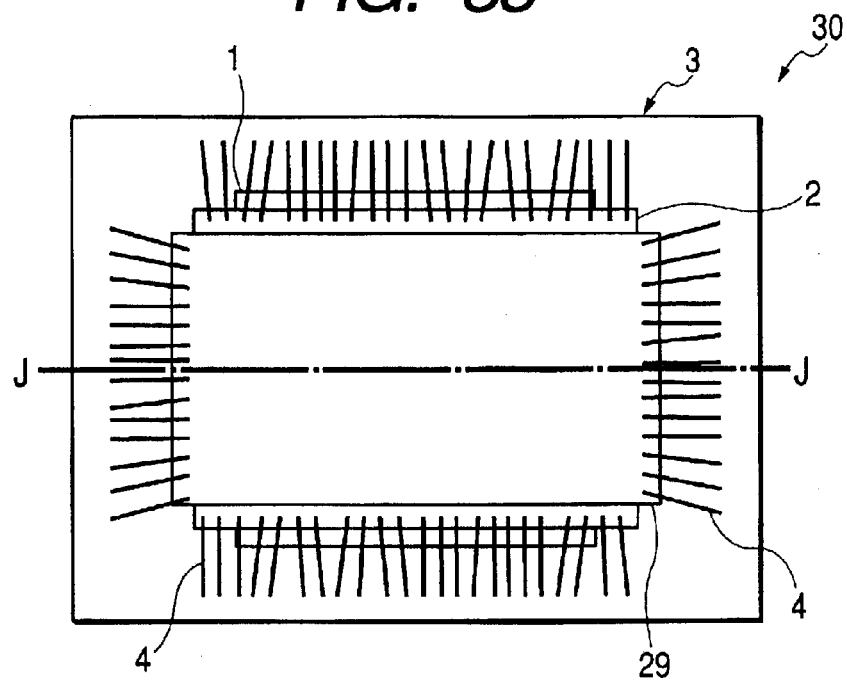
FIG. 35 is a diagram showing a top view of a typical structure of the present invention's third embodiment implementing a semiconductor device or a CSP having a stack structure in a resin sealing body.
Figure 36:
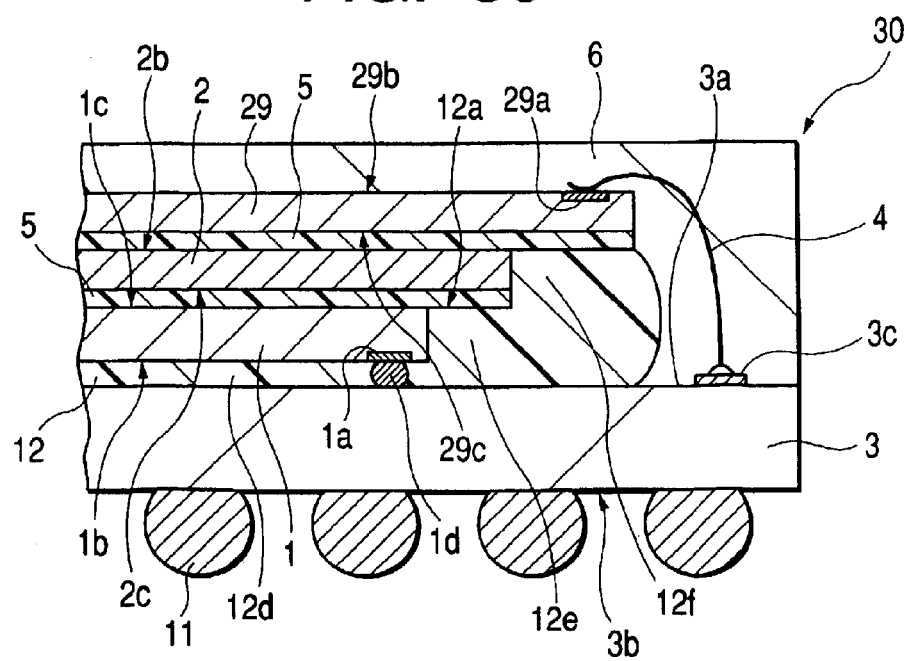
FIG. 36 is a diagram showing an enlarged partial cross section along a J—J line shown in FIG. 35.
Figure 37:
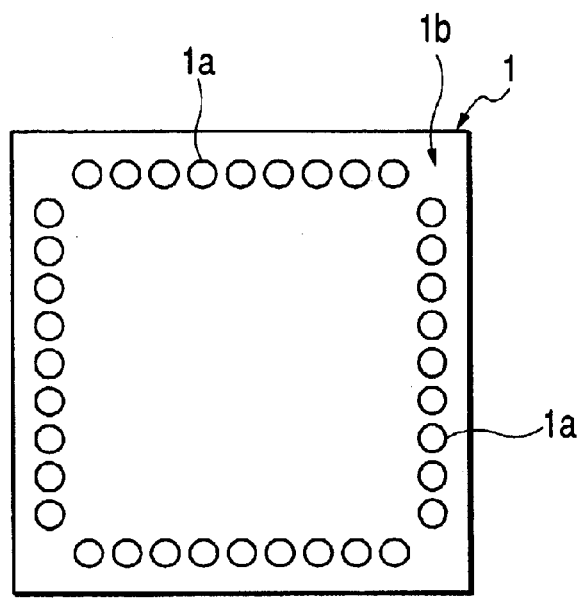
FIG. 37 is a diagram showing a top view of a typical structure of a first semiconductor chip embedded in the CSP shown in FIG. 35.
Figure 38:
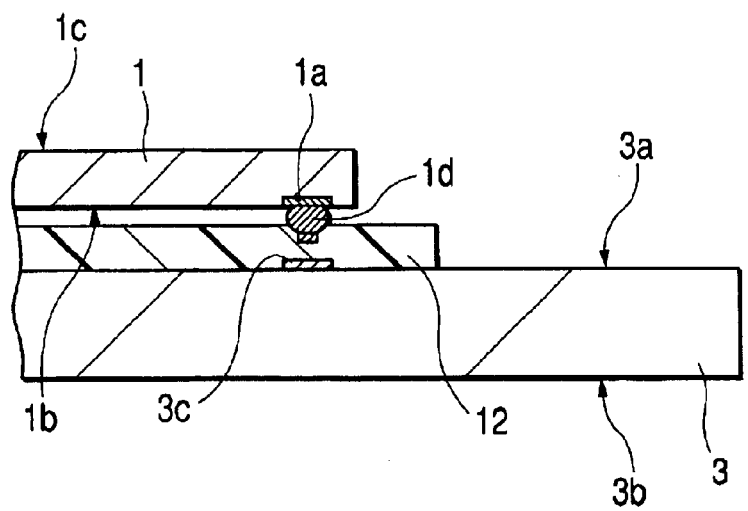
FIG. 38 is a diagram showing an enlarged partial cross section of a typical state, in which the first semiconductor chip has been mounted, in a process to assemble the CSP shown in FIG. 35.
Figure 39:
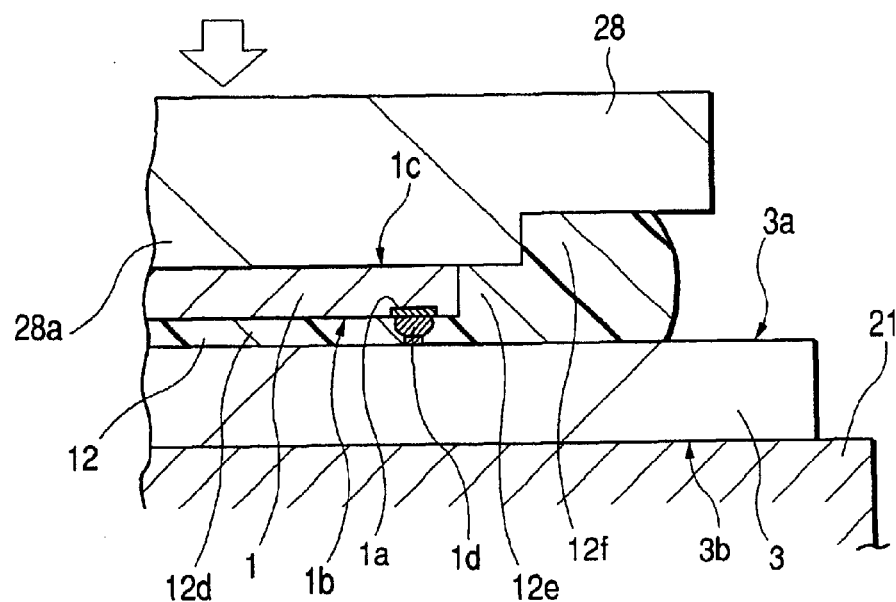
FIG. 39 is a diagram showing an enlarged partial cross section of a typical state, in which the first semiconductor chip has been thermally crimped, in a process to assemble the CSP shown in FIG. 35.
Figure 40:
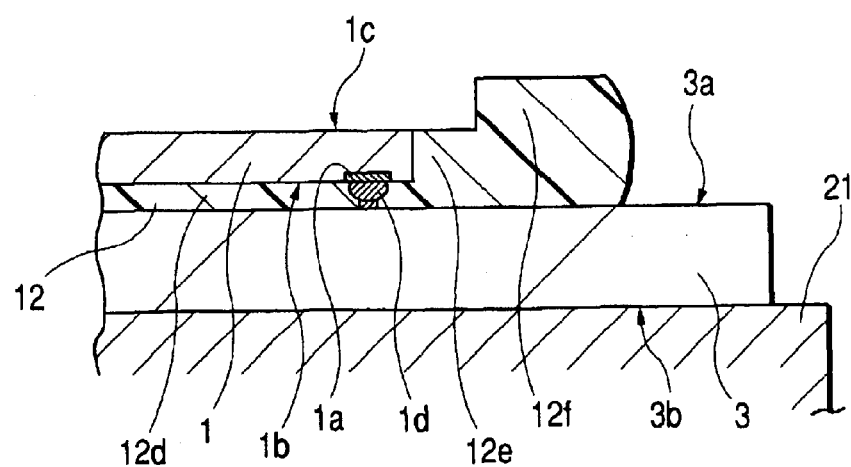
FIG. 40 is a diagram showing an enlarged partial cross section of a typical state of an adhesive after the thermal crimping in the thermal crimp process shown in FIG. 39.
Figure 41:
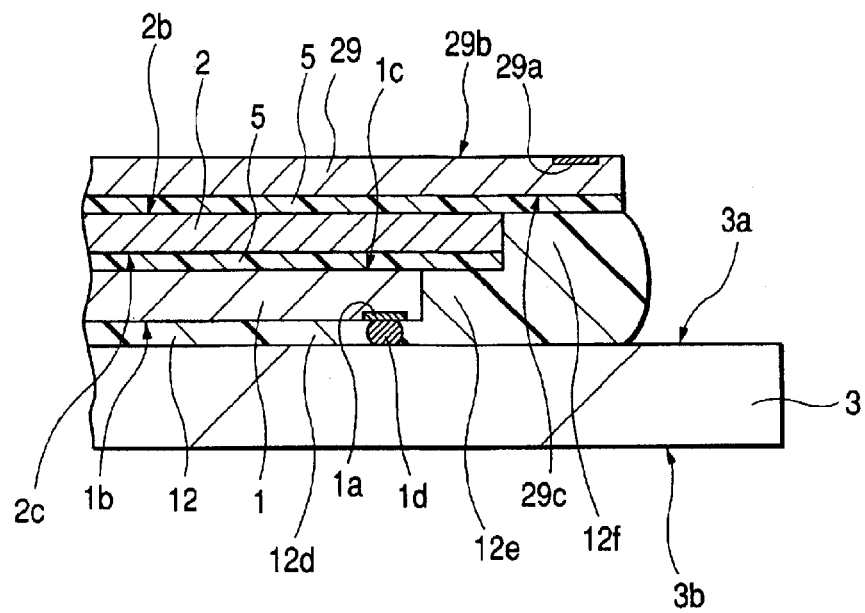
FIG. 41 is a diagram showing an enlarged partial cross section of a typical state, in which second and third semiconductor chips have been mounted, in a process to assemble the CSP shown in FIG. 35.
Figure 42:
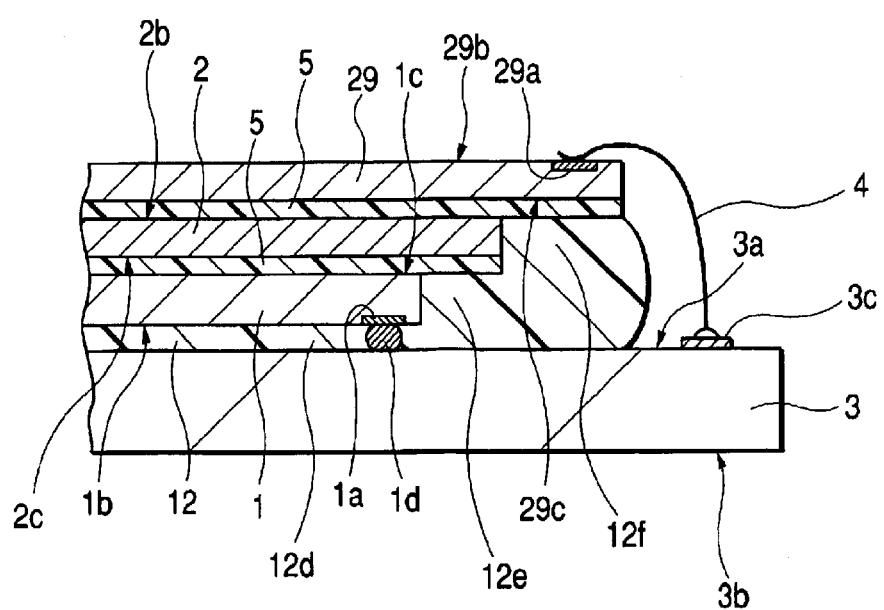
FIG. 42 is a diagram showing an enlarged partial cross section of a typical wire-bonding state in a process to assemble the CSP shown in FIG. 35.
Figure 43:
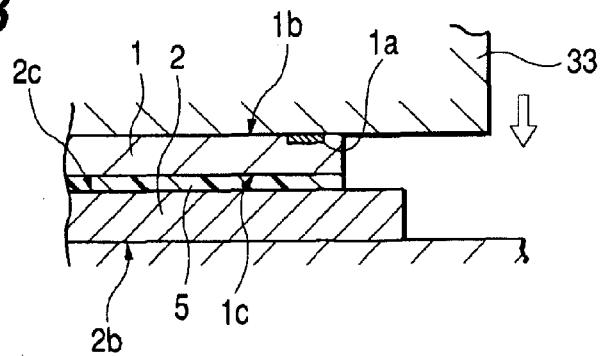
FIG. 43 is a diagram showing an enlarged partial cross section of a typical method of bonding the first semiconductor chip and the second semiconductor chip in a process to assemble a modified version of the CSP shown in FIG. 35.
Figure 44:
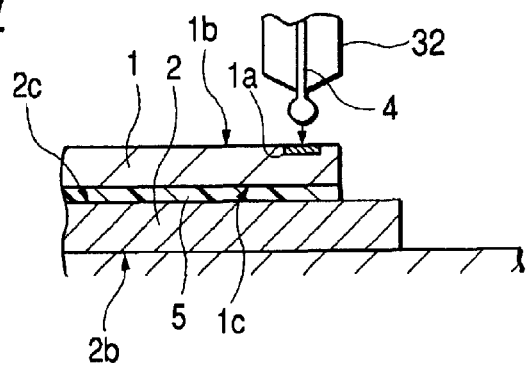
FIG. 44 is a diagram showing an enlarged partial cross section of a typical method to create a protruding electrode provided on the first semiconductor chip in a process to assemble a modified version of the CSP shown in FIG. 35.
Figure 45:
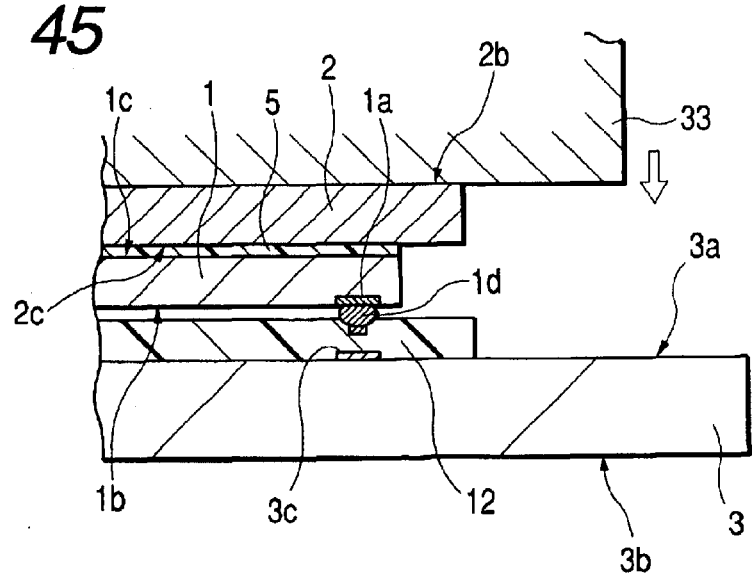
FIG. 45 is a diagram showing an enlarged partial cross section of a typical method to bond the first semiconductor chip to a wiring substrate in a process to assemble a modified version of the CSP shown in FIG. 35.
Figure 46:
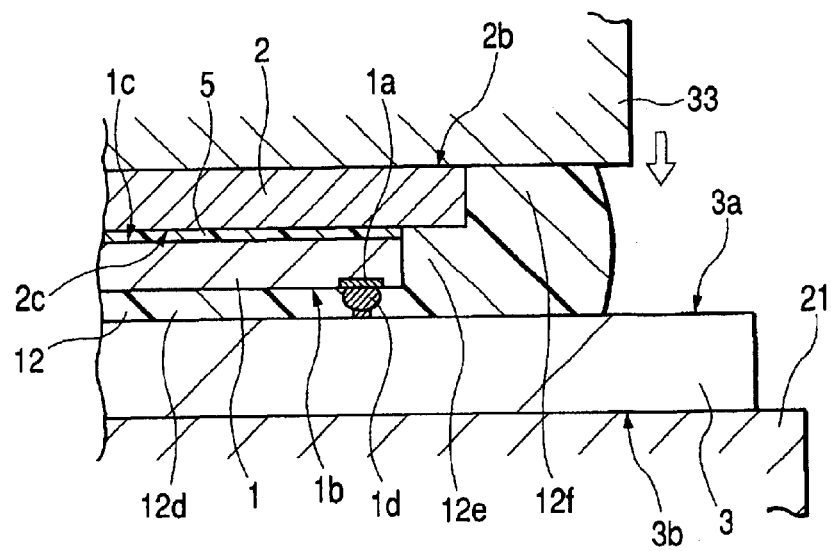
FIG. 46 is a diagram showing an enlarged partial cross section of a typical state, in which the first semiconductor chip and the second semiconductor chip have been thermally crimped, in a process to assemble a modified version of the CSP shown in FIG. 35.
Figure 47:
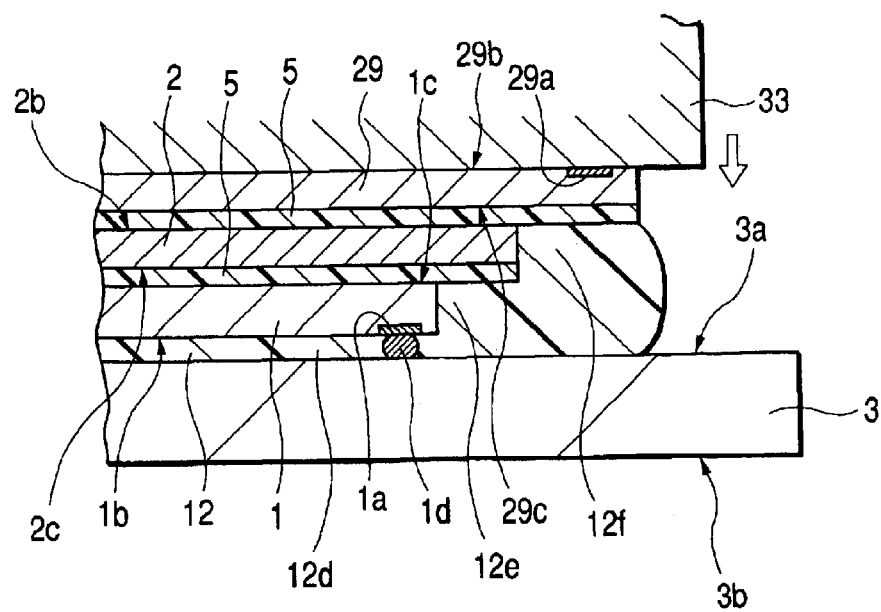
FIG. 47 is a diagram showing an enlarged partial cross section of a typical state, in which a third semiconductor chip has been thermally crimped, in a process to assemble a modified version of the CSP shown in FIG. 35.

FIG. 35 is a diagram showing a top view of a typical structure of the present invention's third embodiment implementing a semiconductor device or a CSP having a stack structure in a resin sealing body. FIG. 36 is a diagram showing an enlarged partial cross section along a J—J line shown in FIG. 35. FIG. 37 is a diagram showing a top view of a typical structure of a first semiconductor chip embedded in the CSP shown in FIG. 35. FIG. 38 is a diagram showing an enlarged partial cross section of a typical state, in which the first semiconductor chip has been mounted, in a process to assemble the CSP shown in FIG. 35. FIG. 39 is a diagram showing an enlarged partial cross section of a typical state, in which the first semiconductor chip has been thermally crimped, in a process to assemble the CSP shown in FIG. 35. FIG. 40 is a diagram showing an enlarged partial cross section of a typical state of an adhesive after the thermal crimping in the thermal crimp process shown in FIG. 39. FIG. 41 is a diagram showing an enlarged partial cross section of a typical state, in which second and third semiconductor chips have been mounted, in a process to assemble the CSP shown in FIG. 35. FIG. 42 is a diagram showing an enlarged partial cross section of a typical wire-bonding state in a process to assemble the CSP shown in FIG. 35, FIG. 43 is a diagram showing an enlarged partial cross section of a typical method of bonding the first semiconductor chip and the second semiconductor chip in a process to assemble a modified version of the CSP shown in FIG. 35. FIG. 44 is a diagram showing an enlarged partial cross section of a typical method to create a protruding electrode provided on the first semiconductor chip in a process to assemble a modified version of the CSP shown in FIG. 35. FIG. 45 is a diagram showing an enlarged partial cross section of a typical method to bond the first semiconductor chip to a wiring substrate in a process to assemble a modified version of the CSP shown in FIG. 35. FIG. 46 is a diagram showing an enlarged partial cross section of a typical state, in which the first semiconductor chip and the second semiconductor chip have been thermally crimped, in a process to assemble a modified version of the CSP shown in FIG. 35. FIG. 47 is a diagram showing an enlarged partial cross section of a typical state, in which a third semiconductor chip has been thermally crimped, in a process to assemble a modified version of the CSP shown in FIG. 35.

The semiconductor chip implemented by the third embodiment shown in FIG. 35 has a stack structure comprising 3 semiconductor chips stacked on a single-piece substrate (wiring substrate) 3. On a chip support surface (main surface) 3a of the single-piece substrate 3, a first semiconductor chip 1 is provided. On the first semiconductor chip 1, a second semiconductor chip 2 is stacked. On the second semiconductor chip 2, a third semiconductor chip 29 is stacked. The first semiconductor chip 1, the second semiconductor chip 2 and the third semiconductor chip 29 are sealed and held by resin in a resin mold process. The semiconductor device having a stack structure comprising 3 chip layers is referred to as a CSP denoted by reference numeral 30.

The structure of the CSP 30 is characterized in that, as shown in FIGS. 35 and 36, a plurality of pads 29a each serving as an electrode created on a main surface 29b of the third semiconductor chip 29 stacked as a semiconductor chip at a third stage are each located at a position external to edges of the first semiconductor chip 1 and the second semiconductor chip 2, and NCFs 12 each serving as an adhesive are provided on a back surface 2c of portions of the second semiconductor chip 2, which protrude from the first semiconductor chip 1, and a back surface 29c of portions of the third semiconductor chip 29, which protrude from the second semiconductor chip 2.

That is, the CSP 30 is a semiconductor device having a structure in which NCFs 12 are provided beneath pads 29a provided on the third semiconductor chip 29.

The NCFs 12 can thus be used to support areas on a back surface 29c of the third semiconductor chip 29, which are below the pads 29a provided on the third semiconductor chip 29. Therefore, the third semiconductor chip 29 can also be subjected to a wire-bonding process and, much like the second semiconductor chip 2, the pads 29a created on the third semiconductor chip 29 can each be connected to a wire 4.

The NCF 12 used as an adhesive comprises: a first-chip junction port ion 12d, which is a first portion created between the main surface 1b of the first semiconductor chip and the chip support surface 3a of the single-piece substrate 3; a protruding portion 12e, which is a second portion created between the back surface 2c of the second semiconductor chip 2 and the chip support surface 3a of the single-piece substrate 3; and a protruding portion 12f, which is a third portion created between the back surface 29c of the third semiconductor chip 29 and the chip support surface 3a of the single-piece substrate 3.

Thus, the protruding portion 12e of the NCF 12 is thicker than the first-chip junction portion 12d and the protruding portion 12f is thicker than the protruding portion 12e.

While the NCF 12 or an ACF is a desirable adhesive, a material other than the NCF 12 or the ACF can also be used.

In addition, the second semiconductor chip 2 and the third semiconductor chip 29 are bonded to the back surface 1c of the first semiconductor chip 1 and the main surface 2b of the second semiconductor chip 2 respectively by using the die-bond films 5.

The adhesive such as the NCF 12 or the die-bond film material 5 is a thermally hardening material including thermally hardening resin.

The semiconductor chips of the CSP 30 are the first semiconductor chip 1 serving as a microcomputer, the second semiconductor chip 2 serving as an SRAM (Static Random Access Memory) and the third semiconductor chip 29 serving as a flash memory. It is worth noting, however, that the functions of the semiconductor chips are not limited to a microcomputer, an SRAM and a flash memory. That is, the semiconductor chips may implement other functions.

Since the rest of the structure of the CSP 30 implemented by the third embodiment is the same as the CSP 9 implemented by the first embodiment, its explanation is not repeated.

Next, a method of fabricating the CSP 30 implemented by the third embodiment is explained as follows.

First, a single-piece substrate (a wiring substrate) 3 is prepared. The single-piece substrate 3 comprises a chip support surface 3a, a back surface 3b on a side opposite to the chip support surface 3a and a plurality of connection terminals (electrodes) 3c provided on the chip support surface 3a.

Then, a first semiconductor chip 1, a second semiconductor chip 2 and a third semiconductor chip 29 are prepared. To put it in detail, the first semiconductor chip 1 comprises a main surface 1b, a back surface 1c, a plurality of pads 1a and a plurality of semiconductor devices. The pads 1a and the semiconductor devices are created on the main surface 1b. Similarly, the second semiconductor chip 2 comprises a main surface 2b, back surface 2c, a plurality of pads 2a and a plurality of semiconductor devices. Likewise, the pads 2a and the semiconductor devices are created on the main surface 2b. In the same way, the third semiconductor chip 29 comprises a main surface 29b, a back surface 29c, a plurality of pads 29a and a plurality of semiconductor devices. Similarly, the pads 29a and the semiconductor devices are created on the main surface 29b.

In the above process, a metallic bump 1d is created on each of the ads 1a provided on the first semiconductor chip 1. Each metallic bump 1d is a protruding electrode.

As shown in FIG. 37, the first semiconductor chip 1 mounted on the CSP 30 is rectangular and the pads 1a are arranged on the circumferential portion of the main surface 1b to form a circumference pad array. Then, the first semiconductor chip 1 is mounted as shown in FIGS. 38 to 40.

First, as shown in FIG. 38, the first semiconductor chip 1 is provided on the single-piece substrate 3 in such a way that the main surface 1b of the first semiconductor chip 1 interfaces with the chip support surface 3a of the single-piece substrate 3 to make the pads 3a created on the first semiconductor chip 1 interface with their connection terminals 3c created on the single-piece substrate 3.

Then, a pressure is applied to the back surface 1c of the first semiconductor chip 1 to electrically connect the pads 1a created on the first semiconductor chip 1 to the respective connection terminals 3c provided on the single-piece substrate 3.

In the above process to electrically connect the pads 1a provided on the first semiconductor chip 1 to the respective connection terminals 3c created on the single-piece substrate 3, First, in a mounting area on the chip support surface 3a of the single-piece substrate 3, that is, in an area for mounting the first semiconductor chip 1, an NCF 12 serving as an adhesive is placed. The NCF 12 has been cut to a size slightly larger than the size of the first semiconductor chip 1. Then, the first semiconductor chip 1 is provided on the chip support surface 3a of the single-piece substrate 3 in such a way that the pads 1a provided on the first semiconductor chip 1 are positioned at locations interfacing with their respective connection terminals 3c created on the single-piece substrate 3. Finally, a load is applied to the back surface 1c of the first semiconductor chip 1.

Thus, the metallic bump 1d thrusts into the NCF 12, fixing the first semiconductor chip 1 on the single-piece substrate 3.

Afterward, the thermal crimp head 28 applies a pressure to the back surface 1c of the first semiconductor chip 1. The thermal crimp head 28 is thermal crimp fittings having a protrusion 28a at an edge thereof as shown in FIG. 39. The thermal crimp head 28 also generates heat along the applied pressure.

Accordingly, thermally hardening resin of the NCF 12 provided between the main surface 1b of the first semiconductor chip 1 and the chip support surface 3a of the single-piece substrate 3 hardens, fixing the first semiconductor chip 1 on the chip support surface 3a of the single-piece substrate 3 through the thermally hardening resin.

The protrusion 28a of the thermal crimp head 28 is formed to have about the same shape and about the same size as the second semiconductor chip 2 mounted on the first semiconductor chip 1. To put it concretely, the size of the protrusion 28a in the planar-surface directions is slightly lager than the size of the second semiconductor chip 2. The planar-surface directions mean directions perpendicular to a direction in which the load is applied. The protrusion height of the protrusion 28a is made slightly smaller than the thickness of the second semiconductor chip 2.

In addition, the NCF 12 has such a desired thickness that, when the first semiconductor chip 1 is heated and pressed by a pressure, the NCF 12 juts out to a periphery on the outer side of the first semiconductor chip 1 due to the pressure, and protruding portions 12e and 12f are generated from the NCF 12.

Thus, when the thermal crimp head 28 applies a pressure to the back surface 1c of the first semiconductor chip 1, the NCF 12 juts out to the external periphery of the first semiconductor chip 1, creating the protruding portion (second portion) 12e and the protruding portion (third portion) 12f, which each have a shape determined by the protrusion 28a of the thermal crimp head 28.

As a result, the NCF 12 now includes a first-chip junction portion 12d, the protruding portion 12e thicker than the first-chip junction portion 12d and the protruding portion 12f thicker than the protruding portion 12e as shown in FIG. 40.

Since the height of the protrusion 28a of the thermal crimp head 2 is made slightly smaller than the thickness of the second semiconductor chip 2, the difference in thickness between the protruding portion 12e and the protruding portion 12f is smaller than the thickness of the second semiconductor chip 2.

In addition, in the thermal crimp process, the single-piece substrate 3 is mounted on the die-bond stage 21, which has been heated to a temperature of approximately 70 degrees Celsius, and a pressure is applied to the back surface 1c of the first semiconductor chip 1 by the thermal crimp head 28, which has been heated to a temperature of about 300 degrees Celsius.

As a result, the temperature of the NCF 12 increases, causing the NCF 12 to fuse and then harden. Thus, the metallic bump 1d provided on the pad 1a created on the first semiconductor chip 1 is coming in contact with the connection terminal 3c created on the single-piece substrate 3 and electrically connected to the connection terminal 3c.

Then, the second semiconductor chip 2 and the third semiconductor chip 29 are mounted as shown in FIG. 41.

The second semiconductor chip 2 and the third semiconductor chip 29 are both bonded in advance. To put in detail, the die-bond film material 5 stuck to the back surface 29c of the third semiconductor chip 29 is used for bonding the main surface 2b of the second, semiconductor chip 2 to the back surface 29c of the third semiconductor chip 29.

Subsequently, the second semiconductor chip 2 is bonded to the first semiconductor chip 1 in such a way that a plurality of pads 29a provided on the third semiconductor chip 29 are placed at positions on the outer side of the second semiconductor chip 2. A similar die-bond film is stuck also to the back surface 2c of the second semiconductor chip 2.

As described above, with the second semiconductor chip 2 and the third semiconductor chip 29 bonded to each other, the second semiconductor chip 2 and the third semiconductor chip 29 are placed on the first semiconductor chip 1 in such a way that the back surface 2c of the second semiconductor chip 2 interfaces with the back surface 1c of the first semiconductor chip 1.

As a result, a plurality of pads 29a provided on the third semiconductor chip 29 are positioned at locations on the outer side of the first semiconductor chip 1 and also on the outer side of the second semiconductor chip 2.

Thereafter, heat is radiated and a pressure is applied downward to the main surface 29b of the third semiconductor chip 29 to thermally crimp the second semiconductor chip 2 and the third semiconductor chip 29.

In this thermal crimp process, the second semiconductor chip 2 and the third semiconductor chip 29 are thermally crimped by using the die-bond films 5 stuck to the back surface 2c of the second semiconductor chip 2 and the back surface 29c of the third semiconductor chip 29 as adhesives.

Since the difference in thickness between the protruding portion 12f and the protruding portion 12e of the NCF 12 is slightly smaller than the thickness of the second semiconductor chip 2, a portion of the NCF 12, that is, the protruding portion 12f, is provided in such a space that a gap between the back surface 29c of the third semiconductor chip 29 and the protruding portion 12f is smaller than the thickness of the third semiconductor chip 29. The gap exits between the chip support surface 3a of the single-piece substrate 3 and a plurality of pads 29a on the third semiconductor chip 29, which are positioned at locations on the outer side of the first semiconductor chip 1.

That is, the gap between the back surface 29c of the third semiconductor chip 29 and the protruding portion 12f of the NCF 12 is slightly smaller than the thickness of the third semiconductor chip 29.

As the process to mount the second semiconductor chip 2 and the third semiconductor chip 29 is completed, a plurality of pads 29a provided on the third semiconductor chip 29 are positioned at locations on the outer side of the first semiconductor chip 1 and also on the outer side of the second semiconductor chip 2.

Then, a wire-bonding process is carried out.

To put it in detail, as shown in FIG. 42, a plurality of pads 2a provided on the second semiconductor chip 2 and a plurality of pads 29a provided on the third semiconductor chip 29 are electrically connected by metallic wires 4 to their respective connection terminals 3c provided on the single-piece substrate 3 in a wire-bonding process.

First, this wire-bonding process is started from the second semiconductor chip 2. In the wire-bonding process of the second semiconductor chip 2, for the pads 2a of the second semiconductor chip 2, which are located on the outer side of the first semiconductor chip 1, the protruding portion 12e of the NCF 12 provided on the back surface 2c serves as a bearer of a wire-bonding load so that the second semiconductor chip 2 can be prevented from being cracked during the wire-bonding process.

As the wire-bonding process of the second semiconductor chip 2 is finished, a wire-bonding process of the third semiconductor chip 29 is carried out. By the same token, in the wire-bonding process of the third semiconductor chip 29, for the pads 29a provided on the third semiconductor chip 29, which are located on the outer side of the first semiconductor chip 1, the protruding portion 12f of the NCF 12 provided on the back surface 29c serves as a bearer of a wire-bonding load so that the third semiconductor chip 29 can be prevented from being cracked during the wire-bonding process.

The gap between the back surface 29c of the third semiconductor chip 29 and the protruding portion 12f of the NCF 12 is slightly smaller than the thickness of the third semiconductor chip 29 so that the protruding portion 12f of the NCF 12 provided on the back surface 29c serves as a bearer of a wire-bonding load. Thus, the third semiconductor chip 29 can be prevented from being cracked during the wire-bonding process.

Afterwards, the first semiconductor chip 1, the second semiconductor chip 2, the third semiconductor chip 29 and a plurality of wires 4 are sealed and held by resin. To put it in detail, on the chip support surface 3a of the single-piece substrate 3, the first semiconductor chip 1, the second semiconductor chip 2, the third semiconductor chip 29 and a plurality of wires 4 are sealed and held by adoption a transfer-molding technique using resin to form a resin sealing body 6.

When a load such as a mold-clamp pressure is applied to the third semiconductor chip 29 in a resin molding process, the protruding portion 12f of the NCF 12 also serves as a bearer of a wire-bonding load so that the third semiconductor chip 29 can be prevented from being cracked during the wire-bonding process.

Thereafter, as shown in FIG. 36, a plurality of solder balls 11 are mounted on the back surface 3b of the single-piece substrate 3. A solder ball 11 is a protruding electrode electrically connected to a connection terminal 3c provided on the single-piece substrate 3.

To put it in detail, the solder ball 11 is mounted on a bump land 3d exposed to the back surface 3b of the single-piece substrate 3 in a reflow process or the like to form an external electrode of the CSP 30. A layout of bump lands is shown in FIG. 14.

The following description explains a modified version of the method to fabricate the CSP 30 implemented by the third embodiment.

First, as shown in FIG. 43, the first semiconductor chip 1 and the second semiconductor chip 2 are bonded to each other. In this case, the first semiconductor chip 1 and the second semiconductor chip 2 are bonded to each other in such a way that the back surface 1c of the first semiconductor chip 1 interfaces with the back surface 2c of the second semiconductor chip 2. In this bonding process, the die-bond film material 5 has been stuck to the back surface 1c of the first semiconductor chip 1. The first semiconductor chip 1 and the second semiconductor chip 2 are then bonded to each other through the die-bond film material 5 in a thermal crimp process using thermal crimp head 33 as fittings for thermally crimping the first semiconductor chip 1 and the second semiconductor chip 2.

Then, as shown in FIG. 44, metallic bumps 1d shown in FIG. 45 are formed on pads 1a provided on the first semiconductor chip 1. A metallic bump 1d serves as a protruding electrode. A metallic bump 1d is formed on a pad 1a provided on the first semiconductor chip 1 by adoption of a wire-bonding technology using a metallic wire. To put it in detail, a wire 4 is guided by using a capillary 32 and a metallic bump 1d is formed on a pad 1a provided on the first semiconductor chip 1 in the same way as the wire-bonding technique.

After that, an NCF 12 cut to a size slightly larger than the first semiconductor chip 1 is provided on a mounting area for the first semiconductor chip 1. The mounting area is provided on the chip support surface 3a of the single-piece substrate 3. Then, the first semiconductor chip 1 and the second semiconductor chip 2 are provided on the chip support surface 3a of the single-piece substrate 3 in such a way that the pads 1a provided the first semiconductor chip 1 are positioned at locations interfacing with their respective connection terminals 3c provided on the single-piece substrate 3.

That is, the first semiconductor chip 1 and the second semiconductor chip 2, which have been bonded to each other, are provided on the chip support surface 3a of the single-piece substrate 3 in such a way that the main surface 1b of the first semiconductor chip 1 interfaces with the chip support surface 3a of the single-piece substrate 3.

Then, the thermal crimp process is carried out by using the thermal crimp head 33 in order to electrically connect a plurality of metallic bumps 1d provided on the first semiconductor chip 1 to the same plurality of respective connection terminals 3c provided on the single-piece substrate 3 and to bond the main surface 1b of the first semiconductor chip 1 to the chip support surface 3a of the single-piece substrate 3 through the NCF 12.

In the thermal crimp process, a load and heat generated by the thermal crimp head 33 are respectively applied and radiated in a direction from the main surface 2b of the second semiconductor chip 2 through the second semiconductor chip 2 as shown in FIG. 45.

Accordingly, the thermally hardening resin of the NCF 12 provided between the main surface 1b of the first semiconductor chip 1 and the chip support surface 3a of the single-piece substrate 3 hardens, fixing the first semiconductor chip 1 on the chip support surface 3a of the single-piece substrate 3 through the thermally hardening resin. In addition, the metallic bump 1d formed at a pad 1a provided on the first semiconductor chip 1 and a connection terminal 3c provided on the single-piece substrate 3 are fused together and electrically connected to each other.

The NCF 12 has such a desired thickness that, when the first semiconductor chip 1 is heated and pressed by a pressure, the NCF 12 juts out to a periphery on the outer side of the first semiconductor chip 1 due to the pressure, and protruding portions 12e and 12f are generated from the NCF 12.

Thus, as shown in FIG. 46, when the thermal crimp head 33 applies a pressure to the first semiconductor chip 1 through the second semiconductor chip 2, the NCF 12 juts out to the external periphery of the first semiconductor chip 1, creating the protruding portion (second portion) 12e on the back surface 2c of the second semiconductor chip 2 and the just portion (third portion) 12f on the periphery of the protruding portion 12e. The back surface 2c on which the protruding portion 12e is created protrudes from the first semiconductor chip 1.

At that time, a force-applying surface of the thermal crimp head 33 forms the protruding portion 12f with a height about equal to or slightly smaller than the height of the main surface 2b of the second semiconductor chip 2.

Then, the third semiconductor chip 29 is bonded to the main surface 2b of the second semiconductor chip 2 in such a way that the back surface 29c of the third semiconductor chip 29 interfaces with the main surface 2b of the second semiconductor chip 2.

At that time, the third semiconductor chip 29 is put on the second semiconductor chip 2 in such a way that a plurality of pads 29a provided on the third semiconductor chip 29 are located at locations on the outer side of the first semiconductor chip 1 and the second semiconductor chip 2.

To put it in detail, the pads 29a provided on the third semiconductor chip 29 are located at locations on the outer side of the first semiconductor chip 1 and the second semiconductor chip 2 and the third semiconductor chip 29 is placed on the main surface 2b of the second semiconductor chip 2 in such a way that the back surface 29c of the third semiconductor chip 29 interfaces with the main surface 2b of the second semiconductor chip 2. To the back surface 29c, the die-bond film material 5 has been stuck in advance. Thereafter, as shown in FIG. 47, the thermal crimp head 33 above the third semiconductor chip 29 applies a pressure and radiates heat to the main surface 29b of the third semiconductor chip 29.

As a result, the second semiconductor chip 2 is bonded to the back surface 1c of the first semiconductor chip 1 through the die-bond film material 5, which includes thermally hardening resin. In addition, the third semiconductor chip 29 is bonded to the main surface 2b of the second semiconductor chip 2 through the die-bond film material 5, which includes thermally hardening resin. In this state, a plurality of pads 29a provided on the third semiconductor chip 29 are located at positions on the outer side of the first semiconductor chip 1 and the second semiconductor chip 2.

Then, a wire-bonding process is carried out by adoption of the same wire-bonding technique shown in FIG. 42.

In the wire-bonding process, for the pads 2a of the second semiconductor chip 2, which are located at positions on the outer side of the first semiconductor chip 1, the protruding portion 12e jutting out from the NCF 12 located on the back surface 2c of the second semiconductor chip 2 serves as a bearer of a wire-bonding load. Thus, the second semiconductor chip 2 can be prevented from being cracked during the wire-binding process.

Furthermore, for the pads 29a of the third semiconductor chip 29, which are located at positions on the outer side of the second semiconductor chip 2, the protruding portion 12e jutting out from the NCF 12 located on the back surface 29c of the third semiconductor chip 29 serves as a bearer of a wire-bonding load. Thus, the second semiconductor chip 2 can be prevented from being cracked during the wire-binding process.

In addition, in the case of the above modified version of the fabrication method, the edge (or the pressure-applying surface) of the thermal crimp head 33 can be made planar and the shape of the pressure-applying surface can thus be made simple in comparison with the typical the thermal crimp head 28 employed in the third embodiment.

The processes and the methods, which are implemented after the wire-bonding process, as well as their results are the same as those of the third embodiment so that their explanations are not repeated.

Fourth Embodiment

Figure 48:
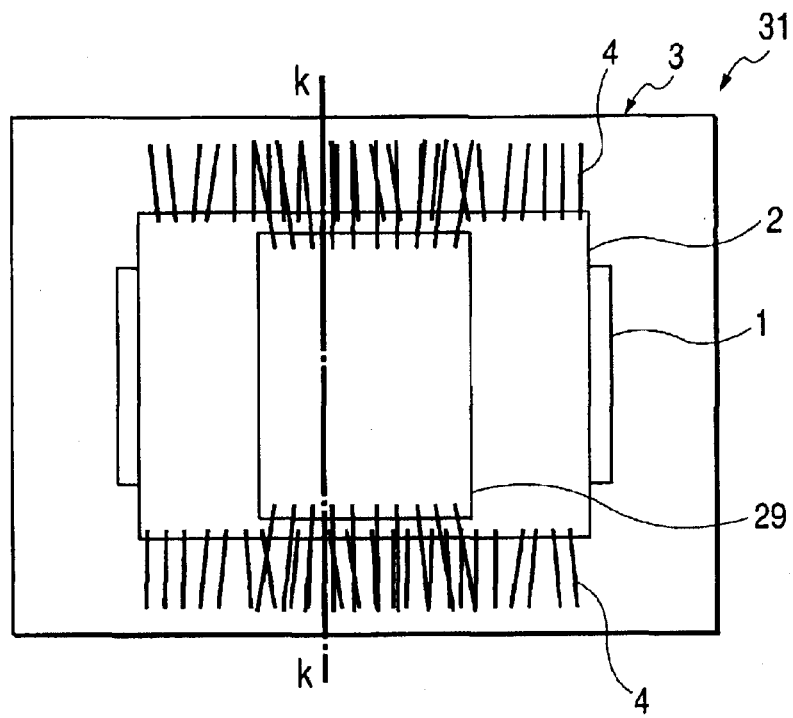
FIG. 48 is a diagram showing a top view of a typical structure of the present invention's fourth embodiment implementing a semiconductor device or a CSP having a stack structure in a resin sealing body.
Figure 49:
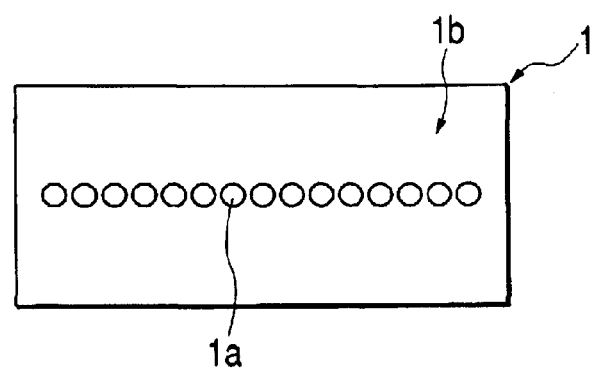
FIG. 49 is a diagram showing a top view of a typical structure of a first semiconductor chip embedded in the CSP shown in FIG. 48.
Figure 50:
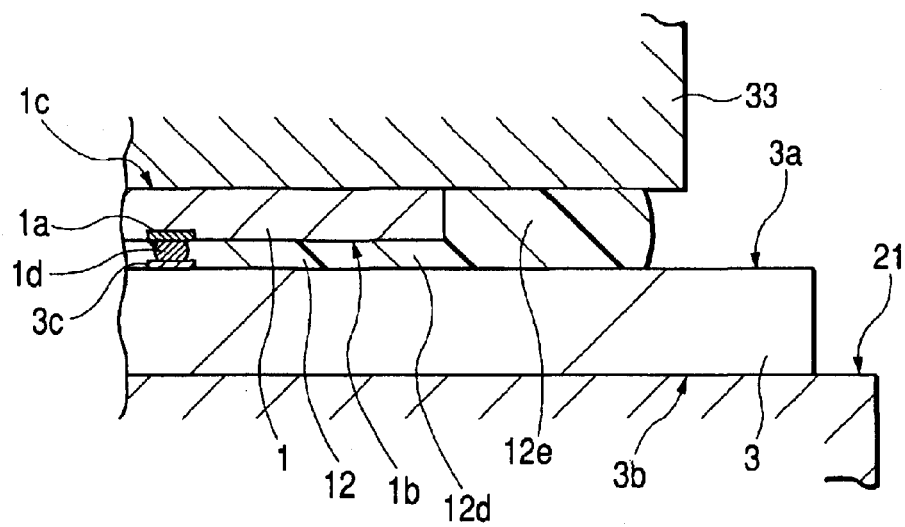
FIG. 50 is a diagram showing an enlarged partial cross section of a typical state, in which the first semiconductor chip has been mounted in a process to assemble the CSP, along a K—K line shown in FIG. 48.
Figure 51:
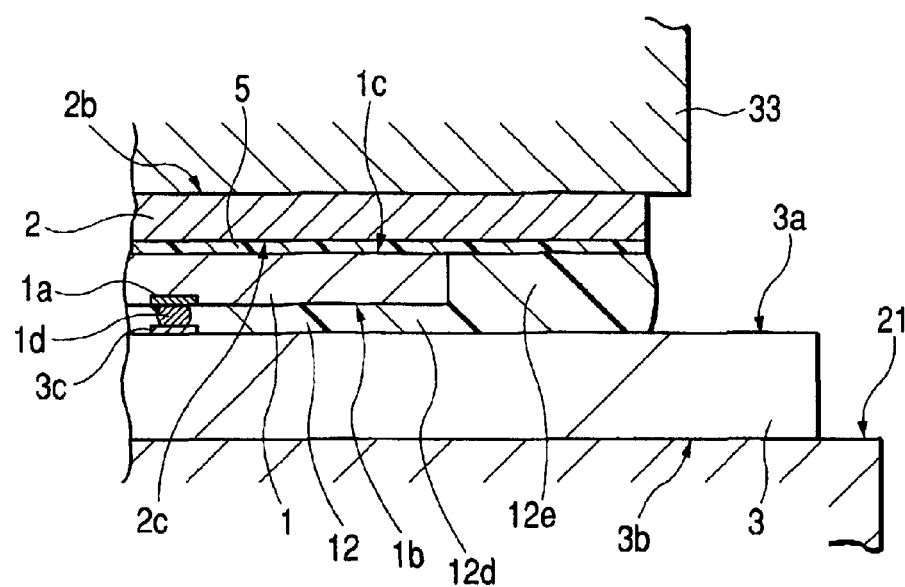
FIG. 51 is a diagram showing an enlarged partial cross section of a typical state, in which a second semiconductor chip has been mounted in a process to assemble the CSP shown in FIG. 48.
Figure 52:
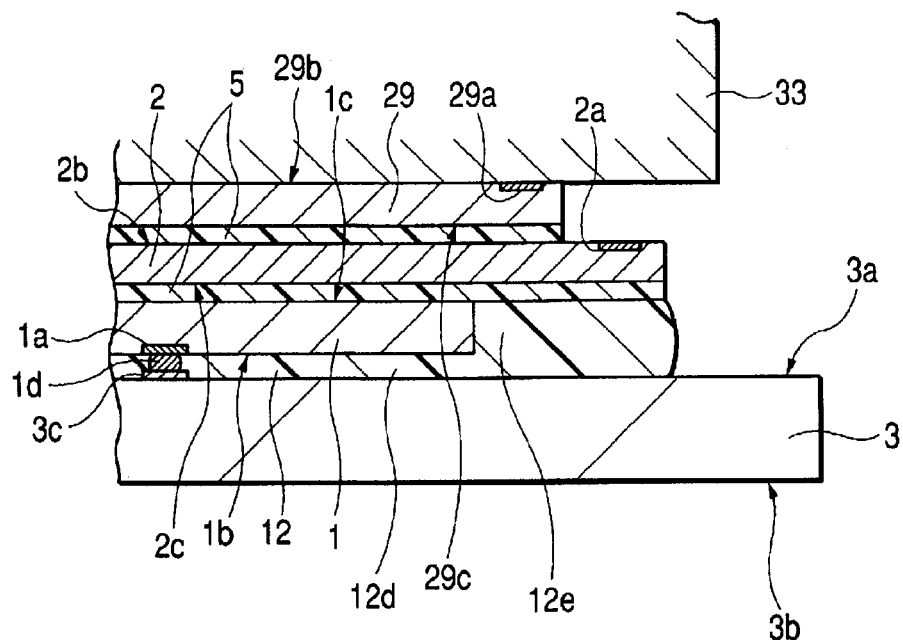
FIG. 52 is a diagram showing an enlarged partial cross section of a typical state, in which a third semiconductor chip has been mounted in a process to assemble the CSP shown in FIG. 48.
Figure 53:
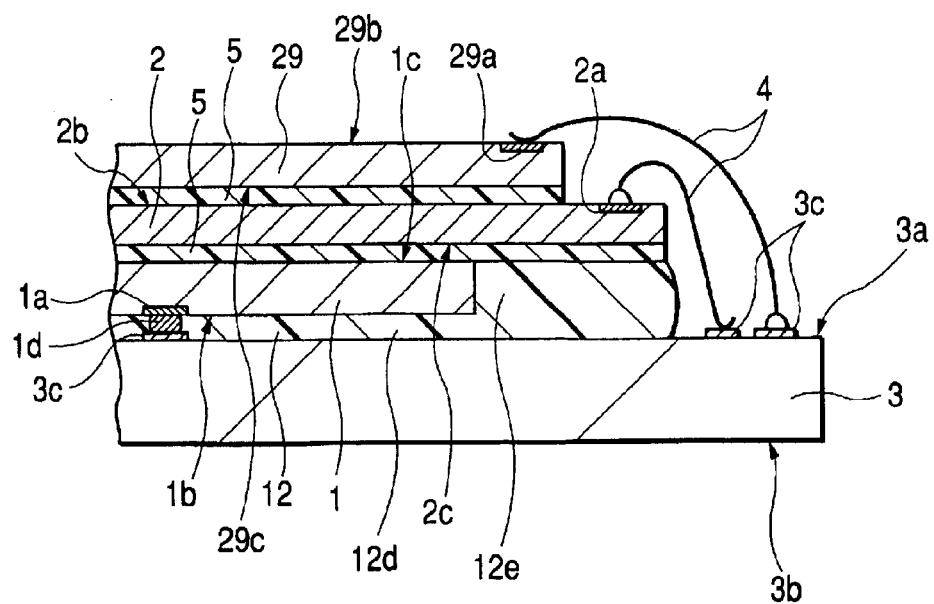
FIG. 53 is a diagram showing an enlarged partial cross section of a typical wire-bonding state in a process to assemble the CSP shown in FIG. 48.
Figure 54:
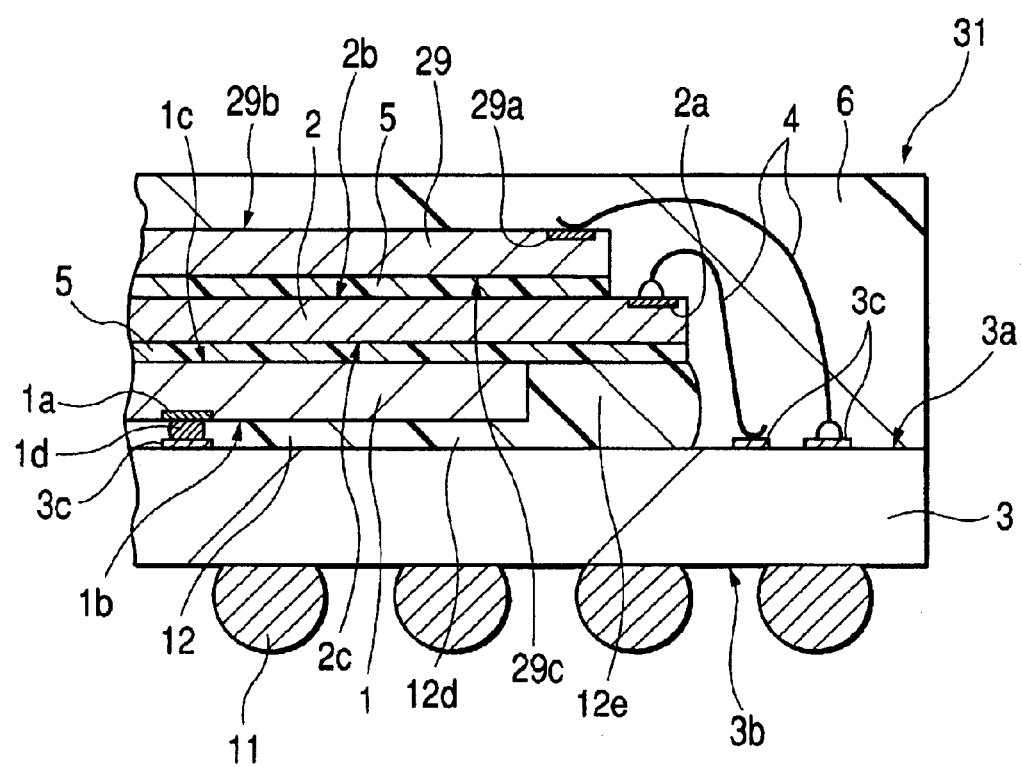
FIG. 54 is a diagram showing an enlarged partial cross section of the CSP along the K—K line shown in FIG. 48.

FIG. 48 is a diagram showing a top view of a typical structure of the present invention's fourth embodiment implementing a semiconductor device or a CSP having a stack structure in a resin sealing body. FIG. 49 is a diagram showing a top view of a typical structure of a first semiconductor chip embedded in the CSP shown in FIG. 48. FIG. 50 is a diagram showing an enlarged partial cross section of a typical state, in which the first semiconductor chip has been mounted in a process to assemble the CSP, along a K—K line shown in FIG. 48. FIG. 51 is a diagram showing an enlarged partial cross section of a typical state, in which a second semiconductor chip has been mounted in a process to assemble the CSP shown in FIG. 48. FIG. 52 is a diagram showing an enlarged partial cross section of a typical state, in which a third semiconductor chip has been mounted in a process to assemble the CSP shown in FIG. 48. FIG. 53 is a diagram showing an enlarged partial cross section of a typical wire-bonding state in a process to assemble the CSP shown in FIG. 48. FIG. 54 is a diagram showing an enlarged partial cross section of the CSP along the K—K line shown in FIG. 48.

Much like the CSP 30 implemented by the third embodiment, the semiconductor device implemented by the fourth embodiment is a CSP 31 having a stack structure in which 3 semiconductor chips are stacked as layers on a single-piece substrate 3. The CSP 31 implemented by the fourth embodiment is different from the CSP 30 implemented by the third embodiment, however, in that a plurality of pads 29*a* provided on the third semiconductor chip 29 stacked as a third layer are located at positions on an inner side relative to the circumference of the second semiconductor chip 2 stacked as a second layer but on an outer side relative to the circumference of the first semiconductor chip 1 stacked as a first layer.

Thus, the NCF 12 serving as an adhesive comprises a first-chip junction portion 12*d* and a protruding portion 12*e*. The first-chip junction portion 12*d* is a NCF first portion created between the main surface 1*b* of the first semiconductor chip 1 and the chip support surface 3*a* of the single-piece substrate 3. On the other hand, the protruding portion 12*e* is an NCF second portion created between the back surface 2*c* of the second semiconductor chip 2 and the chip support surface 3*a* of the single-piece substrate 3. Since the pads 29*a* provided on the third semiconductor chip 29 are placed on the second semiconductor chip 2, the protruding portion 12*e* of the NCF 12 is placed on the pads 29*a* provided on the side of the back surface 2*c* of the second semiconductor chip 2 and on the pads 29*a* provided on the side of the back surface 29*c* of the third semiconductor chip 29.

Accordingly, the protruding portion 12*e* of the NCF 12 on the CSP 31 supports an area in which a plurality of pads 2*a* created on the second semiconductor chip 2 are located and also supports an area, in which the a plurality of pads 29*a* created on the third semiconductor chip 29 are located, through the second semiconductor chip 2.

In addition, as shown in FIG. 49, the first semiconductor chip 1 mounted on the CSP 31 is rectangular and a plurality of pads 1*a* created on the first semiconductor chip 1 are arranged in a longitudinal direction along a line at about the transversal-direction center of the main surface 1*b* of the first semiconductor chip 1. The pads 1*a* form the so-called center pad array.

The semiconductor chips of the CSP 30 are the first semiconductor chip 1 serving as a DRAM (Dynamic Random Access Memory), the second semiconductor chip 2 serving as an SRAM (Static Random Access Memory) and the third semiconductor chip 29 serving as a flash memory. It is worth noting, however, that the functions of the semiconductor chips are not limited to a DRAM, an SRAM and a flash memory. That is, the semiconductor chips may implement other functions.

The rest of the structure of the CSP 31 implemented by the fourth embodiment is the same as the CSP 30 implemented by the third embodiment. Thus, it is not necessary to repeat the explanation of the rest.

Next, method of fabricating the CSP 31 implemented by the fourth embodiment is explained as follows.

First, much like the third embodiment, the single-piece substrate 3 having a plurality of connection terminals 3*c*, the first semiconductor chip 1, the second semiconductor chip 2 and the third semiconductor chip 29 are prepared.

The first semiconductor chip 1 includes a center pad array like the one shown in FIG. 49. On each of the pads 1*a*, a metallic bump 1*d* is created in the same way as the third embodiment. The metallic bump 1*d* is a protruding electrode.

Then, the first semiconductor chip 1 is mounted as shown in FIG. 50.

First, the first semiconductor chip 1 is provided on the single-piece substrate 3 in such a way that the main surface 1*b* of the first semiconductor chip 1 interfaces with the chip support surface 3*a* of the single-piece substrate 3 to make the pads 1*a* provided on the first semiconductor chip 1 interface with their respective connection terminals 3*c* provided on the single-piece substrate 3.

Then, a pressure is applied to the back surface 1*c* of the first semiconductor chip 1 to electrically connect a plurality of pads 1*a* provided on the first semiconductor chip 1 to the same plurality of respective connection terminals 3*c* provided on the single-piece substrate 3.

In the above process, First, in a mounting area on the chip support surface 3*a* of the single-piece substrate 3, that is, in an area for mounting the first semiconductor chip 1, an NCF 12 is placed. The NCF 12 has been cut to a size slightly larger than the size of the first semiconductor chip 1. Then, the first semiconductor chip 1 is provided on the chip support surface 3*a* of the single-piece substrate 3 in such a way that the pads 1*a* provided on the first semiconductor chip 1 are positioned at locations interfacing with their respective connection terminals 3*c* provided on the single-piece substrate 3. Finally, a load is applied to the back surface 1*c* of the first semiconductor chip 1.

Thus, the metallic bump 1*d* thrusts into the NCF 12, tentatively fixing the first semiconductor chip 1 on the single-piece substrate 3.

Later on, the thermal crimp head 33 with a planar pressure-applying surface applies a pressure and, at the same time, radiates heat to the back surface 1*c* of the first semiconductor chip 1.

Thus, the thermally hardening resin of the NCF 12 provided between the main surface 1*b* of the first semiconductor chip 1 and the chip support surface 3*a* of the single-piece substrate 3 hardens, fixing the first semiconductor chip 1 on the chip support surface 3*a* of the single-piece substrate 3 through the thermally hardening resin. As a result, the metallic bump 1*d* formed at a pad 1*a* provided on the first semiconductor chip 1 and a connection terminal 3*c* provided on the single-piece substrate 3 are fused together and electrically connected to each other.

When a pressure is applied and heat is radiated to the first semiconductor chip 1, the NCF 12 juts out to a periphery on the outer side of the first semiconductor chip 1 but, since the pressure-applying surface of the thermal crimp head 33 serves as a cover, the protruding portion 12*e* is formed. Accordingly, the protruding portion 12*e* is created to have a height about equal to or slightly smaller than the back surface 1*c* of the first semiconductor chip 1.

Then, the second semiconductor chip 2 is mounted as shown in FIG. 51.

The second semiconductor chip 2 is mounted on the back surface 1c of the first semiconductor chip 1 in such a way that the back surface 2c of the second semiconductor chip 2 interfaces with the back surface 1c of the first semiconductor chip 1. In this mounting process, the second semiconductor chip 2 is mounted on the back surface 1c of the first semiconductor chip 1 in such a way that a plurality of pads 2a provided on the second semiconductor chip 2 are located at positions on the outer side of the first semiconductor chip 1 as shown in FIG. 48.

To put it in detail, the second semiconductor chip 2 is mounted on the back surface 1c of the first semiconductor chip 1 in such a way that the pads 2a provided on the second semiconductor chip 2 are located at positions on the outer side of the first semiconductor chip 1 and on the protruding portion 12e of the NCF 12 and, at the same time, the back surface 2c of the second semiconductor chip 2 interfaces with the back surface 1c of the first semiconductor chip 1. The die-bond film material 5 has been stuck to the back surface 2c of the second semiconductor chip 2 in advance. Then, the thermal crimp head 33 applies a pressure and radiates heat in a downward direction to the main surface 2b of the second semiconductor chip 2 in order to bond the second semiconductor chip 2 to the first semiconductor chip 1.

Thus, the second semiconductor chip 2 is bonded to the back surface 1c of the first semiconductor chip 1 through the die-bond film material 5 including thermally hardening resin. At that time, the pads 2a provided on the second semiconductor chip 2 are located at positions on the outer side of the first semiconductor chip 1.

Later on, the third semiconductor chip 29 is mounted as shown in FIG. 52.

In this mounting process, the third semiconductor chip 29 is mounted on the main surface 2b of the second semiconductor chip 2 in such a way that the back surface 29c of the third semiconductor chip 29 interfaces with the main surface 2b of the second semiconductor chip 2. To put it in detail, the third semiconductor chip 29 is mounted on the main surface 2b of the second semiconductor chip 2 in such a way that a plurality of pads 29a provided on the third semiconductor chip 29 are placed on an inner side relative to an area, in which the pads 2a provided on the second semiconductor chip 2 are located, but at locations on the outer side of the first semiconductor chip 1.

Then, the thermal crimp head 33 applies a pressure and radiates heat in a downward direction to the main surface 29b of the third semiconductor chip 29 in order to bond the third semiconductor chip 29 to the second semiconductor chip 2. Thus, the second semiconductor chip 2 is bonded to the back surface 1c of the first semiconductor chip 1 through the die-bond film material 5 including thermally hardening resin. At that time, the pads 29a provided on the third semiconductor chip 29 are placed on an inner side relative to an area, in which the pads 2a provided on the second semiconductor chip 2 are located, but at locations on the outer side of the first semiconductor chip 1.

Accordingly, an area of the second semiconductor chip 2, which protrudes out from the first semiconductor chip 1, is supported by the protruding portion 12e of the NCF 12 and an area, in which the pads 29a provided on the third semiconductor chip 29 are located, is also supported by the protruding portion 12e through the second semiconductor chip 2.

Afterwards, a wire-bonding process is carried out as shown in FIG. 53.

In this wire-bonding process, the pads 2a provided on the second semiconductor chip 2 and the pads 29a provided on the third semiconductor chip 29 are electrically connected to a plurality of respective connection terminals 3c provided on the single-piece substrate 3. This wire-bonding process is started from the second semiconductor chip 2.

A portion of the NCF 12, that is, the protruding portion 12e, is formed in such a way that a gap between an area on the back surface 2c of the second semiconductor chip 2 and the protruding portion 12e is smaller than the thickness of the second semiconductor chip 2. The area on the back surface 2c is an area in which the pads 2a provided on the second semiconductor chip 2 are located on the outer side of the first semiconductor chip 1.

Thus, in the wire-bonding process of the second semiconductor chip 2, for each of the pads 2a provided on the second semiconductor chip 2, which are located at positions on the outer side of the first semiconductor chip 1, the protruding portion 12e jutting out from the NCF 12 to the back surface 2c of the second semiconductor chip 2 serves as a bearer of a wire-bonding load. Accordingly, the second semiconductor chip 2 can be prevented from being cracked during the wire-binding process.

After the wire-bonding process of the second semiconductor chip 2 is finished, a wire-bonding process of the third semiconductor chip 29 is carried out. In the wire-bonding process of the third semiconductor chip 29, the second semiconductor chip 2 and the protruding portion 12e of the NCF 12 located on the outer side of the back surface 2c of the second semiconductor chip 2 serve as bearers of a wire-bonding load. Thus, the third semiconductor chip 29 can be prevented from being cracked during the wire-binding process.

Thereafter, the first semiconductor chip 1, the second semiconductor chip 2, the third semiconductor chip 29 and a plurality of wires 4 are sealed and held by adoption a transfer-molding technique using resin to form a resin sealing body 6 like one shown in FIG. 54.

When a load such as a mold-clamp pressure is applied to the third semiconductor chip 29 in a resin molding process, the protruding portion 12e of the NCF 12 also serves as a bearer of a wire-bonding load so that the third semiconductor chip 29 can be prevented from being cracked during the wire-bonding process.

Thereafter, as shown in FIG. 36, a plurality of solder balls 11 are mounted on the back surface 3b of the single-piece substrate 3. A solder ball 11 is a protruding electrode electrically connected to a connection terminal 3c provided on the single-piece substrate 3.

To put it in detail, the solder ball 11 is mounted on a bump land 3d exposed to the back surface 3b of the single-piece substrate 3 in a reflow process or the like to form an external electrode of the CSP 31. A layout of bump lands is shown in FIG. 14.

Also in the case of the fabrication method implemented by the fourth embodiment, the edge (or the pressure-applying surface) of the thermal crimp head 33 can be made planar and the shape of the pressure-applying surface can thus be made simple in comparison with the typical thermal crimp head 28 employed in the third embodiment.

So far, the invention discovered by the inventor has been explained in concrete terms by exemplifying preferred embodiments. However, the scope of the invention is not limited to the embodiments. That is, it is needless to say a variety of changes can be made to the embodiments as far as the changes fall within a range not deviating from the true spirit of the present invention.

In the case of the first embodiment, in order to assure reliability of the connection between a metallic bump 1d and a connection terminal 3c, a plurality of first semiconductor chips 1 are individually subjected to the thermal crimp process so that it is feared that the work efficiency deteriorates. As a technique to improve the work efficiency of the thermal crimp process, during the thermal crimp process, the temperature of a heat-treatment process carried out on a first adhesive such as the NCF 12 is set at a value higher than the temperature of a heat-treatment process carried out on a second adhesive in order to expedite the thermal hardening of the first adhesive for the first semiconductor chip 1 stacked on the lower-layer side. As a result, the work efficiency of the whole thermal crimp process can be improved.

If the temperature of a heat-treatment process carried out on the first semiconductor chip 1 is increased, however, the number of warps on the first semiconductor chip 1 after the thermal hardening increases due to a difference in coefficient of thermal expansion between the substrate and the first semiconductor chip 1. As a result, the number of warps on the first semiconductor chip 1 after the mounting process increases.

In other words, the flatness of the first semiconductor chip 1 after the mounting process of the first semiconductor chip 1 deteriorates. If the second semiconductor chip 2 mounted on the first semiconductor chip 1 is inclined due to the warps created on the first semiconductor chip 1 as described above, the wire-bonding process cannot be carried out well, causing the reliability of connections between the second semiconductor chip 2 and the connection terminals 3c to inevitably deteriorate.

In order to solve this problem, after the first semiconductor chip 1 is mounted in the thermal crimp process, the second semiconductor chip 2 is placed on the back surface 1c of the first semiconductor chip 1 through a second adhesive such as the die-bond film material 5 used in the first embodiment. Then, with the second semiconductor chip 2 held by using a crimp head, the second adhesive is subjected to a heat-treatment process in order to harden the adhesive so that the second semiconductor chip 2 is fixed on the first semiconductor chip 1 through the second adhesive.

Later on, the fittings such as the crimp head are removed from the second semiconductor chip 2.

By fixing the second semiconductor chip 2 with the second semiconductor chip 2 held by using a crimp head as described above, the second semiconductor chip 2 can be fixed on the first semiconductor chip 1 without deteriorating the flatness even if warps have been generated on the first semiconductor chip 1.

In addition, at that time, the chips are split from each other with the die-bond film material 5 stuck to the back surface 2c of the second semiconductor chip 2 in advance. As a result, the work efficiency is good in comparison with a process to mount the first semiconductor chip 1 wherein it is necessary to place pieces of NCF 12 for a plurality of device areas 7a.

By adopting this method, in sequential stacked-layer die-bond processes for a plurality of device areas as is the case with the second embodiment, First, as shown in FIG. 23, the first semiconductor chip 1 is mounted on a device area 7a in the thermal crimp process adopting the method described above. Then, after the third semiconductor chip 26 is prepared, the third semiconductor chip 26 is placed in another device area 7a of the multi-piece substrate 7 through a third adhesive. As described in the explanation of the second embodiment, the third semiconductor chip 26 has the same structure as the first semiconductor chip 1 and placed on a lower-layer side.

Subsequently, the third adhesive is subjected to a heat-treatment process for hardening the adhesive in order to fix the third semiconductor chip 26 on the other device area 7a of the multi-piece substrate 7 through the third adhesive.

Then, the second semiconductor chip 2 is prepared. Subsequently, the second semiconductor chip 2 is put on the first semiconductor chip 1 through a second adhesive such as the die-bond film material 5.

Then, with the second semiconductor chip 2 held by using fittings such as a crimp head, the second adhesive is subjected to a heat-treatment process for hardening the adhesive in order to fix the second semiconductor chip 2 on the first semiconductor chip 1 through the second adhesive.

Later on, the fittings such as the crimp head are removed from the second semiconductor chip 2.

Afterwards, a fourth semiconductor chip 27 is prepared. Then, the fourth semiconductor chip 27 is placed on the third semiconductor chip 26 through a fourth adhesive such as the die-bond film material 5. As described in the explanation of the second embodiment, the fourth semiconductor chip 27 has the same has the same structure as the second semiconductor chip 2 and placed on an upper-layer side.

Then, with the fourth semiconductor chip 27 held by using fittings such as a crimp head, the fourth adhesive is subjected to a heat-treatment process for hardening the adhesive in order to fix the fourth semiconductor chip 27 on the second semiconductor chip 2 through the fourth adhesive.

Later on, the fittings such as the crimp head are removed from the fourth semiconductor chip 27.

In addition, in the case of the second embodiment, a plurality of first NCFs 12b are laid out to form a staggered array as shown in FIG. 17. However, the layout of the first adhesives does not have to be a staggered array. In a case where the thermal effect of the thermal crimp head 20 on an adjacent device area 7a can be ignored due to characteristics of the adhesive and the setting of the thermal crimp process, for example, first adhesives can be put in a plurality of adjacent device areas 7a in advance without raising a problem. If first adhesives are placed in too many device areas 7a, however, the NCFs 12 are thermally hardened in some cases due to exposure to heat generated by the die-bond stage 21 for a long period of time. In order to solve this problem, for example, first NCFs 12b are laid out in column units as is the case with the modified version shown in FIG. 33. In this case, 3 first NCFs 12b are placed on a column and a first semiconductor chip is mounted on each of the first NCFs 12b at each time. Then, the process is repeated for the adjacent column. This process is carried out repeatedly for each column to mount first NCFs 12b and first semiconductor chips 1.

In addition, the first and second embodiments each implement a semiconductor device having a stack structure including 2 semiconductor chips stacked at 2 layers respectively as described earlier. However, the number of semiconductor-chip layers can be 3 or larger as is the case with the modified version shown in FIG. 34.

Thus, even in the case of a stack structure comprising 3 or more semiconductor-chip layers, by making the thickness of a semiconductor chip subjected to a phase-up mounting process smaller than the thickness of a semiconductor chip subjected to a phase-down mounting process and by increasing the pressure applied during the phase-down mounting process, the CSP 25 can be made thinner without deteriorating the connection reliability and without generating chip cracks.

In the case of the CSP 25 having 3 stack layers as shown in FIG. 34, in a wire-bonding process carried out on a third semiconductor chip 24 stacked as a third-layer chip, the substrate is subjected to a first bonding process while the second semiconductor chip 24 is subjected to a second bonding process. Thus, the height of the resin sealing body 6 can be suppressed so as to prevent the CSP 25 from becoming high.

In addition, in the case of the first embodiment, the first semiconductor chip 1 stacked on the lower-layer side serves as a logic chip whereas the second semiconductor chip 2 stacked on the upper-layer side serves as a memory chip as described earlier. However, the functions of the first semiconductor chip 1 stacked on the lower-layer side and the second semiconductor chip 2 stacked on the upper-layer side are not particularly limited to the logic and memory chips.

Furthermore, in the case of the second embodiment, the process to assemble the semiconductor device adopts the collective-mold technique using the multi-piece substrate 7 as described earlier. However, the assembly process can also be carried out by using single-piece substrates 3, which have been prepared as separated individual substrates in advance. In addition, it is also possible to carry out the assembly process by adopting a single-piece mold technique wherein a cavity 13a is associated with each device area 7a of the multi-piece substrate 7.

Moreover, in the case of the first and second embodiments, as an adhesive, a film such as the NCF 12 or an ACF is used for connecting a flip chip stacked on the lower-layer side and the die-bond film material 5 is used in a die-bonding process of the chip stacked on the upper-layer side as described earlier. However, the adhesive can also be a paste material.

Furthermore, in the case of the first and second embodiments, the semiconductor devices are the CSPs 9, 22 and 25. However, the semiconductor devices can each be another type of package such as a BGA (Ball Grid Array) or an LGA (Land Grid Array) as long as the other type of package has a stack structure comprising a wiring substrate and semiconductor chips stacked on the substrate, and a semiconductor chip stacked on the upper-layer side is thinner than a semiconductor chip stacked on the lower-layer side.

An outline of a representative of the present invention disclosed in this specification is explained briefly as follows.

By making a semiconductor chip on the upper-layer side thinner than a semiconductor chip on the lower-layer side in a semiconductor device having a stack structure, the semiconductor device itself can be made thin.

What is claimed is:

1. A semiconductor device manufacturing method comprising the steps of:
   (a) preparing a mold provided with a cavity having first and second side surfaces facing each other and third and fourth surfaces facing each other and coming in contact with said first and second side surfaces and provided with a plurality of resin injection entrances created on said first side surface and a ventilation hole created on said second side surface;
   (b) preparing a wiring substrate having a main surface, preparing a first semiconductor chip fixed on said main surface of said wiring substrate and preparing a second semiconductor chip fixed on said first semiconductor chip;
   (c) placing said wiring substrate, said first semiconductor chip and said second semiconductor chip inside said cavity; and
   (d) after said step (c) injecting resin concurrently from the plurality of resin injection entrances toward the second side surface of the cavity in order to seal and hold said first and second semiconductor chips,
   wherein in said step (c), said wiring substrate, said first semiconductor chip and said second semiconductor chip are arranged in such a way that, on a cross section parallel to said third side surface of said cavity, the length of said first semiconductor chip exceeds the length of said second semiconductor chip, and
   wherein in said step (c), said wiring substrate, said first semiconductor chip, and said second semiconductor chip are arranged in such a way that, on a cross section parallel to said first side surface of said cavity, the length of said first semiconductor chip is smaller than the length of said second semiconductor chip.

2. A semiconductor device manufacturing method according to claim 1, wherein said mold has an air hole created on said second side surface of said cavity.

3. A semiconductor device manufacturing method comprising the steps of:
   (a) preparing a mold provided with a cavity having first and second side surfaces facing each other and third and fourth side surfaces facing each other and coming in contact with said first and second side surfaces and provided with a plurality of resin injection entrances created on said first side surface and a ventilation hole created on said second side surface;
   (b) preparing a wiring substrate having a main surface and a plurality of device areas created thereon, preparing first semiconductor chips fixed on each of said device areas of said wiring substrate and preparing second semiconductor chips fixed on each of said first semiconductor chips;
   (c) placing said wiring substrate, said first semiconductor chips and said second semiconductor chips inside said cavity, and then collectively cover said device areas by using said cavity; and
   after said step (c), injecting resin concurrently from the plurality of resin injection entrances toward the second side surface of the cavity in order to collectively seal and hold said first and second semiconductor chips,
   wherein in said step (c), said wiring substrate, said first semiconductor chips and said second semiconductor chips are arranged in such a way that, on a cross section parallel to said third side surface of said cavity, said length of each of said first semiconductor chips exceeds said length of corresponding second semiconductor chips stacked on said first semiconductor chips, and
   wherein in said step (c), said wiring substrate, said first semiconductor chips, and said second semiconductor chips are arranged in such a way that, on a cross section parallel to said first side surface of said cavity, the length of each of said first semiconductor chips are smaller than the length of corresponding second semiconductor chips stacked on said first semiconductor chips.

* * * * *